(12) United States Patent
Koyama et al.

(10) Patent No.: US 9,842,859 B2
(45) Date of Patent: Dec. 12, 2017

(54) DRIVER CIRCUIT AND DISPLAY DEVICE

(75) Inventors: Jun Koyama, Sagamihara (JP); Shunpei Yamazaki, Setagaya (JP)

(73) Assignee: SEMICONDUCTOR ENERGY LABORATORY CO., LTD., Kanagawa-ken (JP)

( * ) Notice: Subject to any disclaimer, the term of this patent is extended or adjusted under 35 U.S.C. 154(b) by 1873 days.

(21) Appl. No.: 12/606,340

(22) Filed: Oct. 27, 2009

(65) Prior Publication Data
US 2010/0110623 A1 May 6, 2010

(30) Foreign Application Priority Data

Oct. 31, 2008 (JP) .................................. 2008-281449

(51) Int. Cl.
*G09G 5/00* (2006.01)
*H01L 27/12* (2006.01)

(52) U.S. Cl.
CPC ...... *H01L 27/1225* (2013.01); *H01L 27/1248* (2013.01)

(58) Field of Classification Search
CPC .......... H01L 29/04; H01L 29/24; H01L 21/34
USPC .............. 257/43, E27.001–E27.163; 345/43, 345/204–215
See application file for complete search history.

(56) References Cited

U.S. PATENT DOCUMENTS

| | | |
|---|---|---|
| 5,731,856 A | 3/1998 | Kim et al. |
| 5,744,864 A | 4/1998 | Cillessen et al. |
| 5,847,410 A | 12/1998 | Nakajima |
| 6,225,644 B1 | 5/2001 | Yamaguchi et al. |
| 6,294,274 B1 | 9/2001 | Kawazoe et al. |
| 6,362,031 B1 | 3/2002 | Yamaguchi et al. |
| 6,524,958 B2 | 2/2003 | Sakai et al. |
| 6,563,174 B2 | 5/2003 | Kawasaki et al. |
| 6,586,346 B1 | 7/2003 | Yamazaki et al. |
| 6,603,139 B1 | 8/2003 | Tessler et al. |
| 6,727,522 B1 | 4/2004 | Kawasaki et al. |
| 6,960,812 B2 | 11/2005 | Yamazaki et al. |

(Continued)

FOREIGN PATENT DOCUMENTS

| | | |
|---|---|---|
| EP | 1737044 A | 12/2006 |
| EP | 1 770 788 | 4/2007 |

(Continued)

OTHER PUBLICATIONS

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

(Continued)

*Primary Examiner* — Tony N Ngo
(74) *Attorney, Agent, or Firm* — Robinson Intellectual Property Law Office; Eric J. Robinson

(57) ABSTRACT

The driver circuit includes an inverter circuit having a first thin film transistor including a first oxide semiconductor film and a second transistor including a second oxide semiconductor film. The first thin film transistor and the second thin film transistor are enhancement transistors, in which a silicon oxide film including an OH group is provided on and in contact with the first oxide semiconductor film and the second oxide semiconductor film, and a silicon nitride film is provided on and in contact with the silicon oxide film.

17 Claims, 29 Drawing Sheets

(56) References Cited

U.S. PATENT DOCUMENTS

| | | |
|---|---|---|
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,221,338 B2 | 5/2007 | Yamazaki et al. |
| 7,259,110 B2 | 8/2007 | Ohnuma et al. |
| 7,262,469 B2 | 8/2007 | Makita |
| 7,282,782 B2 | 10/2007 | Hoffman et al. |
| 7,297,977 B2 | 11/2007 | Hoffman et al. |
| 7,301,211 B2 | 11/2007 | Yamazaki et al. |
| 7,323,356 B2 | 1/2008 | Hosono et al. |
| 7,372,070 B2 | 5/2008 | Yatsunami et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,612,378 B2 | 11/2009 | Toyoda et al. |
| 7,635,889 B2 | 12/2009 | Isa et al. |
| 7,674,650 B2 | 3/2010 | Akimoto et al. |
| 7,687,807 B2 | 3/2010 | Koo et al. |
| 7,732,819 B2 | 6/2010 | Akimoto et al. |
| 7,863,611 B2 | 1/2011 | Abe et al. |
| 7,884,360 B2 | 2/2011 | Takechi et al. |
| 7,955,995 B2 | 6/2011 | Kakehata et al. |
| 7,977,675 B2 | 7/2011 | Kawamura et al. |
| 8,203,146 B2 | 6/2012 | Abe et al. |
| 8,318,554 B2 | 11/2012 | Arai et al. |
| 8,324,018 B2 | 12/2012 | Isa et al. |
| 8,420,442 B2 | 4/2013 | Takechi et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0143787 A1 | 7/2003 | Sakai et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0082539 A1* | 4/2005 | Fujimoto et al. ............... 257/72 |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0051952 A1 | 3/2007 | Yamazaki et al. |
| 2007/0052025 A1 | 3/2007 | Yabuta |
| 2007/0054507 A1 | 3/2007 | Kaji et al. |
| 2007/0072439 A1 | 3/2007 | Akimoto et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2007/0295967 A1 | 12/2007 | Harada et al. |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0121872 A1* | 5/2008 | Choi et al. ............... 257/40 |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0176364 A1 | 7/2008 | Yang et al. |
| 2008/0182358 A1 | 7/2008 | Cowdery-Corvan et al. |
| 2008/0203387 A1 | 8/2008 | Kang et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2008/0308795 A1* | 12/2008 | Lee et al. ............... 257/43 |
| 2008/0308796 A1 | 12/2008 | Akimoto et al. |
| 2008/0308797 A1 | 12/2008 | Akimoto et al. |
| 2008/0308804 A1 | 12/2008 | Akimoto et al. |
| 2008/0308805 A1 | 12/2008 | Akimoto et al. |
| 2008/0308806 A1 | 12/2008 | Akimoto et al. |
| 2009/0008639 A1 | 1/2009 | Akimoto et al. |
| 2009/0065771 A1 | 3/2009 | Iwasaki et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0025678 A1 | 2/2010 | Yamazaki et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2011/0095288 A1 | 4/2011 | Morosawa et al. |
| 2011/0227139 A1 | 9/2011 | Kakehata et al. |
| 2013/0237012 A1 | 9/2013 | Takechi et al. |

FOREIGN PATENT DOCUMENTS

| | | |
|---|---|---|
| EP | 1 995 787 | 11/2008 |
| EP | 1 998 373 | 12/2008 |
| EP | 1 998 374 | 12/2008 |
| EP | 1 998 375 | 12/2008 |
| EP | 2154718 A | 2/2010 |
| EP | 2226847 A | 9/2010 |
| EP | 2242038 A | 10/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 03-231472 A | 10/1991 |
| JP | 05-251705 A | 9/1993 |
| JP | 08-264794 A | 10/1996 |
| JP | 09-148429 A | 6/1997 |
| JP | 10-209462 A | 8/1998 |
| JP | 11-505377 | 5/1999 |
| JP | 2000-044236 A | 2/2000 |
| JP | 2000-150900 A | 5/2000 |
| JP | 2001-223363 A | 8/2001 |
| JP | 2002-076356 A | 3/2002 |

(56) References Cited

FOREIGN PATENT DOCUMENTS

| | | |
|---|---|---|
| JP | 2002-151693 A | 5/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2005-159331 A | 6/2005 |
| JP | 2005-327797 A | 11/2005 |
| JP | 2005-340802 A | 12/2005 |
| JP | 2006-165532 A | 6/2006 |
| JP | 2006-332606 A | 12/2006 |
| JP | 2007-073976 A | 3/2007 |
| JP | 2007-096055 | 4/2007 |
| JP | 2007-096129 A | 4/2007 |
| JP | 2007-123861 | 5/2007 |
| JP | 2007-165731 A | 6/2007 |
| JP | 2007-194594 A | 8/2007 |
| JP | 2007-250983 A | 9/2007 |
| JP | 2008-004929 A | 1/2008 |
| JP | 2008-010440 A | 1/2008 |
| JP | 2008-042088 A | 2/2008 |
| JP | 2008-091896 A | 4/2008 |
| JP | 2008-124215 A | 5/2008 |
| JP | 2008-227517 A | 9/2008 |
| JP | 2009-004733 | 1/2009 |
| JP | 2009-260002 A | 11/2009 |
| JP | 2010-016163 A | 1/2010 |
| TW | 200425521 | 11/2004 |
| TW | 200511889 | 3/2005 |
| TW | 200701446 | 1/2007 |
| WO | WO-99/54936 | 10/1999 |
| WO | WO-2004/114391 | 12/2004 |
| WO | WO-2005/041311 | 5/2005 |
| WO | WO-2007/119386 | 10/2007 |
| WO | WO-2007/138937 | 12/2007 |
| WO | WO 2008/143304 | 11/2008 |

OTHER PUBLICATIONS

Ikeda.T et al., "Full-Functional System Liquid Crystal Display Using Cg-Silicon Technology,", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.

Prins.M et al., "A Ferroelectric Transparent Thin-Film Transistor,", Appl. Phys. Lett. (Applied Physics Letters) , Jun. 17, 1996, vol. 68, No. 25, pp. 3650-3652.

Nakamura.M et al., "The phase relations in the $In_2O_3$—$Ga_2ZnO_4$—ZnO system at 1350° C.,", Journal of Solid State Chemistry, Aug. 1, 1991, vol. 93, No. 2, pp. 298-315.

Kimizuka.N. et al., "Syntheses and Single-Crystal Data of Homologous Compounds, $In_2O_3(ZnO)_m$ (m=3, 4, and 5), $InGaO_3(ZnO)_3$, and $Ga_2O_3(ZnO)_m$ (m=7, 8, 9, and 16) in the $In_2O_3$—$ZnGa_2O_4$—ZnO System,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

Osada.T et al., "15.2: Development of Driver-Integrated Panel using Amorphous In—Ga-Oxide TFT,", SID Digest '09 : SID International Symposium Digest of Technical Papers, May 31, 2009, pp. 184-187.

Li.C et al., "Modulated Structures of Homologous Compounds $InMo_3(ZnO)_m$ (M=In,Ga; m=Integer) Described by Four-Dimensional Superspace Group,", Journal of Solid State Chemistry, 1998, vol. 139, pp. 347-355.

Lee.J et al., "World's Largest (15-Inch) XGA AMLCD Panel Using IGZO Oxide TFT,", SID Digest '08 : SID International Symposium Digest of Technical Papers, May 20, 2008, vol. 39, pp. 625-628.

Nowatari.H et al., "60.2: Intermediate Connector With Suppressed Voltage Loss for White TANDEM OLEDS,", SID Diget '09 : SID International Symposium Digest of Technical Papers, May 31, 2009, pp. 899-902.

Kanno.H et al., "White Stacked Electrophosphorecent Organic Light-Emitting Device Employing $MoO_3$ as a Change-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs ,", IDW '02 : Proceedings of the 9th International Display Workshops, Dec. 4, 2002, pp. 295-298.

Jeong.J et al., "3.1: Distinguished Paper: 12.1-Inch WXGA AMOLED Display Driven by Indium-Gallium-Zinc Oxide TFTs Array,", SID Digest '08 : SID International Symposium Digest of Technical Papers, May 20, 2008, vol. 39, No. 1, pp. 1-4.

Kurokawa.Y et al., "UHF RFCPUS on Flexible and Glass Substrates for Secure RFID Systems,", Journal of Solid-State Circuits, 2008, vol. 43, No. 1, pp. 292-299.

Ohara.H et al., "Amorphous In—Ga—Zn-Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back-Plane,", SID Digest '09 : SID International Symposium Digest of Technical Papers, May 31, 2009, pp. 280-283.

Lee.M et al., "15.4:Excellent Performance of Indium-Oxide-Based Thin-Film Transistors by DC Sputtering,", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and Its Bending Properties,", SID Digest '09 : SID International Symposium Digest of Technical Papers, May 31, 2009, pp. 983-985.

Sakata.J et al., "Development of 4.0-In. AMOLED Display With Driver Circuit Using Amorphous In—Ga—Zn-Oxide TFTS,", IDW '09 : Proceedings of the 16th International Display Workshops, 2009, pp. 689-692.

Park.J et al., "Amorphous Indium-Gallium-Zinc Oxide TFTS and Their Application for Large Size AMOLED,", AM-FPD '08 Digest of Technical Papers, Jul. 2, 2008, pp. 275-277.

Park.S et al., "Challenge to Future Displays: Transparent AM-OLED Driven by Peald Grown ZnO TFT,", IMID '07 Digest, 2007, p. 1249-1252.

Godo.H et al., "Temperature Dependence of Characteristics and Electronic Structure for Amorphous In—Ga—Zn-Oxide TFT,", AM-FPD '09 Digest of Technical Papers, Jul. 1, 2009, pp. 41-44.

Osada.T et al., "Development of Driver-Integrated Panel Using Amorphous In—Ga—Zn-Oxide TFT,", AM-FPD '09 Digest of Technical Papers, Jul. 1, 2009, pp. 33-36.

Hirao.T et al., "Novel Top-Gate Zinc Oxide Thin-Film Transistors (ZnO TFTS) for AMLCDS,", Journal of the SID , 2007, vol. 15, No. 1, pp. 17-22.

Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn-Oxide TFT,", SID Digest '09 : SID International Symposium Digest of Technical Papers, May 31, 2009, pp. 1110-1112.

Ohara.H et al., "21.3:4.0 In. QVGA AMOLED Display Using In—Ga—Zn-Oxide TFTS With a Novel Passivation Layer,", SID Digest '09 : SID International Symposium Digest of Technical Papers, May 31, 2009, pp. 284-287.

(56) References Cited

OTHER PUBLICATIONS

Miyasaka.M, "58.2 Invited Paper : SUFTLA Flexible Microelectronics on Their Way to Business,", SID Digest '07 : SID International Symposium Digest of Technical Papers, 2007, vol. 38, pp. 1673-1676.
Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.
Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.
Asaoka.Y et al., "29.1:Polarizer-Free Reflective LCD Combined With Ultra Low-Power Driving Technology,", SID Digest '09 : SID International Symposium Digest of Technical Papers, 2009, pp. 395-398.
Lee.H et al., "Current Status of, Challenges to, and Perspective View of AM-OLED ,", IDW '06 : Proceedings of the 13th International Display Workshops, Dec. 7, 2006, pp. 663-666.
Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.
Kikuchi.H et al., "Polymer-Stabilized Liquid Crystal Blue Phases,", Nature Materials, Sep. 2, 2002, vol. 1, pp. 64-68.
Kimizuka.N. et al., "Spinel,$YbFe_2O_4$, and $Yb_2Fe_3O_7$ Types of Structures for Compounds in the $In_2O_3$ and $Sc_2O_3$—$A_2O_3$—BO Systems [A: Fe, Ga, or Al; B: Mg, Mn, Fe, Ni, Cu, or Zn] at Temperatures Over 1000° C.,", Journal of Solid State Chemistry, 1985, vol. 60, pp. 382-384.
Kitzerow.H et al., "Observation of Blue Phases in Chiral Networks,", Liquid Crystals, 1993, vol. 14, No. 3, pp. 911-916.
Costello.M et al., "Electron Microscopy of a Cholesteric Liquid Crystal and Its Blue Phase,", Phys. Rev. A (Physical Review A), May 1, 1984, vol. 29, No. 5, pp. 2957-2959.
Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.
International Search Report (Application No. PCT/JP2009/068292) dated Nov. 24, 2009.
Written Opinion (Application No. PCT/JP2009/068292) dated Nov. 24, 2009.
Hayashi et al., "Invited Paper: Improved Amorphous In—Ga—Zn—O TFTS," SID Digest '08: SID International Symposium Digest of Technical Papers, 2008, vol. 39, pp. 621-624.
Hayashi et al., "Invited Paper: Improved Amorphous In—Ga—Zn—O TFTS," SID Digest '08: SID International Symposium Digest of Technical Papers, 2008, pp. 621-624.
Park et al., "Amorphous Indium-Gallium-Zinc Oxide TFTs and their Application for Large Size AMOLED," AM-FPD '08 Digest of Technical Papers, Jul. 2, 2008, pp. 275-278.
Fortunato.E et al., "Wide-Bandgap High-Mobility ZnO Thin-Film Transistors Produced At Room Temperature,", Appl. Phys. Lett. (Applied Physics Letters) , Sep. 27, 2004, vol. 85, No. 13, pp. 2541-2543.
Park.J et al., "Improvements in the Device Characteristics of Amorphous Indium Gallium Zinc Oxide Thin-Film Transistors by Ar Plasma Treatment,", Appl. Phys. Lett. (Applied Physics Letters) , Jun. 26, 2007, vol. 90, No. 26, pp. 262106-1-262106-3.
Masuda.S et al., "Transparent thin film transistors using ZnO as an active channel layer and their electrical properties,", J. Appl. Phys. (Journal of Applied Physics) , Feb. 1, 2003, vol. 93, No. 3, pp. 1624-1630.
Asakuma.N. et al., "Crystallization and Reduction of Sol-Gel-Derived Zinc Oxide Films by Irradiation With Ultraviolet Lamp,", Journal of Sol-Gel Science and Technology, 2003, vol. 26, pp. 181-184.
Nomura.K et al., "Carrier transport in transparent oxide semiconductor with intrinsic structural randomness probed using single-crystalline InGaO3(ZnO)5 films,", Appl. Phys. Lett. (Applied Physics Letters) , Sep. 13, 2004, vol. 85, No. 11, pp. 1993-1995.
Son.K et al., "42.4L: Late-News Paper: 4 Inch QVGA AMOLED Driven by the Threshold Voltage Controlled Amorphous GIZO (Ga2O3—In2O3—ZnO) TFT,", SID Digest '08 : SID International Symposium Digest of Technical Papers, May 20, 2008, vol. 39, pp. 633-636.
Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.
Fung.T et al., "2-D Numerical Simulation of High Performance Amorphous In—Ga Zn—O TFTs for Flat Panel Displays,", AM-FPD '08 Digest of Technical Papers, Jul. 2, 2008, pp. 251-251, The Japan Society of Applied Physics.
Park.J et al., "High performance amorphous oxide thin film transistors with self-aligned top-gate structure,", IEDM 09: Technical Digest of International Electron Devices Meeting, Dec. 7, 2009, pp. 191-194.
Nakamura.M, "Synthesis of Homologous Compound with New Long-Period Structure,", NIRIM Newsletter, Mar. 1, 1995, vol. 150, pp. 1-4.
Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.
Orita.M et al., "Mechanism of Electrical Conductivity of Transparent InGaZnO4,", Phys. Rev. B (Physical Review. B), Jan. 15, 2000, vol. 61, No. 3, pp. 1811-1816.
Nomura.K et al., "Amorphous Oxide Semiconductors for High-Performance Flexible Thin-Film Transistors,", Jpn. J. Appl. Phys. (Japanese Journal of Applied Physics) , 2006, vol. 45, No. 5B, pp. 4303-4308.
Janotti.A et al., "Native Point Defects in ZnO,", Phys. Rev. B (Physical Review. B), Oct. 4, 2007, vol. 76, No. 16, pp. 165202-1-165202-22.
Park.J et al., "Electronic Transport Properties of Amorphous Indium-Gallium-Zinc Oxide Semiconductor Upon Exposure to Water,", Appl. Phys. Lett. (Applied Physics Letters) , 2008, vol. 92, pp. 072104-1-072104-3.
Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.
Janotti.A et al., "Oxygen Vacancies In ZnO,", Appl. Phys. Lett. (Applied Physics Letters) , 2005, vol. 87, pp. 122102-1-122102-3.
Oba.F et al., "Defect energetics in ZnO: A hybrid Hartree-Fock density functional study,", Phys. Rev. B (Physical Review. B), 2008, vol. 77, pp. 245202-1-245202-6.
Orita.M et al., "Amorphous transparent conductive oxide InGaO3(ZnO)m (m<4):a Zn4s conductor,", Philosophical Magazine, 2001, vol. 81, No. 5, pp. 501-515.
Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.
Mo.Y et al., "Amorphous Oxide TFT Backplanes for Large Size AMOLED Displays,", IDW '08 : Proceedings of the 6th International Display Workshops, Dec. 3, 2008, pp. 581-584.
Kim.S et al., "High-Performance oxide thin film transistors passivated by various gas plasmas,", 214th ECS Meeting, 2008, No. 2317, ECS.
Clark.S et al., "First Principles Methods Using CASTEP,", Zeitschrift fur Kristallographie, 2005, vol. 220, pp. 567-570.
Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.
Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.
Oh.M et al., "Improving the Gate Stability of ZnO Thin-Film Transistors With Aluminum Oxide Dielectric Layers,", J.

(56) References Cited

OTHER PUBLICATIONS

Electrochem. Soc. (Journal of the Electrochemical Society), 2008, vol. 155, No. 12, pp. H1009-H1014.
Ueno.K et al., "Field-Effect Transistor on SrTiO3 With Sputtered Al2O3 Gate Insulator,", Appl. Phys. Lett. (Applied Physics Letters) , Sep. 1, 2003, vol. 83, No. 9, pp. 1755-1757.
Taiwanese Office Action (Application No. v98136700) dated Sep. 25, 2014.

* cited by examiner

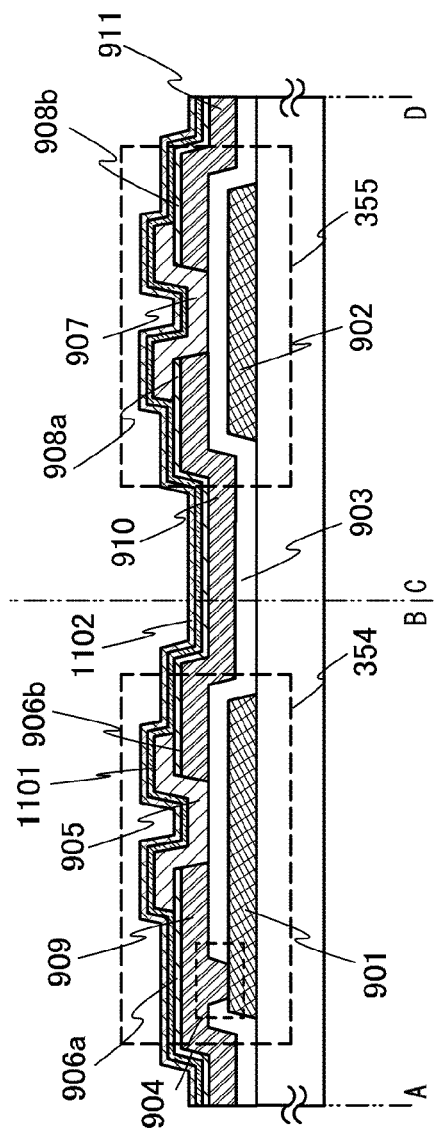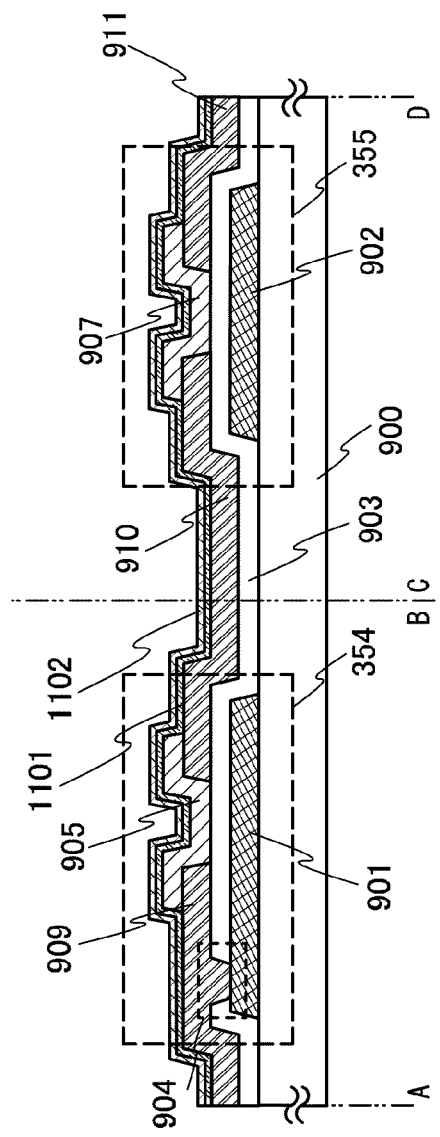
FIG. 11A
FIG. 11B

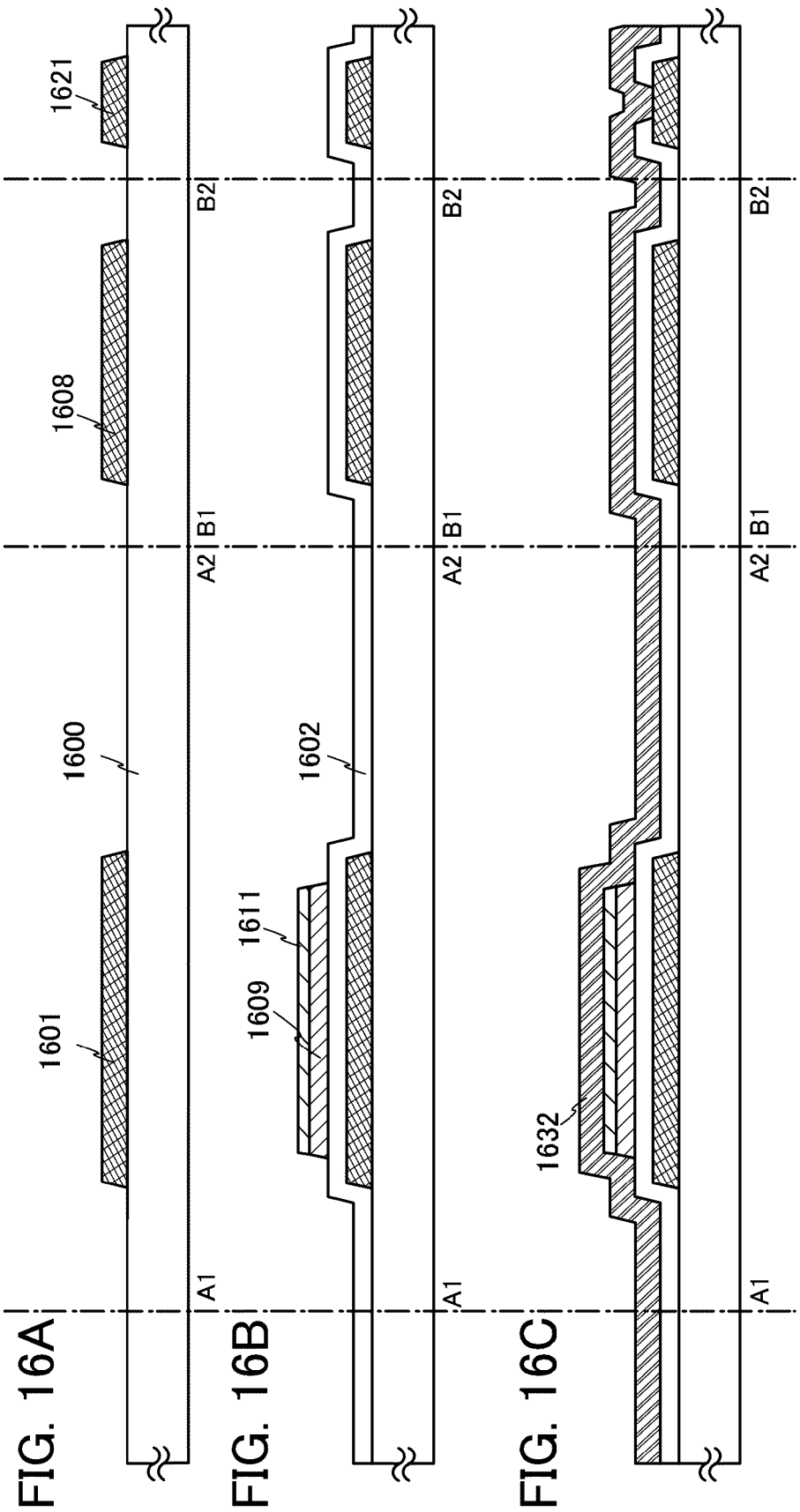

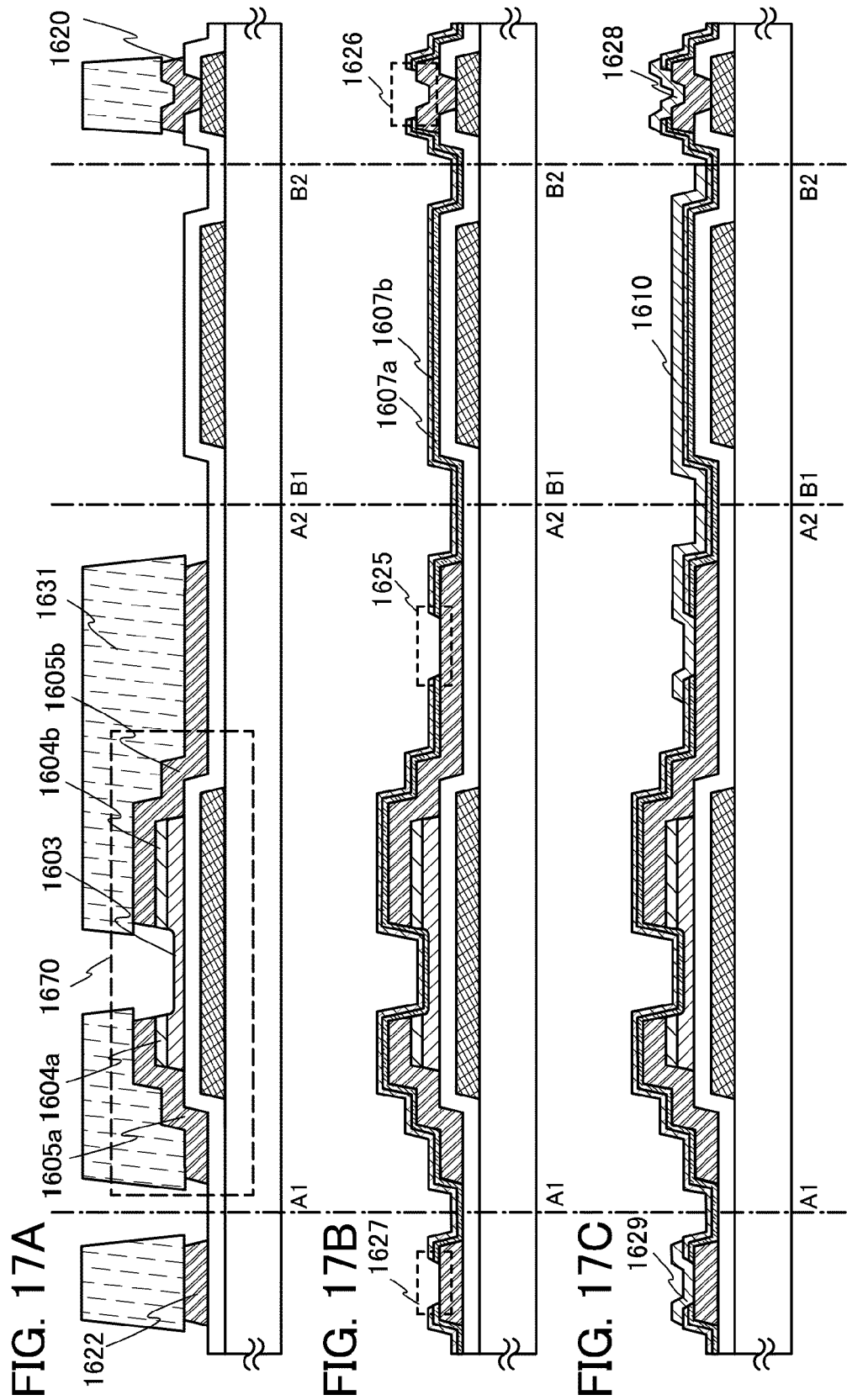

DRIVER CIRCUIT AND DISPLAY DEVICE

TECHNICAL FIELD

The present invention relates to a driver circuit using an oxide semiconductor, a manufacturing method thereof, a display device provided with the driver circuit, and an electronic device provided with the display device.

BACKGROUND ART

As typified by a liquid crystal display device, a thin film transistor formed over a flat board such as a glass substrate, is formed of amorphous silicon or polycrystalline silicon. A thin film transistor formed using amorphous silicon can cope with the increase of the glass substrate size even though electric field effect mobility is low. On the other hand, since a crystallization process such as laser annealing is needed, a thin film transistor formed using polycrystalline silicon does not always cope with the increase of the glass substrate size even though electric field effect mobility is high.

Accordingly, a technique of manufacturing a thin film transistor by using an oxide semiconductor and applying the thin film transistor to electronic devices and light devices is attracting attraction. For example, a technique of manufacturing a thin film transistor by using zinc oxide or In—Ga—Zn—O-based oxide semiconductor as the oxide semiconductor, and using the thin film transistor for a switching element of an image display device and the like is disclosed in Patent document 1 and Patent document 2.

REFERENCE

[Patent Document 1] Japanese Published Patent Application No. 2007-123861
[Patent Document 2] Japanese Published Patent Application No. 2007-96055

DISCLOSURE OF INVENTION

By using a thin film transistor in which a channel formation region is provided in an oxide semiconductor, electric field effect mobility which is higher than that of a thin film transistor formed using amorphous silicon can be obtained. An oxide semiconductor film can be formed at equal to or less than 300° C. by a sputtering method or the like. A manufacturing process of a thin film transistor using the oxide semiconductor is easier than that of a thin film transistor using polycrystalline silicon.

Such an oxide semiconductor is expected to be used for forming a thin film transistor over a glass substrate, a plastic substrate, or the like, and to be applied to a liquid crystal display device, an electroluminescent display device, electronic paper, or the like.

The number of pixels is increased with higher definition of a display device, thereby increasing the number of gate lines and source lines. If the number of gate lines and source lines is increased, there is a problem that a manufacturing cost is increased because it comes to be difficult to mount an IC chip including a driver circuit for driving the gate line and the source line by bonding or the like. Therefore, a driver circuit is preferably formed using a unipolar thin film transistor over a glass substrate, a plastic substrate, or the like. However, a unipolar driver circuit formed using amorphous silicon has a problem about a shift of threshold voltage with deterioration of the thin film transistor. Further, the unipolar driver circuit formed using polysilicon has a problem that variations in the threshold voltage become apparent. Therefore, in the unipolar driver circuit formed using amorphous silicon, and the unipolar driver circuit formed using polysilicon, an area occupied by circuits is increased due to construction of a circuit for correcting a shift of the threshold voltage and variations of the threshold voltage.

On the other hand, when a unipolar driver circuit is provided with a thin film transistor using an oxide semiconductor, although the problem of a shift of the threshold voltage and variations in the threshold voltage are not as apparent as in the case of the driver circuit having a thin film transistor formed using amorphous silicon or polysilicon, the problem that variations in the threshold voltage due to deterioration of the oxide semiconductor over time is remained. To solve such problems is important to enhance the quality of images in a display device or to improve the stability of operation of a driver circuit. Moreover, in the thin film transistor formed using an oxide semiconductor, current that flows when the thin film transistor is off is desirably reduced in order to reduce power consumption.

Here, according to one embodiment of the present invention, in a display device including a driver circuit formed of a thin film transistor in which a channel formation region is provided in an oxide semiconductor, it is an object to reduce a shift of a threshold voltage of the thin film transistor due to deterioration of an oxide semiconductor over time, and to reduce current that flows between a source and a drain (hereinafter such current is also referred to as off-current) when the thin film transistor is off without enlargement of an area occupied by circuits.

According to one embodiment of the present invention, a driver circuit in a display device includes a plurality of inverter circuits and a plurality of switches. The inverter circuit includes a first thin film transistor, which includes a first oxide semiconductor film, whose gate terminal and first terminal are connected to a wiring for supplying a high power supply potential, and a second thin film transistor, which includes a second oxide semiconductor film, whose first terminal is connected to a second terminal of the first thin film transistor, second terminal is connected to a wiring for supplying a low power supply potential, and gate terminal is supplied with an input signal. The first thin film transistor and the second thin film transistor are enhancement transistors, in each of which a silicon oxide film including an OH group is provided on and in contact with the first oxide semiconductor film and the second oxide semiconductor film, and a silicon nitride film is provided on and in contact with the oxide semiconductor film.

According to one embodiment of present invention, a shift of a threshold voltage of a thin film transistor and an off current can be reduced without enlargement of an area occupied by circuits.

BRIEF DESCRIPTION OF DRAWINGS

In the accompanying drawings.

FIGS. 11A and 11B are diagrams each describing Embodiment 1;

FIGS. 16A to 16C are diagrams describing Embodiment 3;

FIGS. 17A to 17C are diagrams describing Embodiment 3;

BEST MODE FOR CARRYING OUT THE INVENTION

Figure 1:
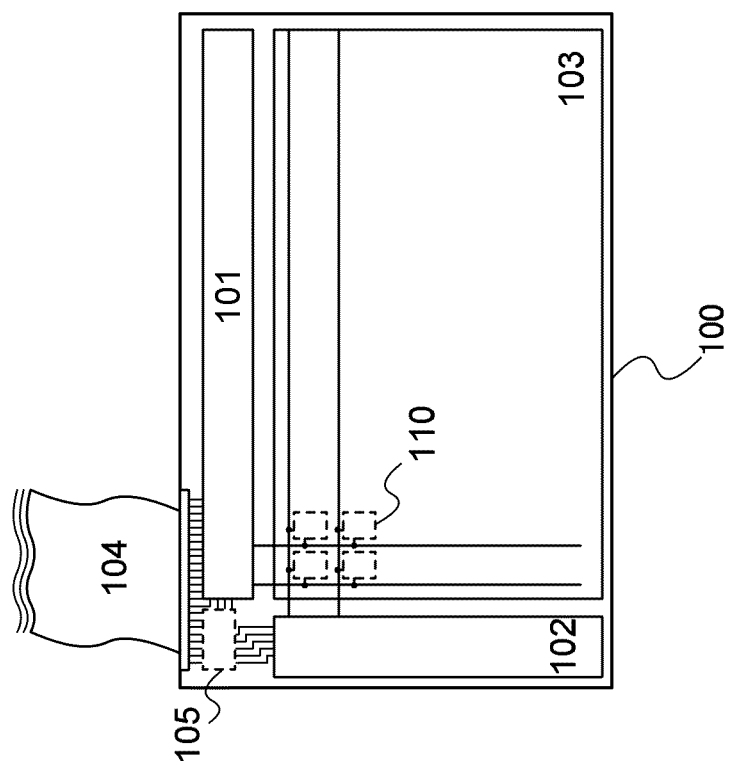
FIG. 1 is a diagram describing Embodiment 1.

The embodiments of the present invention will be described specifically with reference to drawings. However, the present invention is not limited to the following description. It is easily understood to those skilled in the art that various changes and modifications are possible without departing from the spirit and scope of the present invention. Therefore, the present invention is not interpreted as being limited to the following description of the embodiments. Note that the same reference numeral is used to denote the same portion or a portion having a similar function among different diagrams in a structure of the present invention to be described hereinafter, and repetitive description is omitted.

Embodiment 1

In this embodiment, an n-channel thin film transistor is used as a thin film transistor including an oxide semiconductor which forms a unipolar driver circuit. An advantage of one mode of the present invention is to be described by giving an example of a source line driver circuit and/or a gate line driver circuit as a driver circuit for driving a pixel portion.

First, FIG. 1 shows an overall schematic view of a display device. A source line driver circuit 101, a gate line driver circuit 102, and a pixel portion 103 are integrally formed over a substrate 100. In the pixel portion 103, a portion surrounded by a dotted flame 110 is one pixel. Although an example in FIG. 1 shows a structure in which the gate line driver circuit 102 is provided for one end portion, a structure including a plurality of gate driver circuits 102 may be applied. Further, in a pixel of a display device, a thin film transistor (hereinafter referred to as a TFT) controls a display element. A signal (a clock signal, a start pulse, and the like) which drives the source line driver circuit 101 and the gate line driver circuit 102 is input from the outside through a flexible printed circuit (FPC) 104. Note that a structure in which a circuit 105 such as a logic circuit, a power supply circuit, an oscillator circuit is provided over a substrate, a signal for controlling the source line driver circuit 101 and the gate line driver circuit 102 is generated over the substrate, and the signal is supplied to these driver circuits may be employed.

The source line driver circuit 101 and the gate line driver circuit 102 for driving a pixel portion each include an inverter circuit, a capacitor, a switch using an element such as a TFT, a resistor, and the like. In the case where an inverter circuit is formed by combining two n-channel TFTs as a driver circuit including a unipolar TFT, the following cases are given: the case where a circuit is formed by combining an enhancement transistor and a depletion transistor (hereinafter such a circuit is referred to as an EDMOS circuit), the case where a circuit is formed by combining enhancement transistors (hereinafter such a circuit is referred to as an EEMOS circuit), and the case where a circuit is formed by combining an enhancement transistor and a resistor (hereinafter such a circuit is referred to as an ERMOS circuit). On the other hand, an enhancement transistor is suitable as the TFT provided in a pixel portion on the same substrate as a driver circuit formed. This is because, since a threshold voltage of an enhancement transistor is positive, current flowed by a voltage applied between a gate and a source can be reduced as compared to that in a depletion transistor, and power consumption can be suppressed.

Therefore, it is suitable to use an EEMOS circuit including enhancement TFTs like the pixel portion as an inverter circuit in the driver circuit for driving the pixel portion. By using the EEMOS circuit as the inverter circuit for the driver circuit, shortening of a manufacturing process can be achieved because only one kind of transistor is used for forming the pixel portion and the driver circuit. Note that the enhancement transistor described in this embodiment is formed of an oxide semiconductor. Since electrical characteristics of the enhancement transistor are that an on/off ratio is more than or equal to $10^9$ when a gate voltage is ±20 V, leak current between a source and a drain is small. Therefore, low-power-consumption driving can be realized.

Note that an n-channel TFT whose threshold voltage is positive is defined as an enhancement transistor, and an n-channel TFT whose threshold voltage is negative is defined as a depletion transistor. This specification follows the definitions.

Note that an oxide semiconductor used in the specification forms a thin film denoted as $InMO_3(ZnO)_m$, (m>0) and a TFT formed using the thin film as a semiconductor layer is manufactured. Note that M indicates one metal element or a plurality of metal elements selected from gallium (Ga), iron (Fe), nickel (Ni), manganese (Mn), and cobalt (Co). For example, there is not only the case where Ga is used as M but also the case where the above metal elements are contained in addition to Ga, like Ga and Ni, or Ga and Fe. In addition, in some cases the oxide semiconductor contains Fe, Ni, another transition metal element, or an oxide of the transition metal elements, as an impurity element in addition to the metal elements including as M. In this specification, such a thin film is also referred to as an In—Ga—Zn—O-based non-single-crystal film.

In the structure of the In—Ga—Zn—O-based non-single-crystal film, an amorphous structure can be observed by analysis with XRD (X-ray analysis) even if heat treatment is performed at 200° C. to 500° C., typically at 300° C. to 400° C. for 10 to 100 minutes after a film is formed by sputtering. Further, a TFT whose electrical characteristics are that an on/off ratio is more than or equal to $10^9$ and mobility is more than or equal to 10 when a gate voltage is ±20 V can be manufactured. A TFT which is manufactured using the oxide semiconductor film with such electrical characteristics has higher mobility than a TFT which is manufactured using amorphous silicon. Therefore, a driver circuit which includes a shift register provided with the TFT can be driven at high speed.

Note that, in this specification, description that A and B are connected to each other includes the case where A and B are electrically connected to each other as well as the case where A and B are directly connected to each other. Here, description that A and B are electrically connected to each other indicates the case where A and B are almost the same node through an object when the object having some electrical action is between A and B.

Specifically, the description that A and B are electrically connected to each other indicates the cases where there is no problem to interpret that A and B are the same node when circuit operation is considered: the case where A and B are connected to each other through a switching element such as a transistor, and A and B have almost the same potential by electrical conduction of the switching element, the case where A and B are connected to each other through a resistor and a potential difference between both ends of the resistor does not adversely affect operation of a circuit including A and B, and the like.

Note that a display device indicates a device including a display element such as a light emitting element and a liquid crystal element. Note that, a display device may include a peripheral driver circuit for driving a plurality of pixels. Note that the peripheral driver circuit for driving the plurality of pixels is formed over the same substrate as the plurality of pixels formed on. Note that the display device may include a flexible printed circuit (FPC). Note that the display device may include a printed wiring board (PWB) which is connected through a flexible printed circuit (FPC) or the like and which is provided with an IC chip, a resistor, a capacitor, an inductor, a transistor, or the like. Note that the display device may include an optical sheet such as a polarizing plate or a retardation plate. Note that the display device may also include a lighting device, a housing, an audio input and output device, an optical sensor, or the like.

Note that one pixel corresponds to one component that can control luminance. Therefore, as an example, one pixel indicates one color element and the one color element expresses luminance. Accordingly, in the case of a color display device having color elements of R, G, and B, the minimum unit of an image includes three pixels of an R pixel, a G pixel, and a B pixel.

Note that terms "first", "second", "third", and "to N" (N is a natural number) in this specification are used in order not to confuse components. Therefore, the terms do not limit the number.

Next, an example of a diagram of circuit, a top view, and a cross-sectional view of a gate line driver circuit and a source line driver circuit in each of which an EEMOS circuit is used as the inverter circuit is shown and described.

Next, a structure of the source line driver circuit in which the EEMOS circuit is used as an inverter circuit is described.

Figure 2:
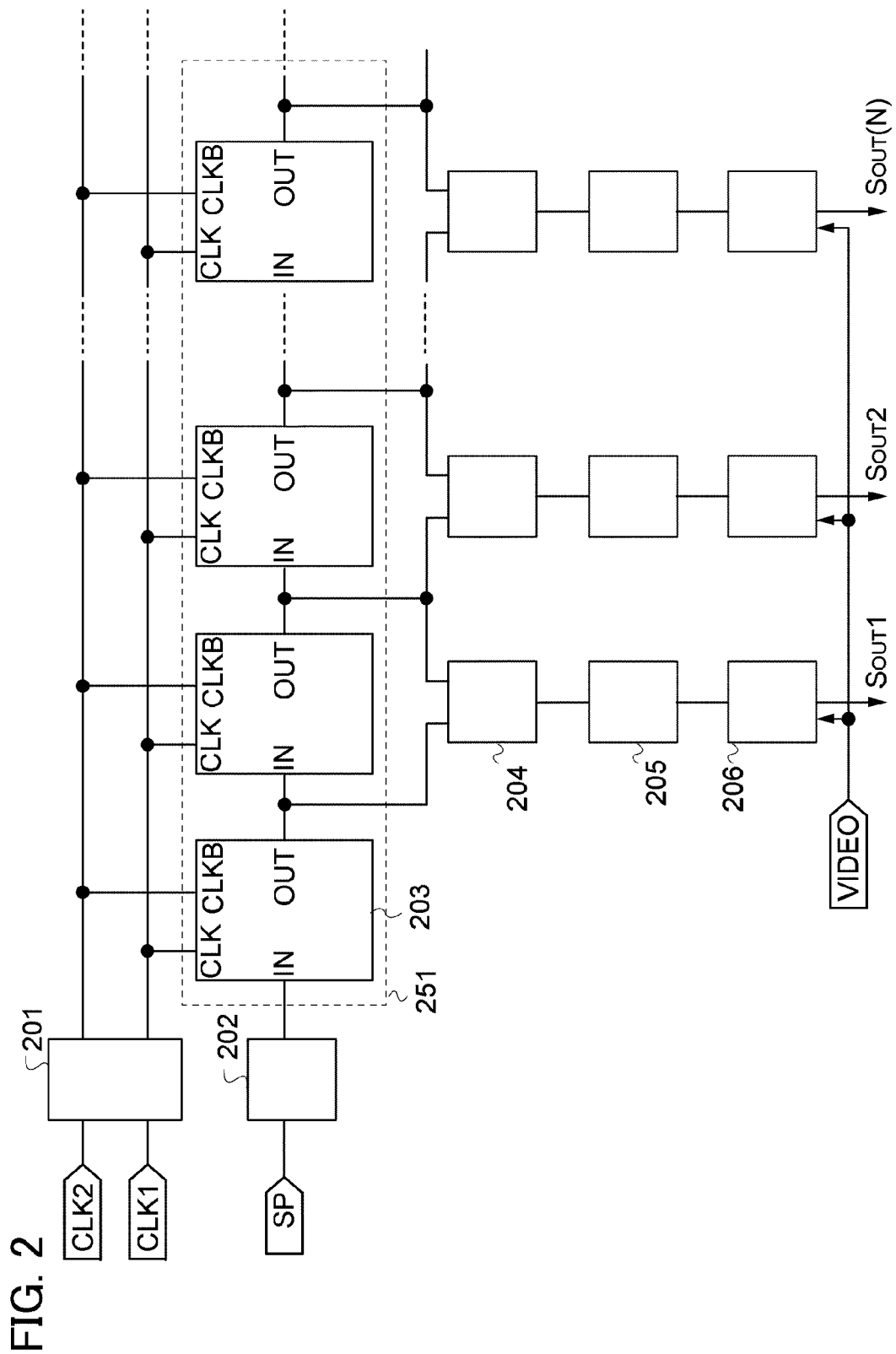
FIG. 2 is a diagram describing Embodiment 1.

FIG. 2 illustrates a structure of the source line driver circuit 101 in the display device shown in FIG. 1. The source line driver circuit includes a clock signal level shifter 201, a start pulse signal level shifter 202, a pulse output circuit 203 which forms a shift register 251, a NAND circuit 204, a buffer 205, and a sampling switch 206. Signals input from the outside are a first clock signal (CLK1), a second clock signal (CLK2), a start pulse (SP), and an analog video signal (Video). Among the signals input from the outside, in the first clock signal (CLK1), the second clock signal (CLK2), and the start pulse (SP, or also referred to as an input signal), the amplitude of the first clock signal (CLK1), the second clock signal (CLK2), and the start pulse is converted by the clock signal level shifter 201 or the start pulse signal level shifter 202 immediately after they have been input from the outside to the driver circuit as signals with low voltage amplitude and then the signals is with high voltage amplitude. Further, a source line driver circuit in the display device in this embodiment is described using an example in which a sampling pulse which is output from a pulse output circuits in one stage of a shift register drives the sampling switch 206 to sample analog video signals of source line Sout1 to Sout(N) at the same time. Note that, in addition, a structure of inputting a scanning direction switching signal for switching scanning direction, or the like may be applied. In addition, although this embodiment shows an example in which clock signals having phases different from each other, such as the first clock signal (CLK1) and the second clock signal (CLK2), drive the driver circuit, a structure in which the driver circuit is driven by inputting signals other than these clock signals is applicable.

Figure 3A:
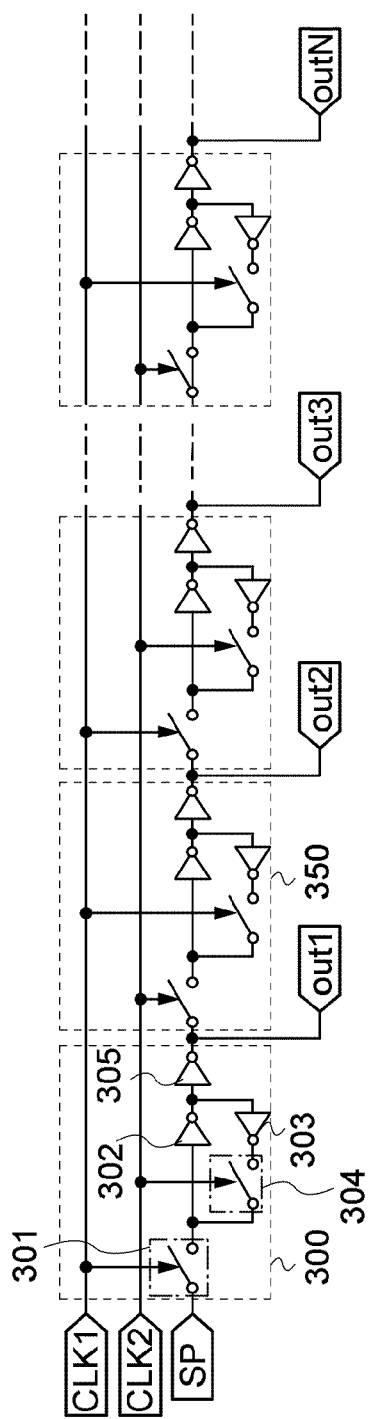
FIGS. 3A and 3B are diagrams describing Embodiment 1.
Figure 3B:
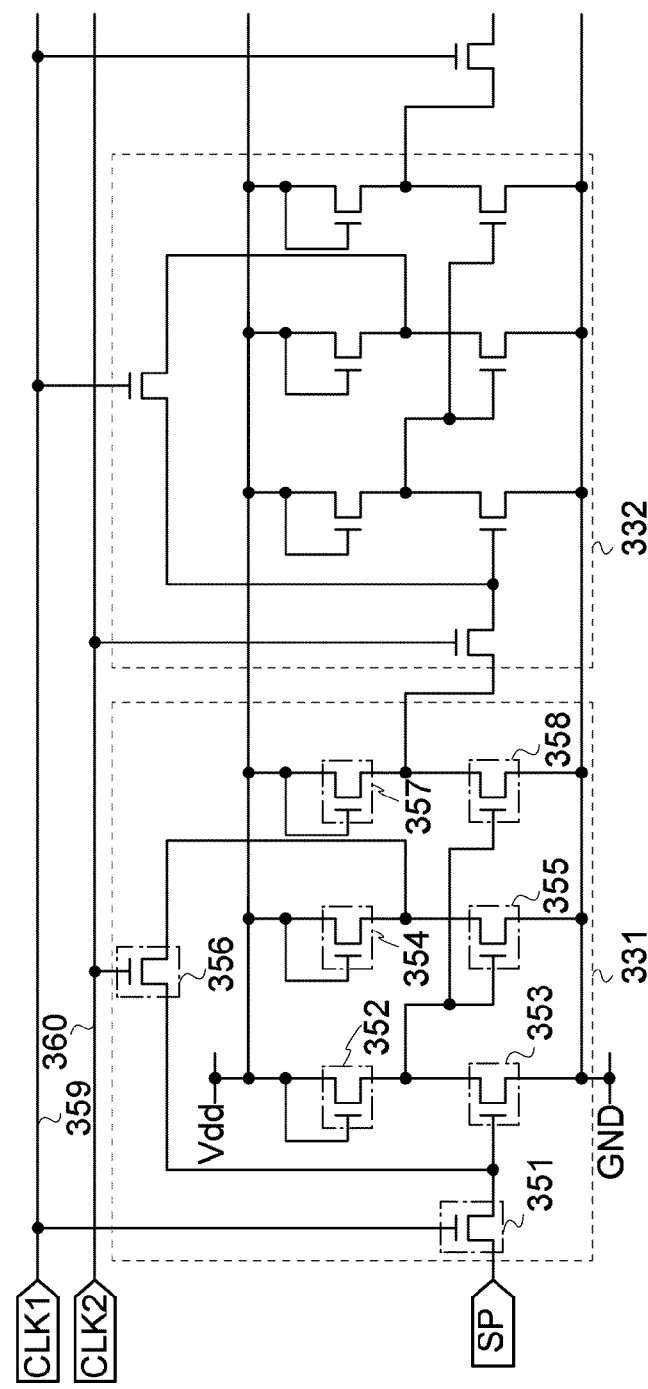

FIGS. 3A and 3B illustrate a structure of a pulse output circuit 203 provided in a shift register shown in FIG. 2. Note that in this embodiment, an example of a shift register of a static circuit is shown and described. As an example, a pulse output circuit 300 includes a first switch 301 connected to a terminal to which a start pulse SP is input, a first inverter circuit 302 which inverts a signal input through the first switch 301 and outputs the inverted signal, a second inverter circuit 303 which inverts the signal which is inverted by the first inverter circuit 302 and outputs the inverted signal, a second switch 304 which is connected to a terminal to which the signal inverted by the second inverter circuit 303 is input, and a third inverter circuit 305. In a circuit diagram shown in FIG. 3A, a block indicated by a dotted line 350 corresponds to the pulse output circuit which outputs a sampling pulse of one stage. The shift register in FIG. 3A includes N stages (N is a natural number, 1<N) of pulse output circuits. Output signals out1 to outN are output from output terminals of the third inverter circuits 305 of each N stages of the pulse output circuits. In the second stage (odd-numbered stage) of the pulse output circuit which is next to the above-described first stage (even-numbered stage) of the pulse output circuit, the first switch 301 and the second switch 304 are connected to the wiring to which the first clock signal is input and the wiring to which the second clock signal is input respectively, wherein the connection relationship is changed between the first stage and the second stage. After a third stage, the wiring to which the first clock signal is input and the wiring to which the second clock signal is input are alternately connected between the first switch 301 and the second switch 304.

FIG. 3B specifically illustrates a circuit structure of the pulse output circuit. The pulse output circuit body includes a TFT 351, a TFT 352, a TFT 353, a TFT 354, a TFT 355, a TFT 356, a TFT 357, and a TFT 358. A pulse output circuit 331 of an odd-numbered stage and a pulse output circuit 332 of an even-numbered stage are connected to a wiring 359 for supplying the first clock signal CLK1 and a wiring 360 for supplying the second clock signal CLK2, respectively. In the pulse output circuit 331 of the first stage, a first terminal of the TFT 351 is connected to a terminal to which a start pulse SP is input, a gate terminal of the TFT 351 is connected to the wiring 359, and a second terminal of the TFT 351 is connected to a gate terminal of the TFT 353 and a second terminal of the TFT 356. A first terminal and a gate terminal of the TFT 352 are connected to a wiring to which high power supply potential VDD is supplied, and a second terminal of the TFT 352 is connected to a first terminal of the TFT 353, a gate terminal of the TFT 355, and a gate terminal of the TFT 358. A second terminal of the TFT 353 is connected to a wiring to which low power supply potential VSS (also referred to as GND) is supplied. A first terminal and a gate terminal of the TFT 354 are connected to the wiring to which high power supply potential VDD is supplied, and a second terminal of the TFT 354 is connected to a first terminal of the TFT 355 and a first terminal of the TFT 356. A second terminal of the TFT 355 is connected to the wiring to which low power supply potential VSS is supplied. A gate terminal of the TFT 356 is connected to the wiring 360. A first terminal and a gate terminal of the TFT 357 are connected to the wiring to which high power supply potential VDD is supplied, and a second terminal of the TFT 357 is connected to a first terminal of the TFT 358. Note that the second terminal of the TFT 357 in the pulse output circuit 331 of a first stage is connected to a first terminal of the TFT 351 in the pulse output circuit 332 of a second stage. In a similar manner, the second terminal of the TFT in the pulse output circuit of one stage is sequentially connected to the pulse output circuit of the following stage.

In FIG. 3B, the TFT 352 and the TFT 353 correspond to the first inverter circuit 302 shown in FIG. 3A and form an EEMOS circuit. Furthermore, the TFT 354 and the TFT 355 correspond to the second inverter circuit 303 shown in FIG. 3A and form an EEMOS circuit. The TFT 351 corresponds to the first switch 301 shown in FIG. 3A. The TFT 356 corresponds to the second switch 304 shown in FIG. 3A. Note that the TFT 351 and the TFT 356 are preferably enhancement transistors like the TFT 352 to the TFT 355. Since off current of a transistor can be reduced by using an enhancement transistor as a switch, both low power consumption and simplification of manufacturing process can be achieved.

Note that the transistor, such as an n-channel transistor or a p-channel transistor, is an element having at least three terminals including a gate, a drain, and a source, includes a channel formation region between a drain region and a source region, and can flow current through the drain region, the channel formation region, and the source region. Here, since a source and a drain are switched with each other depending on the structure, operating condition, or the like of a transistor, it is difficult to determine which is the source or the drain in some cases. Accordingly, in this embodiment, one of regions which function as a source and a drain is referred to as a first terminal and the other of regions is referred to as a second terminal. Further, a terminal which functions as a gate is referred to as a gate terminal.

Figure 4:
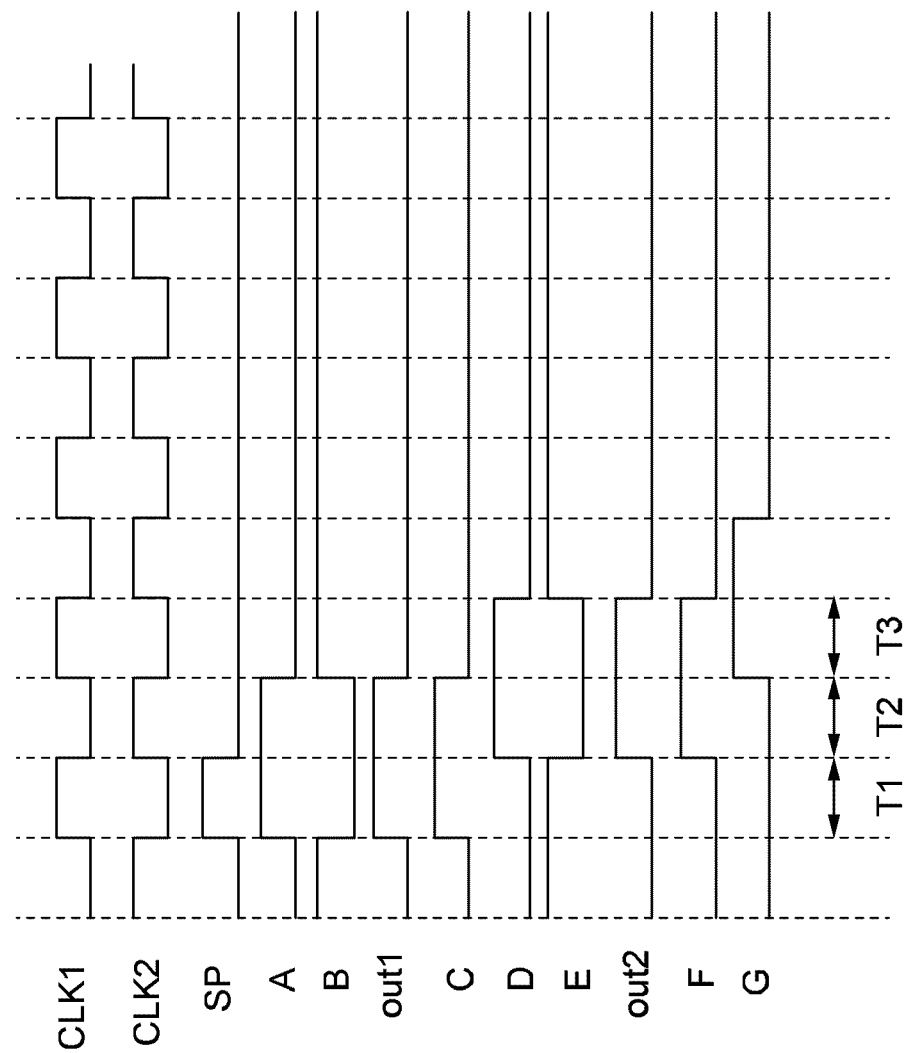
FIG. 4 is a diagram describing Embodiment 1.

Here, circuit operation of a circuit shown in FIG. 3A and FIG. 3B is described. A timing chart shown in FIG. 4 is referred. Note that, for description in FIG. 4, nodes in the pulse output circuit of a first stage in the circuit shown in FIG. 3B are defined as follows; the second terminal of the TFT 351 is referred to as a node A (denoted as A in FIG. 4), the second terminal of the TFT 352 is referred to as a node B (denoted as B in FIG. 4), the second terminal of the TFT 354 is referred to as a node C (denoted as C in FIG. 4), and the second terminal of the TFT 357 is referred to as a node out1 (denoted as out1 in FIG. 4). In addition, nodes in the pulse output circuit of the second stage in the circuit shown in FIG. 3B are defined as follows; the second terminal of the TFT 351 is referred to as a node D (denoted as D in FIG. 4), the second terminal of the TFT 352 is referred to as a node E (denoted as E in FIG. 4), the second terminal of the TFT 354 is referred to as a node F (denoted as F in FIG. 4), and a second terminal of the TFT 357 is referred to as a node out2 (denoted as out2 in FIG. 4). Further, as a node in the pulse output circuit of a third stage in the circuit shown in FIG. 3B, the second terminal of the TFT 351 is referred to as a node G (denoted as G in FIG. 4).

In FIG. 4, description is made on operation when a start pulse SP is in an H level, a first clock signal CLK1 is in an H level, and a second clock signal CLK2 is in an L level in a period T1. Since the first clock signal CLK1 is in the H level, the TFT 351 in the pulse output circuit of a first stage is turned on. Then, the H level which is the voltage level of the start pulse raises the voltage level of the node A to the H level. Then, since the voltage level of the node A is raised to the H level, the TFT 353 in the pulse output circuit of the first stage is turned on. Then, the L level which is the voltage level of the low power supply potential lowers the voltage level of the node B to the L level. Then, since the voltage level of the node B is lowered to the L level, the TFT 355 in the pulse output circuit of the first stage is turned off. Then, the H level which is the voltage level of the high power supply potential raises the voltage level of the node C to the H level. In addition, since the voltage level of the node B is lowered to the L level, the TFT 358 in the pulse output circuit of the first stage is turned off. Then, the H level which is the voltage level of the high power supply potential raises the voltage level of the node out1 to the H level. Note that, since the second clock signal CLK2 is in the L level, the TFT 356 in the pulse output circuit of the first stage and the TFT 351 in a pulse output circuit of the second stage are turned off.

Next, in FIG. 4, description is made on operation when the start pulse SP is in the L level, the first clock signal CLK1 is in the L level, and the second clock signal CLK2 is in the H level in the period T2. Since the first clock signal CLK1 is in the L level, the TFT 351 in the pulse output circuit of the first stage is turned off. On the other hand, since the second clock signal CLK2 is in the H level, the TFT 356 in the pulse output circuit of the first stage is turned on. Therefore, by the voltage level of the node C which is in the H level in the period T1, the voltage level of the node A is maintained as the H level. Then, the pulse output circuit of the first stage operates the same as that in the period T1. In the period T2, since the second clock signal CLK2 is in the H level, the TFT 351 in the pulse output circuit of the second stage is turned on. Then, the H level which is the voltage level of the node out1 raises the voltage level of the node D to the H level. Then, since the voltage level of the node D is raised to the H level, the TFT 353 in the pulse output circuit of the second stage is turned on. Then, the L level which is the voltage level of the low power supply potential lowers the voltage level of the node E to the L level. Then, since the voltage level of the node E is lowered to the L level, the TFT 355 in the pulse output circuit of the second stage is turned off. Then, the H level which is the voltage level of the high power supply potential raises the voltage level of the node F to the H level. In addition, since the voltage level of the node E is lowered to the L level, the TFT 358 in the pulse output circuit of the second stage is turned off. Then, the H level which is the voltage level of the high power supply potential raises the voltage level of the node out2 to the H level. Note that, since the first clock signal CLK1 is in the L level, the TFT 356 in the pulse output circuit of the second stage and the TFT 351 in the pulse output circuit of the third stage are turned off.

Next, in FIG. 4, description is made on operation when the start pulse SP is in the L level, the first clock signal CLK1 is in the H level, and the second clock signal CLK2 is in the L level in the period T3. Since the first clock signal CLK1 is in the H level, the TFT 351 in the pulse output circuit of the first stage is turned on. On the other hand, since the second clock signal CLK2 is in the L level, the TFT 356 in the pulse output circuit of the first stage is turned off. Therefore, the voltage level of the node A is lowered to the L level. Then, since the voltage level of the node A is lowered to the L level, the TFT 353 in the pulse output circuit of the first stage is turned off. Then, the H level which is the voltage level of the high power supply potential raises the voltage level of the node B to the H level. Then, since the voltage level of the node B is raised to the H level, the TFT 355 in the pulse output circuit of the first stage is turned on. Then, the L level which is the voltage level of the low power supply potential lowers the voltage level of the node C to the L level. In addition, since the voltage level of the node B is raised to the H level, the TFT 358 in the pulse output circuit of the first stage is turned on. Then, the L level which is the voltage level of the low power supply potential lowers the voltage level of the node out1 to the L level. Note that, since the second clock signal CLK2 is in the L level, the TFT 356 in the pulse output circuit of the first stage and TFT 351 in the pulse output circuit of the second stage are turned off. Further, as in the pulse output circuit of the first stage in the period T2, the TFT 356 in the pulse output circuit of the second stage is on. Since the voltage level of the node F is in the H level in the period T2, the voltage level of the node F is maintained as the H level. Then, the pulse output circuit of the second stage operates the same as that in the period T2. In the period T3, since the first clock signal CLK1 is in the H level, the TFT 351 in the pulse output circuit of the third stage is turned on. Then, the H level which is the voltage level of the node out2 raises the voltage level of a node G to the H level. Then, since the voltage level of the node G is raised to the H level, the TFT 353 in the pulse output circuit of the third stage is turned on. By sequentially controlling on/off of the transistor, a shift register which is formed by combining a plurality of stages of pulse output circuits can be driven.

Note that, the pulse output circuit described in FIG. 3A, FIG. 3B, and FIG. 4 has a structure in which the second switch 304 is provided between the node A and the node C. The voltage level of the node C which is controlled by the TFT 354 connected to the high power supply potential VDD is equal to or less than (VDD−VthN) (VthN is a threshold voltage of the TFT 354). It is preferable to disconnect the node A and the node C from each other by the second switch 304 and perform driving because the drive capability of the TFT 353 by the potential of the node A can be enhanced. Note that the present invention in this embodiment can be achieved even if the second switch 304 is not included.

Further, in a structure of the source line driver circuit, signals for driving each source line are generated by carrying out NAND operation with respect to signals output from the pulse output circuits. Therefore, it is preferable that more pulse output circuits of the lowest stage are provided than source lines so that the pulse output circuits generate signals to be output to the source lines.

Figure 5A:
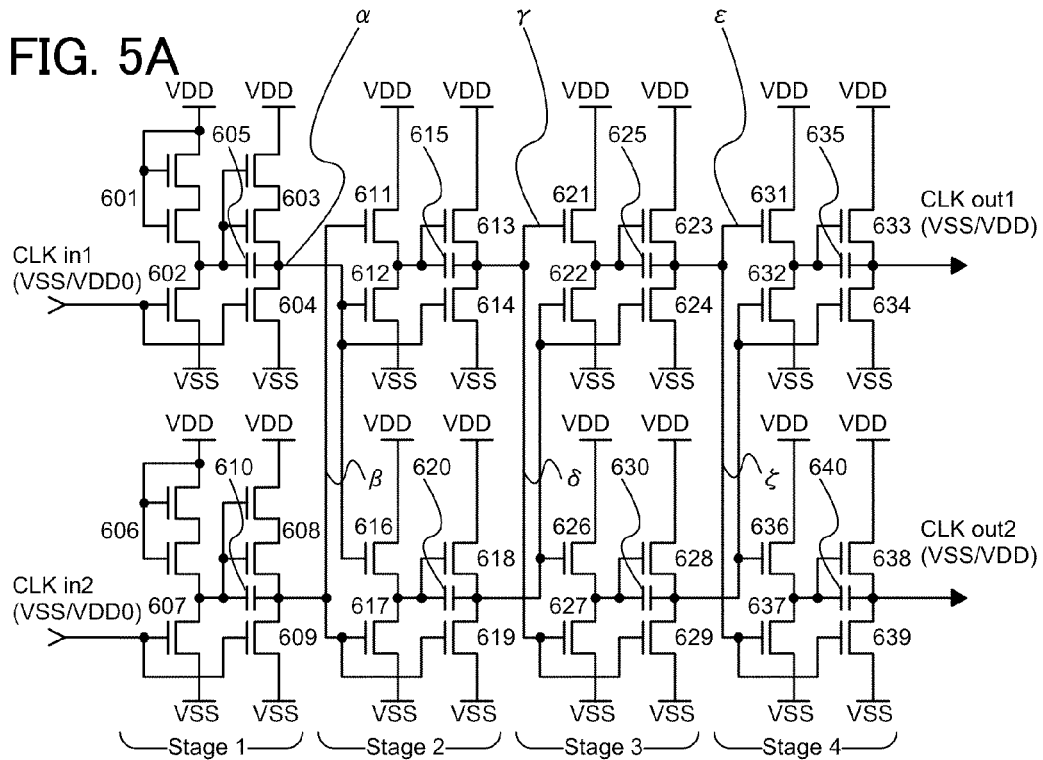
FIGS. 5A to 5D are diagrams each describing Embodiment 1.

FIG. 5A shows a structure of the clock signal level shifter 201 illustrated in FIG. 2. In the structure of the clock signal level shifter 201, the amplitudes of clock signals (CLK1 and CLK2) having the opposite polarities from each other are converted by one-input level shifter circuits provided in parallel respectively (Stage 1), and the signals output from the one-input level shifter circuits to the following buffer stages (Stage 2 to Stage 4) to use as the inverted input signals.

Operation of the circuit shown in FIG. 5A is described. Note that three power supply potentials of: VSS, VDD0, and VDD, are used where VSS<VDD0<VDD is satisfied. A structure in which the amplitude of a clock signal is level-shifted at an input portion of a source line driver circuit enables to achieve low power consumption and reduction of noises. Further, although, a TFT 601, a TFT 603, a TFT 606, and a TFT 608 have double gate structures in FIG. 5A, a single gate structure or a multigate structure having three or more gate electrodes may be applicable. In the other TFTs as well, there is no limitation on the number of gate electrodes.

A first input clock signal (CLK in1) having amplitude of (L level)/(H level)=VSS/VDD0 is input from a signal input portion (CLK in1). When the first input clock signal is in an H level, a TFT 602 and a TFT 604 are turned on, and the voltage level of a gate electrode of the TFT 603 is in an L level and turned off. Here, the on-resistance of the TFT 602 is designed in advance so that the on-resistance of the TFT 602 is adequately lower than that of the TFT 601. Therefore, a node α is in an L level. When the first input clock signal is in an L level, the TFT 602 and the TFT 604 are turned off. Therefore, the voltage level of a gate electrode of the TFT 603 is raised to VDD through the TFT 601 which operates in a saturation region, the TFT 601 is turned off when the potential is (VDD−VthN), and the gate electrode of the TFT 603 is in a floating state. Accordingly, the TFT 603 turned on and the potential of the node α is raised to VDD. Here, by a capacitor 605, the potential of the gate terminal of the TFT 603 which is in the floating state increases with a rise of the potential of the node α. When the potential of the gate terminal becomes higher than VDD and more than (VDD+ VthN), the H level of the node α is equal to VDD. Therefore, an L level of an output signal is VSS and an H level of the output signal is VDD. Accordingly, the amplitude conversion is completed.

On the other hand, in a manner similar to that of the signal input portion (CLK in1), a second input clock signal (CLK in2) having an amplitude of VSS/VDD0 is input from a signal input portion (CLK in2). By the similar operation as above, amplitude conversion is performed by the one-input level shifter circuits including TFTs 606 to 609 and a capacitor 610, and a signal having an amplitude of VSS/ VDD is output to a node β. Note that a signal obtained from the node α has the opposite polarity from the first input clock signal which is input, and a signal obtained from the node β has the opposite polarity from the second input clock signal which is input.

The level shifter described in FIG. 5A is provided with the buffer stages (Stage 2 to Stage 4) which follow the level shifter circuit (Stage 1) in consideration of a burden on a pulse after the amplitude conversion. An inverter circuit included in the buffer stages is a two-input type, and an input signal and an inverted signal of the input signal are needed. The reason why the two-input inverter circuit is used is that low power consumption can be achieved. In an abovementioned level shifter circuit, when the TFT 602 is on, through current flows between VSS and VDD through the TFT 601 and the TFT 602. By using the two-input type, the through current is made not to flow during the operation.

In FIG. 5A, in an inverter circuit of Stage 2, a signal input to a gate terminal of a TFT 611 and a signal input to a gate terminal of a TFT 612 have opposite polarities to each other. Accordingly, by taking the advantage that the first input clock signal and the second input clock signal are signals whose polarities are opposite to each other, an output signal obtained from the node α and an output signal obtained from the node β are used as inverted inputs of each other.

Operation of an inverter circuit is described. Here, operation of an inverter circuit on one side of Stage 2 including TFTs 611 to 614 and a capacitor 615 is described. Operation of other inverter circuits, such as an inverter circuit on the other side of Stage 2 including TFTs 616 to 619 and a capacitor 620, an inverter circuit of Stage 3 including TFTs 621 to 624 and a capacitor 625, an inverter circuit of Stage 3 including TFTs 626 to 629 and a capacitor 630, an inverter circuit of Stage 4 including TFTs 631 to 634 and a capacitor 635, and an inverter circuit of Stage 4 including TFTs 636 to 639 and a capacitor 640, is similar to this.

When a signal input to the gate terminal of the TFT 611 is in an H level, the TFT 611 is turned on and the potential of a gate electrode of the TFT 613 is raised to VDD. When the potential of the gate electrode of the TFT 613 is (VDD−VthN), the TFT 611 is turned off and the gate electrode of TFT 613 is in a floating state. On the other hand, since a signal input to a gate electrode of the TFT 612 and a gate electrode of the TFT 614 is in an L level, the TFT 612 and the TFT 614 are turned off. Since the potential of the gate electrode of the TFT 613 is raised to (VDD−VthN), the TFT 613 is turned on and the potential of a node γ is raised to VDD. Here, in a similar manner to the operation of the abovementioned level shifter circuit, by operation of the capacitor 615, the potential of the gate electrode of the TFT 613 which is in a floating state is raised as the potential of the node γ is raised. By the potential of the gate electrode gets higher than VDD and exceeds (VDD+VthN), whereby an H level in the node γ is equal to VDD.

On the other hand, when the signal input to a gate terminal of the TFT 611 is in an L level, the TFT 611 is turned off. Then, an H level is input to the gate terminal of the TFT 612 and the gate terminal of the TFT 614, whereby the TFT 612 and the TFT 614 are turned on. Accordingly, the potential of the gate electrode of the TFT 613 is in an L level and the node γ is in an L level.

By similar operation, a pulse is output to a node δ. At this time, a pulse whose polarity is opposite to that of the pulse in the node γ is output to the node δ.

After the abovementioned operations, the similar operation is performed in Stage 3 and Stage 4. A pulse whose polarity is opposite to that of the pulse in a node ∈ is output to a node ζ. A pulse is finally output to a signal output portion (CLK out1) and a signal output portion (CLK out2) by the similar operation.

Figure 5B:
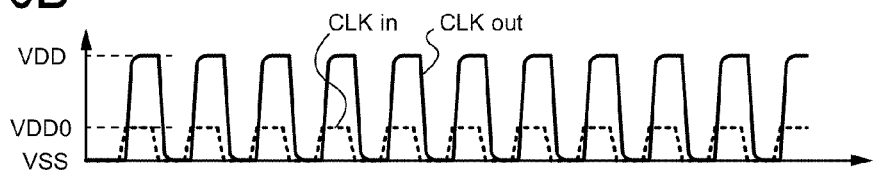

FIG. 5B shows the state of amplitude conversion of a clock signal. The amplitude of an input signal is (L level)/(H level)=VSS/VDD0, and the amplitude of an output signal is (L level)/(H level)=VSS/VDD.

Figure 5C:
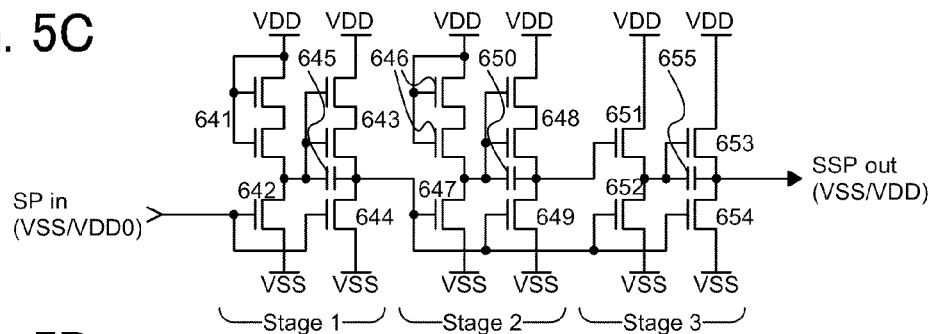

FIG. 5C shows a level shifter 202 for a start pulse (SP) shown in FIG. 2. In the case of a start pulse, since the start pulse does not have an inverted signal, an output from a one-input level shifter circuit (Stage 1) is input to a one-input inverter circuit (Stage 2). Moreover, the output from Stage 1 and the output from the Stage 2 are used as inputs to a two-input inverter circuit (Stage 3). The one-input level shifter circuit performs circuit operation similar to that in the case using a clock signal. Operation in the circuit of the one-input inverter circuit is similar to that of the one-input level shifter circuit except that the amplitude of a signal input is (L level)/(H level)=VSS/VDD and there is no amplitude conversion between input/output pulses. Therefore, description thereof is omitted here. In FIG. 5C, the one-input inverter circuit (Stage 1) includes TFTs 641 to 644 and a capacitor 645, the one-input inverter circuit (Stage 2) includes TFTs 646 to 649 and a capacitor 650, and the two-input inverter circuit (Stage 3) includes TFTs 651 to 654 and a capacitor 655, respectively.

Figure 5D:

FIG. 5D shows the state of the amplitude conversion of a start pulse (SP). The amplitude of an input signal is, like a clock signal, (L level)/(H level)=VSS/VDD0 and the amplitude of an output signal is (L level)/(H level)=VSS/VDD.

Figure 6A:
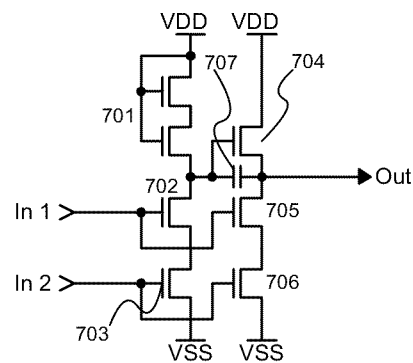
FIGS. 6A to 6C are diagrams each describing Embodiment 1.

FIG. 6A shows the two-input NAND circuit 204 illustrated in FIG. 2. The structure of the NAND circuit is similar to that of a one-input inverter circuit. The two-input NAND circuit 204 is different from the one-input inverter circuit only in that a signal input portion which corresponds to a signal input portion of one-input inverter circuit is two-input type and in that a TFT 702 and a TFT 703, and a TFT 705 and a TFT 706 are arranged in series. In FIG. 6A, a TFT 701 has double gate structure as an example.

When an H level is input to both a signal input portion (In1) and a signal input portion (In2), the TFT 702, the TFT 703, the TFT 705, and the TFT 706 are turned on, and the voltage level of a gate terminal of a TFT 704 become an L level whereby the TFT 704 is turned off. Accordingly, a signal output portion (Out) is in an L level. When an L level is input to both or any one of the signal input portion (In1) and the signal input portion (In2), since the gate terminal of the TFT 704 and a low power portion VSS are not brought into conduction, the voltage of the gate terminal of the TFT 704 is raised to VDD and the TFT 704 is turned on. Further, the voltage level of the gate terminal of the TFT 704 takes higher potential than that of (VDD+VthN) by a capacitor 707. Therefore, the signal output portion (Out) is in an H level of a potential VDD.

Figure 6B:
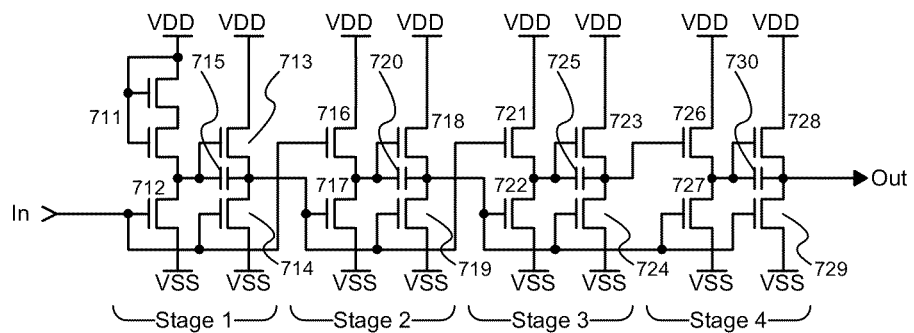

FIG. 6B shows a structure of a buffer 205 shown in FIG. 2 which includes a one-input inverter circuit (Stage 1) and two-input inverter circuits (Stage 2 to Stage 4). As for operation, description of the one-input inverter circuit and two-input inverter circuits is omitted here because the description is made in the paragraph of the level shifter. In FIG. 6B, the one-input inverter circuit (Stage 1) includes TFTs 711 to 714 and a capacitor 715, the two-input inverter circuit (Stage 2) includes TFTs 716 to 719 and a capacitor 720, the two-input inverter circuit (Stage 3) includes TFTs 721 to 724 and a capacitor 725, and the two-input inverter circuit (Stage 4) includes TFTs 726 to 729 and a capacitor 730, respectively.

Figure 6C:
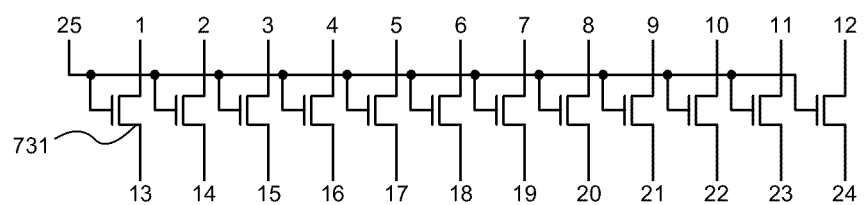

FIG. 6C shows a structure of a sampling switch 206 shown in FIG. 2. A sampling pulse is input from a signal input portion (25), and twelve TFTs 731 disposed in parallel are controlled at the same time. The sampling switch writes the potential of a video signal, which is obtained when an analog video signal is input to input electrodes (1) to (12) of the twelve TFTs 731 and the sampling pulse is input, to a source line.

In the display device shown in this embodiment, a transistor of a driver circuit for driving a pixel portion is a unipolar transistor having the same polarity of a pixel TFT and is an enhancement TFT. Accordingly, it is possible to omit a step for a complementary circuit structure, which results in contribution to reduction of manufacturing cost and improvement of a yield.

Figure 7:
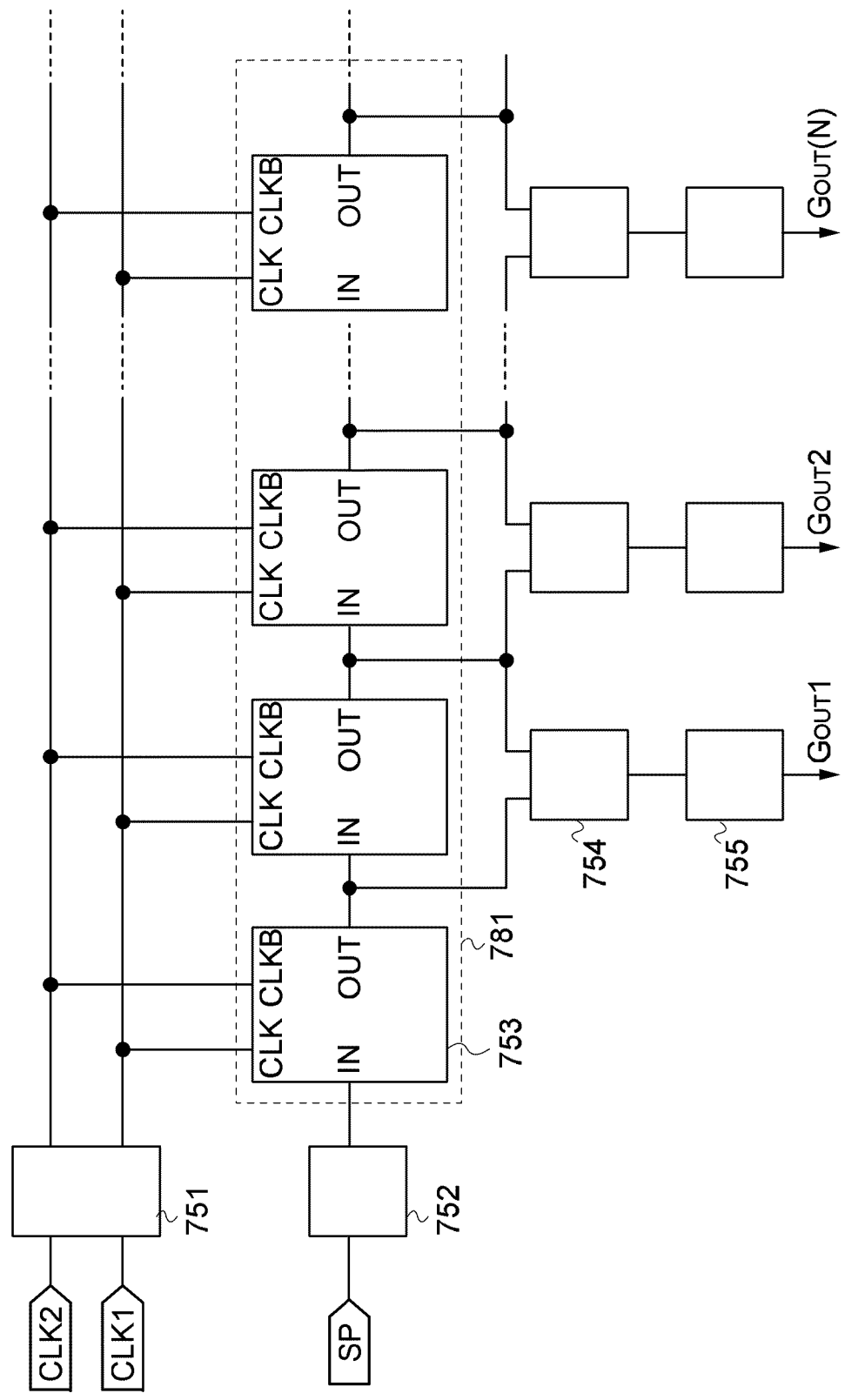
FIG. 7 is a diagram describing Embodiment 1.

Next, FIG. 7 shows a circuit structure of a gate line driver circuit 102 in the display device shown in FIG. 1. The gate line driver circuit includes a clock signal level shifter 751, a start pulse level shifter 752, a pulse output circuit 753 which are included in a shift register 781, a NAND circuit 754, and a buffer 755.

A first clock signal (CLK1), a second clock signal (CLK2), and a start pulse (SP) are input to the gate line driver circuit. Immediately after such input signals are input as signals with low voltage amplitude from the outside, the amplitude of the input signals are converted by the clock signal level shifter 751 and the start pulse level shifter 752, and are input to the driver circuit as signals with high voltage amplitude.

Note that, description of a structure and operation of about the pulse output circuit 753, the buffer 755, the clock signal level shifter 751, the clock signal level shifter 752, and the NAND circuit 754 are omitted here because the structure and the operation are as the same as that of the source line driver circuit.

Figure 8:
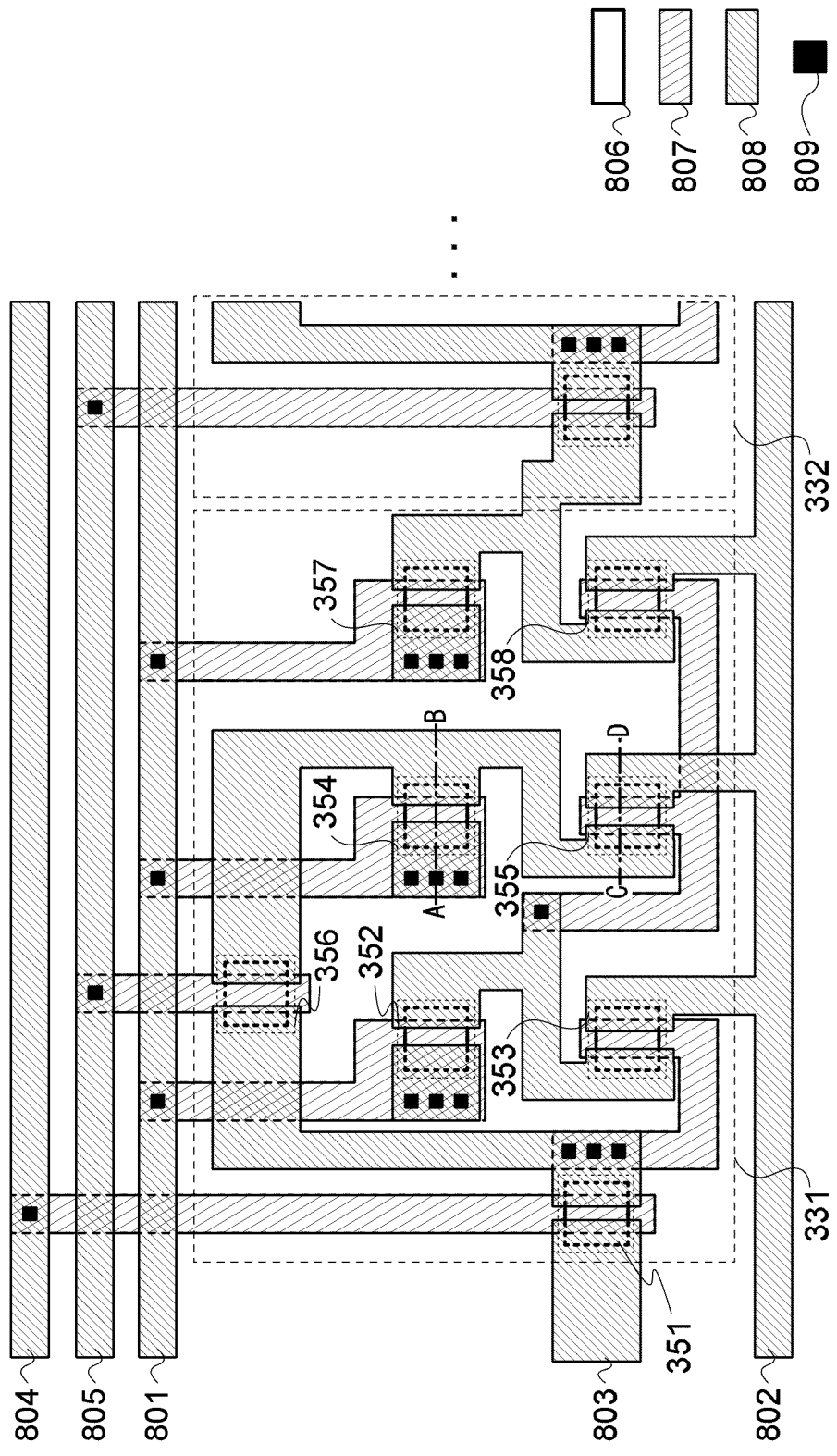
FIG. 8 is a diagram describing Embodiment 1.

Next, FIG. 8 shows a layout view (a top view) of the pulse output circuit shown in FIG. 3B. Note that FIG. 8 shows a pulse output circuit of a first stage among pulse output circuits of a plurality of stages.

The pulse output circuit in FIG. 8 includes a power supply line 801 which is supplied with power supply potential VDD, a power supply line 802 which is supplied with power supply potential GND, a control signal line 803, a control signal line 804, a control signal line 805, a TFT 351, a TFT 352, a TFT 353, a TFT 354, a TFT 355, a TFT 356, a TFT 357, and a TFT 358.

In FIG. 8, an oxide semiconductor film 806, a first wiring layer 807, a second wiring layer 808, and a contact hole 809 are shown. Note that the first wiring layer 807 is a layer which forms a gate electrode. In addition, the second wiring layer 808 is a layer which forms a source electrode and a drain electrode of a transistor.

Note that connection relation of each circuit element in FIG. 8 is the same as that of in FIG. 3B. Note that, in FIG. 8, the control signal line 803 is a wiring which is supplied with a start pulse SP; the control signal line 804 is a wiring which is supplied with a first clock signal; the control signal line 805 is a wiring which is supplied with a second clock signal; the power supply line 801 which is supplied with the high power supply potential VDD; and the power supply line 802 which is supplied with the low power supply potential VSS.

In the layout view of the pulse output circuit in FIG. 8, in this embodiment, the TFTs 351 to 358 are designed formed by using an EEMOS. Therefore, off current flowing through the TFT can be reduced. Further, since a TFT in which an oxide semiconductor film is used for a channel formation region has better electrical characteristics, such as mobility, than a TFT in which amorphous silicon is used for a channel formation region, the area occupied by the TFT in the circuit can be reduced without degradation of performance.

Note that, in the layout view of the pulse output circuit in FIG. 8, channel formation regions in the TFTs 351 to 358 may have a U shape. In addition, although the figure shows that the size of each TFT is the same, the size of the TFT may be changed as appropriate in accordance with the size of a load in a lower stage.

Figure 9A:
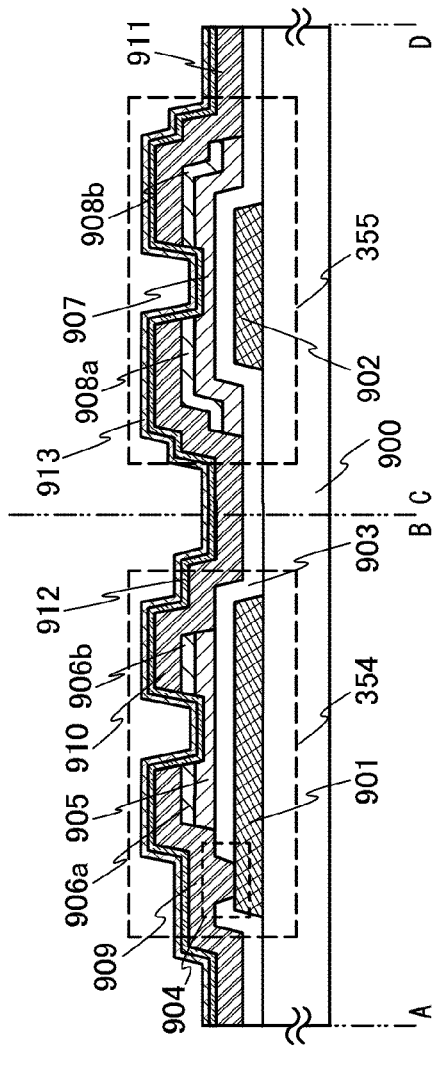
FIGS. 9A and 9B are diagrams each describing Embodiment 1.
Figure 9B:
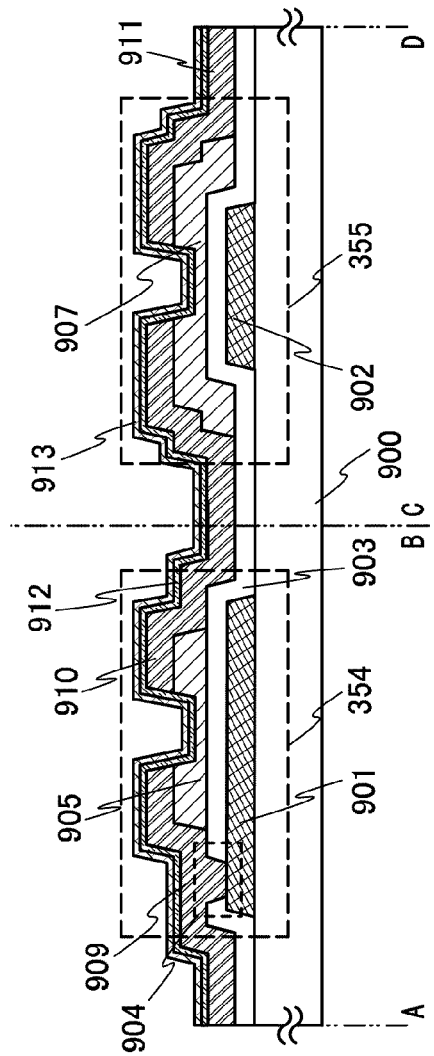

Next, a manufacturing process of the TFT in the layout view described in FIG. 8 is described with reference to FIGS. 9A and 9B. FIGS. 9A and 9B each show a cross section of an inverter circuit which forms a driver circuit by using two n-channel TFTs, for example, the TFT 354 and the TFT 355 of FIG. 8, and manufacturing of the TFT 354 and 355 is described below. Note that the cross sections of the TFT 354 and the TFT 355 are shown along a dotted line A-B and dotted line C-D in FIG. 8.

Note that the pixel portion and the driver circuit are provided over the same substrate. In the pixel portion, on/off of voltage application to a pixel electrode is switched by using enhancement transistors arranged in matrix. The enhancement transistor which is provided in the pixel portion is formed by using an oxide semiconductor, and the electric characteristics thereof is that an on/off ratio is equal to or more than $10^9$ when gate voltage is ±20 V; therefore, leak current is small and low power consumption driving can be realized.

FIG. 9A shows a cross-sectional structure of the inverter circuit in the driver circuit. Note that the TFT 354 and the TFT 355 in FIG. 9A are an example of a TFT in which a gate electrode is provided under a semiconductor layer with a gate insulator film interposed therebetween and a wiring is provided on the semiconductor layer.

In FIG. 9A, a first gate electrode 901 and a second gate electrode 902 are provided over a substrate 900. A material of the first gate electrode 901 and the second gate electrode 902 is desirably formed of a low resistance conductive material, such as aluminum (Al), or copper (Cu). Since aluminum itself has disadvantages such as low heat resistance and a tendency to be corroded, it is used in combination with a conductive material having heat resistance. As a heat-resistant conductive material, an element selected from titanium (Ti), tantalum (Ta), tungsten (W), molybdenum (Mo), chromium (Cr), neodymium (Nd), and scandium (Sc), an alloy containing any of these elements, an alloy film including a combination of these elements, or a nitride containing any of these elements is used.

For example, as a stacked structure of two layers of the first gate electrode 901 and the second gate electrode 902, a stacked structure of two layers in which a molybdenum layer is stacked over an aluminum layer, a stacked structure of two layers in which a molybdenum layer is stacked over a copper layer, a stacked structure of two layers in which a titanium nitride layer or a tantalum nitride layer is stacked over a copper layer, or a stacked structure of two layers in which a titanium nitride layer and a molybdenum layer are stacked is preferable. As a stacked structure of three layers, a stacked layer of a tungsten layer or a tungsten nitride layer, an alloy of aluminum and silicon or an alloy of aluminum and titanium, and a titanium nitride layer or a titanium layer is preferable.

In addition, a first oxide semiconductor film 905 and a second oxide semiconductor film 907 are provided over a gate insulating layer 903 covering the first gate electrode 901 and the second gate electrode 902.

A first wiring 909 which is directly connected to the first gate electrode 901 through a contact hole 904 formed in the gate insulating layer 903, and a second wiring 910 extended over the second oxide semiconductor film 907 are provided over the first oxide semiconductor film 905. Further, a third wiring 911 is provided over the second oxide semiconductor film 907.

The TFT 354 includes the first gate electrode 901 and the first oxide semiconductor film 905 overlapping with the first gate electrode 901 with the gate insulating layer 903 interposed therebetween, and is connected to the first wiring 909 and the second wiring 910.

In addition, the TFT 355 includes the second gate electrode 902 and the second oxide semiconductor film 907 overlapping with the second gate electrode 902 with the gate insulating layer 903 interposed therebetween, and is connected to the second wiring 910 and the third wiring 911.

Further, an n$^+$ layer 906a is provided between the first oxide semiconductor film 905 and the first wiring 909, and an n$^+$ layer 906b is provided between the first oxide semiconductor film 905 and the second wiring 910. Furthermore, an n$^+$ layer 908a is provided between the second oxide semiconductor film 907 and the second wiring 910, and an n$^+$ layer 908b is provided between the second oxide semiconductor film 907 and the third wiring 911.

The n$^+$ layers 906a, 906b, 908a, and 908b which can function as source or drain regions and are described in this embodiment are In—Ga—Zn—O-based non-single-crystal films. The n$^+$ layers 906a, 906b, 908a, and 908b are formed in different deposition conditions from the first oxide semiconductor film 905 and the second oxide semiconductor film 907, and are oxide semiconductor films having lower resistance. Note that in this embodiment, the n$^+$ layers 906a, 906b, 908a, and 908b are In—Ga—Zn—O-based non-single-crystal films and include at least an amorphous component. The n$^+$ layers 906a, 906b, 908a, and 908b include a crystal grain (nano-crystal) in a non-single-crystal structure in some cases. The crystal grain (nano-crystal) in the n$^+$ layers 906a, 906b, 908a, and 908b have a diameter of 1 nm to 10 nm, typically about 2 nm to 4 nm.

By providing the n$^+$ layers 906a, 906b, 908a, and 908b favorable bonding can be obtained, between the first wiring 909, the second wiring 910, and the third wiring 911 which are metal layers, and the first oxide semiconductor film 905 and the second oxide semiconductor film 907, which results in thermally stable operation as compared to a Schottky junction. In addition, it is effective to actively provide the n$^+$ layers in order to supply carrier of a channel (source side), to stably absorb the carrier of the channel (drain side), or to prevent generation of a resistive component in interface between a wiring and an oxide semiconductor film. Further, good mobility is maintained even when drain voltage is high because of low resistance.

As shown in FIG. 9A, the first wiring 909 electrically connected to the first oxide semiconductor film 905 is directly connected to the first gate electrode 901 of the TFT 354 through the contact hole 904 formed in the gate insulating layer 903. By the direct connection, favorable contact can be obtained and contact resistance can be reduced. Compared to the case of connecting the first gate electrode 901 to the first wiring 909 through another conductive film, for example a transparent conductive film, the reduction of the number of contact holes and the reduction of the area occupied by the reduction of the number of contact holes can be achieved.

In addition, as shown in FIG. 9A, a silicon oxide film 912 including an OH group and a silicon nitride film 913 are formed over the first wiring 909, the second wiring 910, the third wiring 911, the first oxide semiconductor film 905, and the second oxide semiconductor film 907. In this embodiment, it is preferable that the silicon oxide film is formed over a wiring layer and an oxide semiconductor film using a compound including an OH group like TEOS (chemical formula: Si(OC$_2$H$_5$)$_4$), so that the film including the OH group in the silicon oxide film is formed. The silicon oxide film including the OH group can be formed by a plasma CVD method in which TEOS and O$_2$ are mixed, a reaction pressure is set at 40 Pa, a substrate temperature is set at 300 to 400° C., and a high frequency (13.56 MHz) electric power is set at 0.5 to 0.8 W/cm$^2$ for discharging. Further, over the silicon oxide film 912 including the OH group, the silicon nitride film 913 may be formed using SiH$_4$ and NH$_3$ by plasma CVD method in a manner similar to that of the silicon oxide film. As disclosed in this embodiment, the silicon oxide film 912 including the OH group and the silicon nitride film 913 are sequentially formed on the first oxide semiconductor film 905 and the second oxide semiconductor film 907, so that termination of dangling bonds in the oxide semiconductor film by the OH group and prevention of decrease in resistance due to a vacancy of oxygen in the oxide semiconductor film can be achieved. As a result, it is possible to reduce a shift of the threshold voltage of a TFT and to maintain the effect of the reduction of off current caused by an enhancement transistor.

Further, as disclosed in this embodiment, the silicon oxide film 912 including the OH group and the silicon nitride film 913 are formed sequentially over the first oxide semiconductor film 905 and the second oxide semiconductor film 907, so that a structure in which the silicon nitride film functioning as a passivation film is not directly in contact with the oxide semiconductor film can be obtained. That is, decrease in resistance caused by nitridation of the oxide semiconductor film by nitrogen in the silicon nitride film can be suppressed. Further, a silicon oxide film including the OH group is interposed between the silicon nitride film and the oxide semiconductor film, so that the stress caused by formation of the silicon nitride film can be relieved and hydrogenation (or deoxidation) of the oxide semiconductor caused by application of the stress on the oxide semiconductor can be reduced.

Note that, although FIG. 9A shows a structure in which the n$^+$ layers 906a, 906b, 908a, and 908b are provided on the first oxide semiconductor film 905 and the second oxide semiconductor film 907, the n$^+$ layers 906a, 906b, 908a, and 908b are not necessarily provided as shown in FIG. 9B. Further, whether or not the wiring layer and the gate electrode are connected through the contact hole 904 may be selected in accordance with a circuit structure.

Figure 10A:
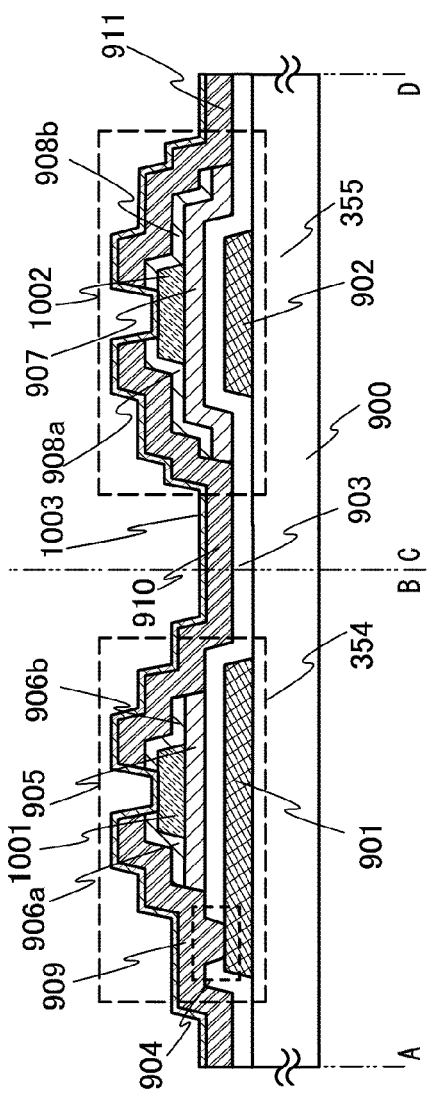
FIGS. 10A and 10B are diagrams each describing Embodiment 1.
Figure 10B:
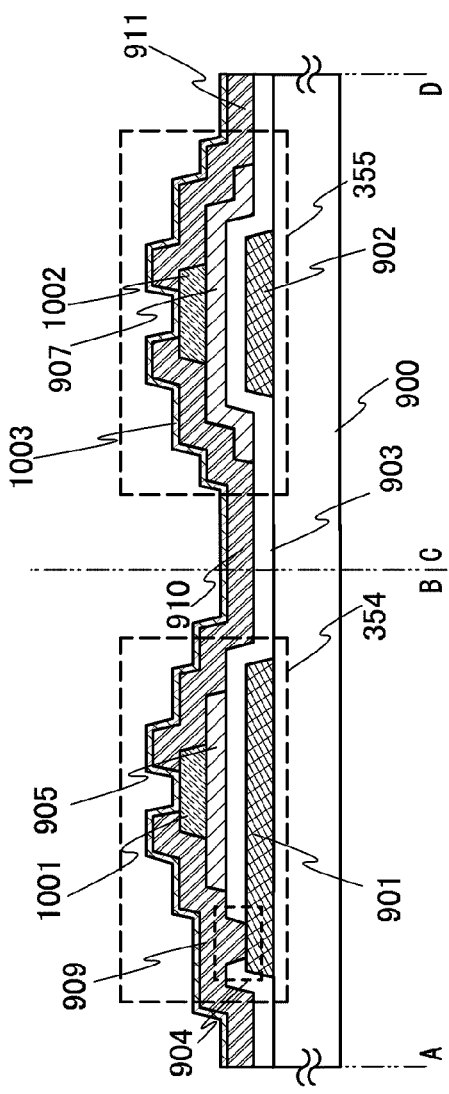

In FIGS. 9A and 9B, the silicon oxide film 912 including the OH group and the silicon nitride film 913 are sequentially formed over the first oxide semiconductor film 905 and the second oxide semiconductor film 907, another structure may be used. For example, the structure in which, the silicon oxide film including the OH group is formed as a so-called channel stop film used in separating a source region and a drain region and the silicon nitride film is formed over the silicon oxide film may be used. An example is shown in FIGS. 10A and 10B. In cross-sectional structures shown in FIGS. 10A and 10B, the same components as FIGS. 9A and 9B are denoted by the same reference numerals.

In FIG. 10A, a first channel-protective layer 1001 and a second channel-protective layer 1002 formed in a similar way to the silicon oxide film 912 including the OH group in FIGS. 9A and 9B are provided on the first oxide semiconductor film 905 and the second oxide semiconductor film 907. In addition, in FIG. 10A, the n$^+$ layers 906a, 906b, 908a, and 908b are formed so as to cover the first channel-protective layer 1001 and the second channel-protective layer 1002 and are etched, thereby separating a source region and a drain region. After the n$^+$ layers 906a, 906b, 908a, and 908b are formed, as shown in FIG. 10A, the first wiring 909, the second wiring 910, and the third wiring 911 are formed, and a silicon nitride film 1003 is formed over the channel-protective layers 1001 and 1002, and the first wiring 909 to the third wiring 911. As shown in FIG. 10A, the silicon oxide film including the OH group and the silicon nitride film are formed over the first oxide semiconductor film 905 and the second oxide semiconductor film 907, so that a structure in which the silicon nitride film functioning as a passivation film is not directly in contact with the oxide semiconductor film can be obtained. That is, decrease in resistance caused by nitridation of the oxide semiconductor film by nitrogen in the silicon nitride film can be suppressed. As a result, it is possible to reduce a shift of the threshold voltage of a TFT and to maintain the effect of the reduction of off current caused by an enhancement transistor.

The cross-sectional structure of a TFT shown in FIG. 10A is the structure in which the silicon oxide film is formed as a channel stop film and the silicon nitride film is formed over the silicon oxide film. Note that, although FIG. 10A illustrates the structure in which the $n^+$ layer is provided like in the FIG. 9A, the structure in which the $n^+$ layer is not provided as shown in FIG. 10B like in the FIG. 9B may be applied.

Although in FIGS. 9A, 9B and FIGS. 10A, and 10B, description is made on an inverted staggered TFT, a structure of TFT in this embodiment is not limited to an inverted staggered TFT. As an example, when a co-planar TFT is used, a similar advantage can be obtained. An example of a cross-sectional structure is shown in FIGS. 11A and 11B and description is made. In a cross-sectional structure shown in FIGS. 11A and 11B, the same components as FIGS. 9A and 9B are denoted by the same reference numerals.

In FIG. 11A, the first wiring 909, the second wiring 910, and the third wiring 911 are formed to be stacked together with the $n^+$ layers 906a, 906b, 908a, and 908b over the gate insulating layer 903. Then, the first oxide semiconductor film 905 and the second oxide semiconductor film 907 are provided in opening portions of the first wiring 909 to the third wiring 911 over which the $n^+$ layers 906a, 906b, 908a, and 908b are stacked. Then, as shown in FIG. 11A, a silicon oxide film 1101 including an OH group is formed over the $n^+$ layers 906a, 906b, 908a, and 908b, the first oxide semiconductor film 905, and the second oxide semiconductor film 907. A silicon nitride film 1102 functioning as a passivation film is formed over the silicon oxide film 1101 including the OH group. As shown in FIG. 11A, the silicon oxide film including the OH group and the silicon nitride film are formed over the first oxide semiconductor film 905 and the second oxide semiconductor film 907, so that a structure in which the silicon nitride film functioning as a passivation film is not directly in contact with the oxide semiconductor film can be obtained. That is, decrease in resistance caused by nitridation of the oxide semiconductor film by nitrogen in the silicon nitride film can be suppressed. Further, a silicon oxide film including the OH group is interposed between the silicon nitride film and the oxide semiconductor film, so that the stress caused by formation of the silicon nitride film can be relieved and hydrogenation (or deoxidation) of the oxide semiconductor caused by application of the stress on the oxide semiconductor can be reduced. As a result, it is possible to reduce a shift of the threshold voltage of a TFT and to maintain the effect of the reduction of off current caused by an enhancement transistor.

The cross-sectional structure of a TFT shown in FIG. 11A is the structure in which a silicon oxide film is formed over a co-planar TFT and a silicon nitride film is formed over the silicon oxide film. Note that, although FIG. 11A illustrates the structure in which the $n^+$ layer is provided like FIG. 9A and FIG. 10A, the structure shown in FIG. 11B in which the $n^+$ layer is not provided can be employed like in the FIG. 9B and FIG. 10B.

In abovementioned FIGS. 9A and 9B, FIGS. 10A and 10B, and FIGS. 11A and 11B, decrease in resistance caused by nitridation of the oxide semiconductor film by nitrogen in the silicon nitride film is suppressed and hydrogenation (or deoxidation) of the oxide semiconductor can be suppressed. As a result, it is possible to reduce a shift of the threshold voltage of a TFT and to maintain the effect of the reduction of off current caused by an enhancement transistor. Then, when a TFT which forms a pixel of a display device and a TFT which forms a driver circuit are manufactured by using an enhancement TFT, the enhancement TFT can be formed with a simpler structure compared with a structure of an enhancement TFT in which a threshold is controlled by providing gate electrodes above and below an oxide semiconductor film and the voltage of the two gate electrodes is controlled.

Next, in the cross-sectional view of the inverter circuit shown in FIGS. 9A and 9B, FIGS. 10A and 10B, and FIGS. 11A and 11B, which forms the driver circuit using two n-channel TFTs, a manufacturing process thereof is described below with reference to FIGS. 12A, 12B, and 12C by using FIG. 9A as an example. Note that the cross sections of the TFT 354 and the TFT 355 are shown along a dotted line A-B and dotted line C-D in FIG. 8.

A first conductive film is formed over the substrate 900 by a sputtering method and the first conductive film is selectively etched using a first photomask, so that the first gate electrode 901 and the second gate electrode 902 are formed. Next, the gate insulating layer 903 covering the first gate electrode 901 and the second gate electrode 902 are formed by a plasma CVD method or a sputtering method. The gate insulating layer 903 can be formed by a single-layer or stacked layers of a silicon oxide layer, a silicon nitride layer, a silicon oxynitride layer, and/or a silicon nitride oxide layer by a CVD method or a sputtering method. In addition, it is possible to form a silicon oxide layer as the gate insulating layer 903 by a CVD method using organosilane. For organosilane, a compound containing silicon, such as tetraethoxysilane (TEOS) (chemical formula: $Si(OC_2H_5)_4$), tetramethylsilane (TMS) (chemical formula: $Si(CH_3)_4$), tetramethylcyclotetrasiloxane (TMCTS), octamethylcyclotetrasiloxane (OMCTS), hexamethyldisilazane (HMDS), triethoxysilane (chemical formula: $SiH(OC_2H_5)_3$), or tris(dimethylamino)silane (chemical formula: $SiH(N(CH_3)_2)_3$) can be used.

Next, the gate insulating layer 903 is selectively etched using a second photomask and the contact hole 904 reaching the first gate electrode 901 is formed. The cross-sectional view up to this step corresponds to FIG. 12A.

Next, an oxide semiconductor film is formed by a sputtering method, the $n^+$ layer is further formed on the oxide semiconductor film. Note that, before an oxide semiconductor film is formed by the sputtering method, it is preferable to remove dust attached to a surface of the gate insulating layer 903 and a bottom surface of the contact hole 904 by reverse sputtering which generates plasma by introducing an argon gas. The reverse sputtering is the method that modifies a surface by generating plasma on a substrate by applying voltage to a substrate side using RF power supply under an argon atmosphere without applying voltage to a target side. Note that nitrogen, helium, or the like may be used instead of argon for the atmosphere. Further, an argon atmosphere to which oxygen, hydrogen, $N_2O$, or the like is added may be used. Moreover, an argon atmosphere to which $Cl_2$, $CF_4$, or the like is added may be used.

Next, the oxide semiconductor film and the $n^+$ layer are selectively etched using a third photomask. Next, a second conductive film is formed by a sputtering method, and the second conductive film is selectively etched using a fourth photomask, so that the first wiring 909, the second wiring 910 and the third wiring 911 are formed. The first wiring 909 is directly in contact with the first gate electrode 901 through the contact hole 904. Note that, before the second conductive film is formed by the sputtering method, it is preferable to remove dust attached to the surface of the gate insulating layer 903, a surface of the n$^+$ layer, and the bottom surface of the contact hole 904 by reverse sputtering which generates plasma by introducing an argon gas. The reverse sputtering is the method that modifies a surface by generating plasma on a substrate by applying voltage to a substrate side using RF power supply under an argon atmosphere without applying voltage to a target side. Note that nitrogen, helium, or the like may be used instead of argon for the atmosphere. Further, an argon atmosphere to which oxygen, hydrogen, N$_2$O, or the like is added may be used. Moreover, an argon atmosphere to which Cl$_2$, CF$_4$, or the like is added may be used.

Note that parts of the n$^+$ layer and the oxide semiconductor film are etched when the second conductive film is etched, so that the n$^+$ layers 906a, 906b, 908a, and 908b, the first oxide semiconductor film 905 and the second oxide semiconductor film 907 are formed. By the etching, the thickness of a portion of the first oxide semiconductor film 905 and the second oxide semiconductor film 907, which overlaps with the first gate electrode and the second gate electrode, is reduced. When the etching is finished, the TFT 354 and the TFT 355 are completed. The cross-sectional view up to this step corresponds to FIG. 12B.

Next, a heating process is performed at 200° C. to 600° C. under an air atmosphere or a nitrogen atmosphere. Note that a timing of performing the heating process is not limited and may be any time after the oxide semiconductor is formed.

Next, the silicon oxide film 912 including the OH group is formed by a CVD method using organosilane. For organosilane, a compound containing silicon, such as tetraethoxysilane (TEOS) (chemical formula: Si(OC$_2$H$_5$)$_4$), tetramethylsilane (TMS) (chemical formula: Si(CH$_3$)$_4$), tetramethylcyclotetrasiloxane (TMCTS), octamethylcyclotetrasiloxane (OMCTS), hexamethyldisilazane (HMDS), triethoxysilane (chemical formula: SiH(OC$_2$H$_5$)$_3$), or tris(dimethylamino)silane (chemical formula: SiH(N(CH$_3$)$_2$)$_3$) can be used. The silicon nitride film 913 is formed over the silicon oxide film 912 including the OH group. By the silicon oxide film 912 including the OH group and the silicon nitride film 913, the structure in which the silicon nitride film functioning as a passivation film is not directly in contact with the oxide semiconductor film can be obtained. In addition, the silicon oxide film including the OH group and the silicon nitride film are sequentially formed on the oxide semiconductor film, so that termination of dangling bonds in the oxide semiconductor film by the OH group and prevention of decrease in resistance due to a vacancy of oxygen in the oxide semiconductor film can be achieved. As a result, it is possible to reduce a shift of the threshold voltage of a TFT and to maintain the effect of the reduction of off current due to an enhancement transistor. The cross-sectional view up to this step corresponds to FIG. 12C.

Note that, although not shown, after a contact hole is formed in the silicon oxide film 912 including the OH group and the silicon nitride film 913 by being selectively etched using a fifth photomask, a third conductive film using the same material as a pixel electrode is formed. Then, the third conductive film is selectively etched using a sixth photomask, so that a connection wiring is formed for electrical connection with the same layers as the first wiring to the third wiring.

In a light emitting display device using a light emitting element, a pixel portion includes a plurality of TFTs, and also a contact hole for direct connection between a gate terminal of a TFT and an electrode which is source or drain of another transistor. The contact hole can be formed using the second photomask which is also used when the contact hole is formed in the gate insulating film.

Further, in a liquid crystal display device or electronic paper, a contact hole reaching a gate wiring in a terminal portion for connection with an external terminal such as an FPC can be formed using the second photo mask which is also used when the contact hole is formed in the gate insulating film.

Note that the above order of the steps is an example and there is no particular limitation on the order. For example, although one additional photomask is needed, etching may be separately performed using a photomask for etching the second conductive film and a photomask for etching part of the n$^+$ layer and the oxide semiconductor film.

Figure 12A:
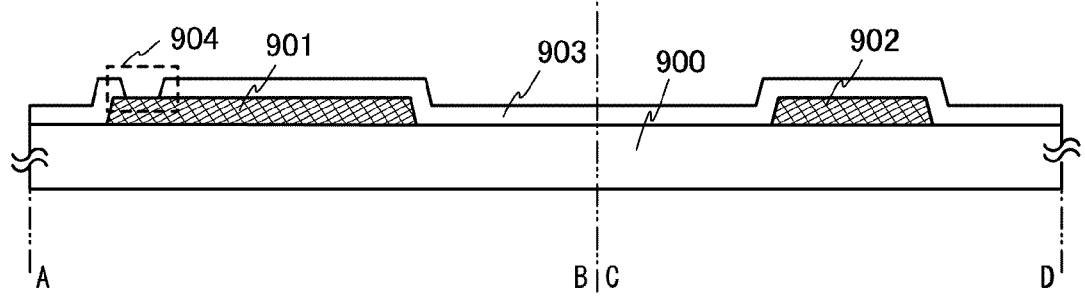
FIGS. 12A to 12C are diagrams describing Embodiment 1.
Figure 12B:
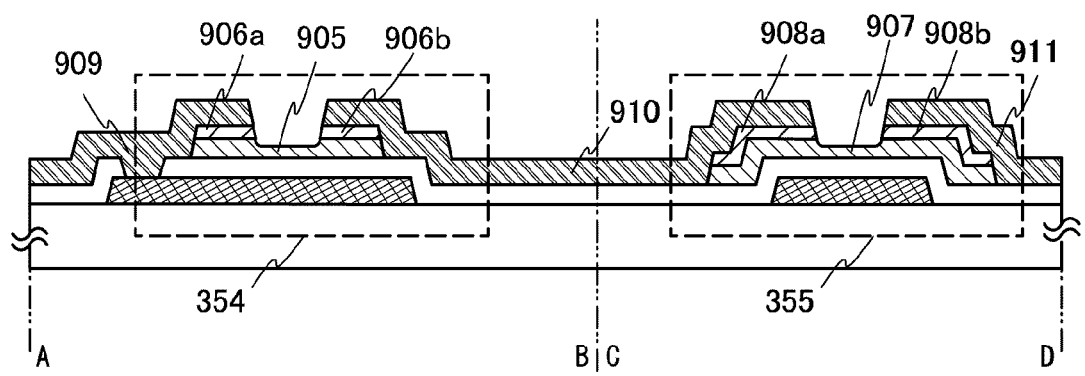
Figure 12C:
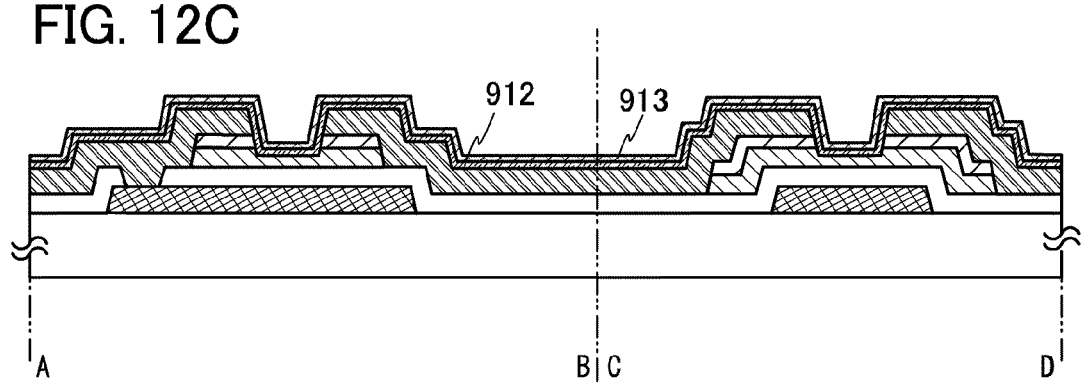

In addition, an example of a manufacturing process which is different from that of FIGS. 12A to 12C is described in FIGS. 13A to 13D.

A first conductive film is formed over the substrate 900 by a sputtering method and the first conductive film is selectively etched using a first photomask, so that the first gate electrode 901 and the second gate electrode 902 are formed. Next, the gate insulating layer 903 covering the first gate electrode 901 and the second gate electrode 902 are formed by a plasma CVD method or a sputtering method.

Next, an oxide semiconductor film is formed by a sputtering method, and the n$^+$ layer is further formed over the oxide semiconductor film.

Next, the oxide semiconductor film and the n$^+$ layer are selectively etched using the second photomask. In this manner, the oxide semiconductor film 905 and the n$^+$ layer 906 overlapping with the first gate electrode 901 with the gate insulating layer 903 interposed therebetween are formed below. The oxide semiconductor film 907 and the n$^+$ layer 908 overlapping with the second gate electrode 902 with the gate insulating layer 903 interposed therebetween are formed below. The cross-sectional view up to this step corresponds to FIG. 13A.

Next, the gate insulating layer 903 is selectively etched using a third photomask and the contact hole 904 reaching the second gate electrode 902 is formed. The cross-sectional view up to this step corresponds to FIG. 13B.

Next, the second conductive film is formed by a sputtering method, and the second conductive film is selectively etched using a fourth photomask, so that the first wiring 909, the second wiring 910 and the third wiring 911 are formed. Note that, before the second conductive film is formed by the sputtering method, it is preferable to remove dust attached to the surface of the gate insulating layer 903, a surface of n$^+$ layers 906 and 908, and the bottom surface of the contact hole 904 by reverse sputtering which generates plasma by introducing an argon gas. Note that nitrogen, helium, or the like may be used instead of argon for the atmosphere. Further, an argon atmosphere to which oxygen, hydrogen, N$_2$O, or the like is added may be used. Moreover, an argon atmosphere to which Cl$_2$, CF$_4$, or the like is added may be used.

In the steps described in FIGS. 13A to 13D, since the second conductive film can be formed without forming another films after the contact hole 904 is formed, the number of steps in which the bottom surface of the contact hole is exposed which is described in the FIGS. 12A to 12C can be reduced, so that a material of the gate electrode can be selected from a wider range. In the steps described in FIGS. 13A to 13D, since the oxide semiconductor film is formed in contact with a gate electrode area exposed in the contact hole 904, an etching condition in which a material of the gate electrode is not etched or a material of the gate electrode which is not etched in the etching step of the oxide semiconductor film needs to be selected.

Note that parts of the n+ layer and the oxide semiconductor film are etched when the second conductive film is etched, so that the n+ layers 906a, 906b, 908a, and 908b, the first oxide semiconductor film 905 and the second oxide semiconductor film 907 are formed. By the etching, the thickness of a portion of the first oxide semiconductor film 905 and the second oxide semiconductor film 907, which overlaps with the first gate electrode and the second gate electrode is reduced. When the etching is finished, the TFT 354 and the TFT 355 are completed.

Figure 13A:
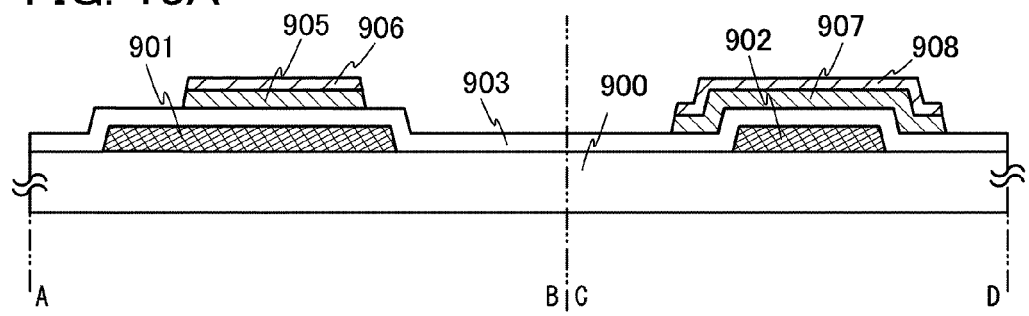
FIGS. 13A to 13D are diagrams describing Embodiment 1.
Figure 13B:
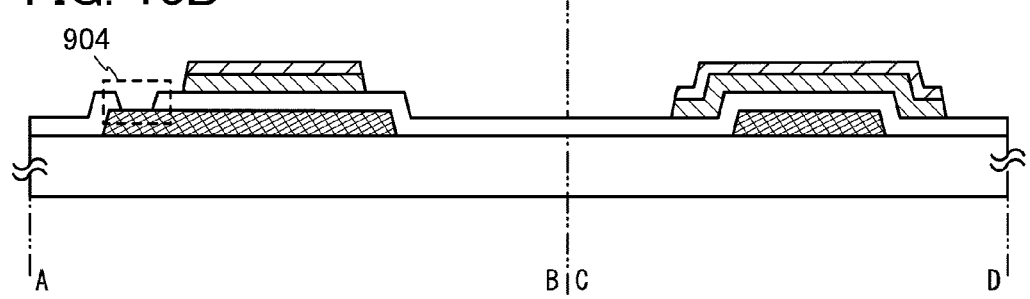
Figure 13C:
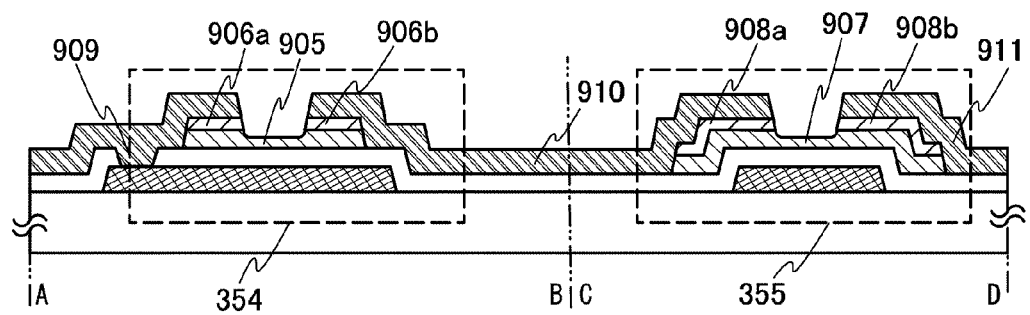
Figure 13D:
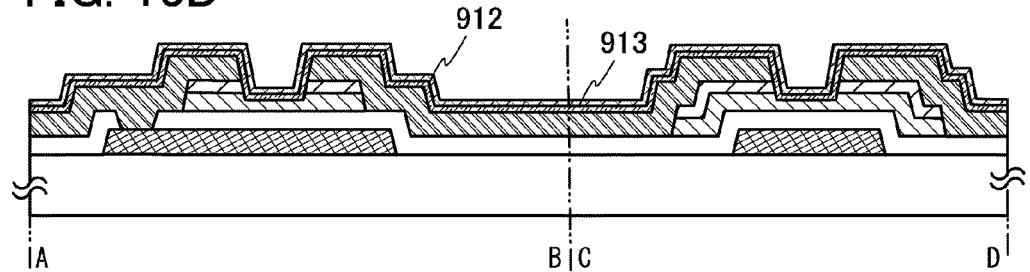

The cross-sectional view up to this step corresponds to FIG. 13C.

Next, a heating process is performed at 200° C. to 600° C. under an air atmosphere or a nitrogen atmosphere. Note that a timing of performing the heating process is not limited and may be any time after the oxide semiconductor is formed.

Next, the silicon oxide film 912 including the OH group is formed by a CVD method using organosilane. For organosilane, a compound containing silicon, such as tetraethoxysilane (TEOS) (chemical formula: $Si(OC_2H_5)_4$), tetramethylsilane (TMS) (chemical formula: $Si(CH_3)_4$), tetramethylcyclotetrasiloxane (TMCTS), octamethylcyclotetrasiloxane (OMCTS), hexamethyldisilazane (HMDS), triethoxysilane (chemical formula: $SiH(OC_2H_5)_3$), or tris(dimethylamino)silane (chemical formula: $SiH(N(CH_3)_2)_3$) can be used. The silicon nitride film 913 is formed over the silicon oxide film 912 including the OH group. By the silicon oxide film 912 including the OH group and the silicon nitride film 913, the structure in which the silicon nitride film functioning as a passivation film is not directly in contact with the oxide semiconductor film can be obtained. In addition, the silicon oxide film including the OH group and the silicon nitride film are sequentially formed on the oxide semiconductor film, so that termination of dangling bonds in the oxide semiconductor film by the OH group and prevention of decrease in resistance due to a vacancy of oxygen in the oxide semiconductor film can be achieved. As a result, it is possible to reduce a shift of the threshold voltage of a TFT and to maintain the effect of the reduction of off current due to an enhancement transistor. The cross-sectional view up to this step corresponds to FIG. 13D.

Note that, although not shown, after a contact hole is formed in the silicon oxide film 912 including the OH group and the silicon nitride film 913 by being selectively etched using a fifth photomask, a third conductive film using the same material as a pixel electrode is formed. Then, the third conductive film is selectively etched using a sixth photomask, so that a connection wiring is formed for electrical connection with the same layers as the first wiring to the third wiring.

In a light emitting display device using a light emitting element, a pixel portion includes a plurality of TFTs, and also a contact hole for direct connection between a gate terminal of a TFT and an electrode which is source or drain of another transistor. The contact hole can be formed using the second photomask which is also used when the contact hole is formed in the gate insulating film.

Further, in a liquid crystal display device or electronic paper, a contact hole reaching a gate wiring in a terminal portion for connection with an external terminal such as an FPC can be formed using the second photo mask which is also used when the contact hole is formed in the gate insulating film.

Note that the above order of the steps is an example and there is no particular limitation on the order. For example, although one additional photomask is needed, etching may be separately performed using a photomask for etching the second conductive film and a photomask for etching part of the n+ layer and the oxide semiconductor film.

Note that in this embodiment, the contents described in each drawing can be freely combined or replaced with the contents described in any of different embodiments as appropriate.

Embodiment 2

The above embodiment shows an example of a shift register of a static circuit as a shift register in a driver circuit of a display device. In this embodiment, an example of a driver circuit including a shift register of a dynamic circuit is described.

A structure of a pulse output circuit included in a shift register of a dynamic circuit is described with reference to FIGS. 14A to 14D. A pulse output circuit 1400 shown in FIG. 14A, as an example, includes an inverter circuit 1401 in which a start pulse SP is input from an input terminal, a switch 1402 of which one of terminals is connected to an output terminal of the inverter circuit 1401, and a capacitor 1403 connected to the other terminal of the switch 1402. Note that on/off of the switch 1402 in a pulse output circuit in an odd-numbered stage is controlled by the first clock signal (CLK1). On/off of the switch 1402 in a pulse output circuit in an even-numbered stage is controlled by the second clock signal (CLK2).

Figure 14C:
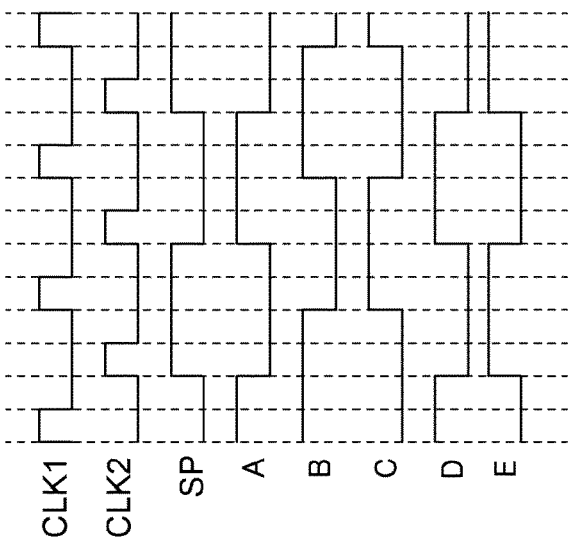
FIGS. 14A to 14D are diagrams describing Embodiment 2.
Figure 14D:
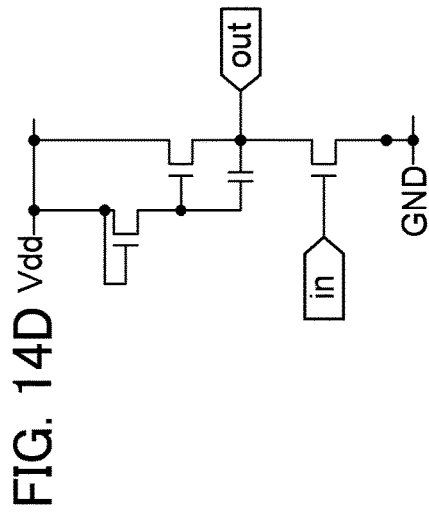
Figure 14A:
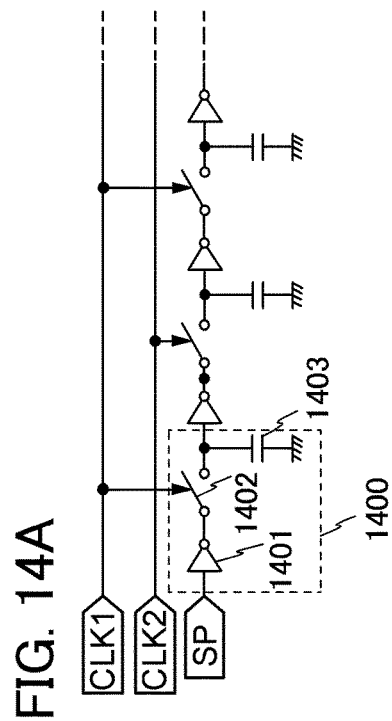
Figure 14B:
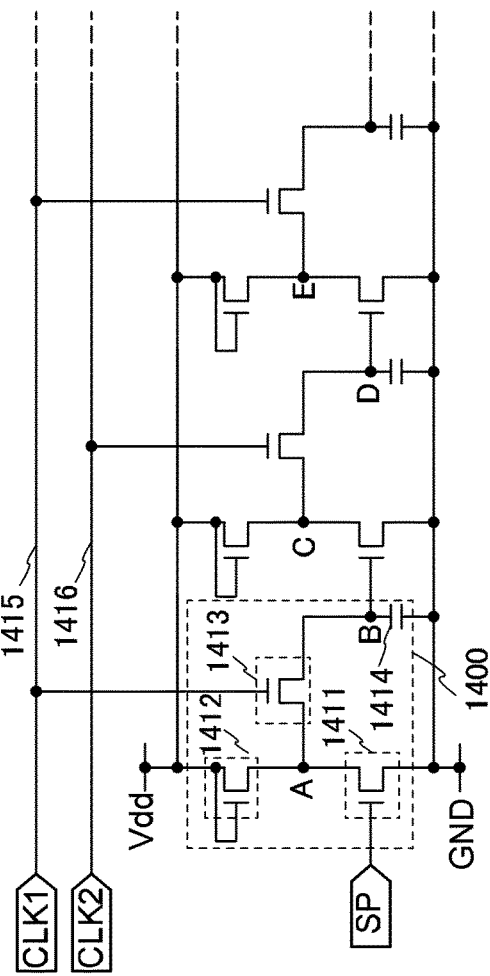

FIG. 14B shows a circuit structure of a pulse output circuit. The pulse output circuit 1400 includes a TFT 1411, a TFT 1412, a TFT 1413, and a capacitor 1414. A pulse output circuit in an odd-numbered stage is connected to a wiring 1415 for supplying a first clock signal CLK1, and a pulse output circuit in an even-numbered stage is connected to a wiring 1416 for supplying a second clock signal CLK2. In the pulse output circuit 1400, the TFT 1411 and the TFT 1412 correspond to the inverter circuit 1401 shown in FIG. 14A and form an EEMOS circuit. In addition, the TFT 1413 corresponds to the switch 1402 shown in FIG. 14A. The capacitor 1414 corresponds to the capacitor 1403 shown in FIG. 14A. Note that the TFT 1413 is preferably an enhancement transistor in the same manner as the TFT 1411 and the TFT 1412. Since off current of a transistor can be reduced by using an enhancement transistor as a switch, low power consumption and simplification of a manufacturing process can be achieved.

Here, FIG. 14C is a timing chart showing the operation of the circuit shown in FIGS. 14A and 14B. Note that in FIG. 14C, references A to E are used showing each node of the circuit in FIG. 14B for description. First, the start pulse SP is inputted to the TFT 1411, and an inverted signal of the start pulse SP is obtained from a node A in accordance with the start pulse SP. A signal of the node A transfers to a node B when the first clock signal CLK1 is in an H level, and the signal of the node A is reflected to and obtained from a node B. Then, the signal of the node B is inverted by an inverter circuit and the inverted signal of the node B is obtained from a node C. The signal of the node C is not obtained from a node D because the second clock signal CLK2 is in an L level and a switch is turned off. Next, when the first clock signal CLK1 is in an L level and the second clock signal CLK2 is in an H level, the signal of the node C transfers to the node D, the signal of the node D is reflected to and obtained from a node E. Then, the signal of the node D is inverted by an inverter circuit and the inverted signal of the node D is obtained from a node E. Then, the first clock signal CLK1 and the second clock signal CLK2 are in an H level alternately, so that the circuit shown in FIGS. 14A and 14B can function as a shift register.

Note that, in the example of the circuit structure of a pulse output circuit described with reference to FIG. 14B, a potential of the output signal may be lowered by a threshold voltage of a transistor. Therefore, the inverter circuit using a bootstrap method shown in FIG. 14D constructs a pulse output circuit, whereby it is possible to function as a shift register without lowering a potential of the signal.

Figure 15A:
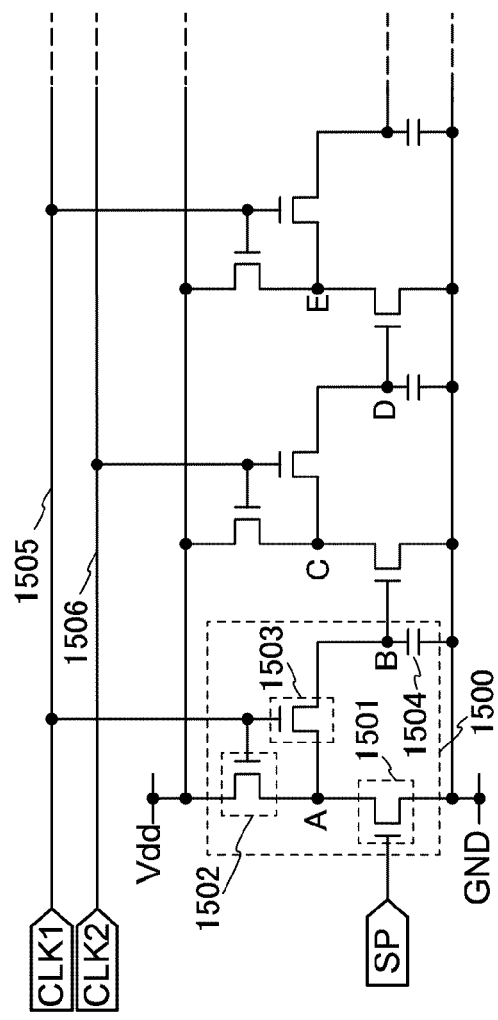
FIGS. 15A and 15B are diagrams describing Embodiment 2.

Further, a circuit structure which is different from that in FIG. 14B is shown in FIG. 15A. A pulse output circuit 1500 shown in FIG. 15A includes a TFT 1501, a TFT 1502, a TFT 1503, and a capacitor 1504. A pulse output circuit in an odd-numbered stage is connected to a wiring 1505 for supplying a first clock signal CLK1, and a pulse output circuit in an even-numbered stage is connected to a wiring 1506 for supplying a second clock signal CLK2. In the pulse output circuit 1500, the TFT 1501 and the TFT 1502 correspond to the inverter circuit 1401 shown in FIG. 14A and form an EEMOS circuit. In addition, the TFT 1503 corresponds to the switch 1402 shown in FIG. 14A. The capacitor 1504 corresponds to the capacitor 1403 shown in FIG. 14A. Note that the TFT 1503 is preferably an enhancement transistor in the same manner as the TFT 1501 and the TFT 1502. Since off current of a transistor can be reduced by using an enhancement transistor as a switch, low power consumption and simplification of a manufacturing process can be achieved.

Figure 15B:
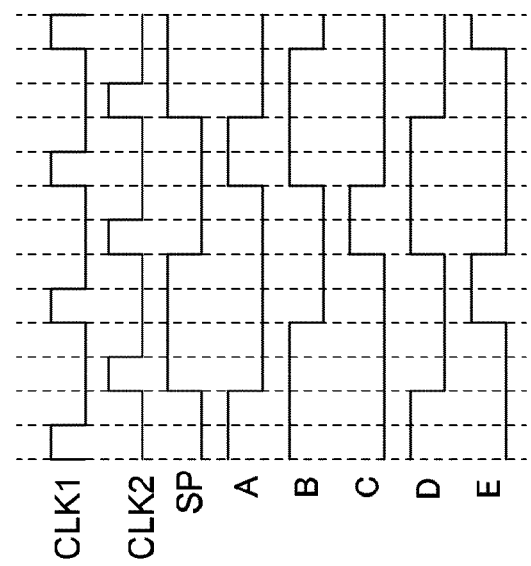
Figure 18:
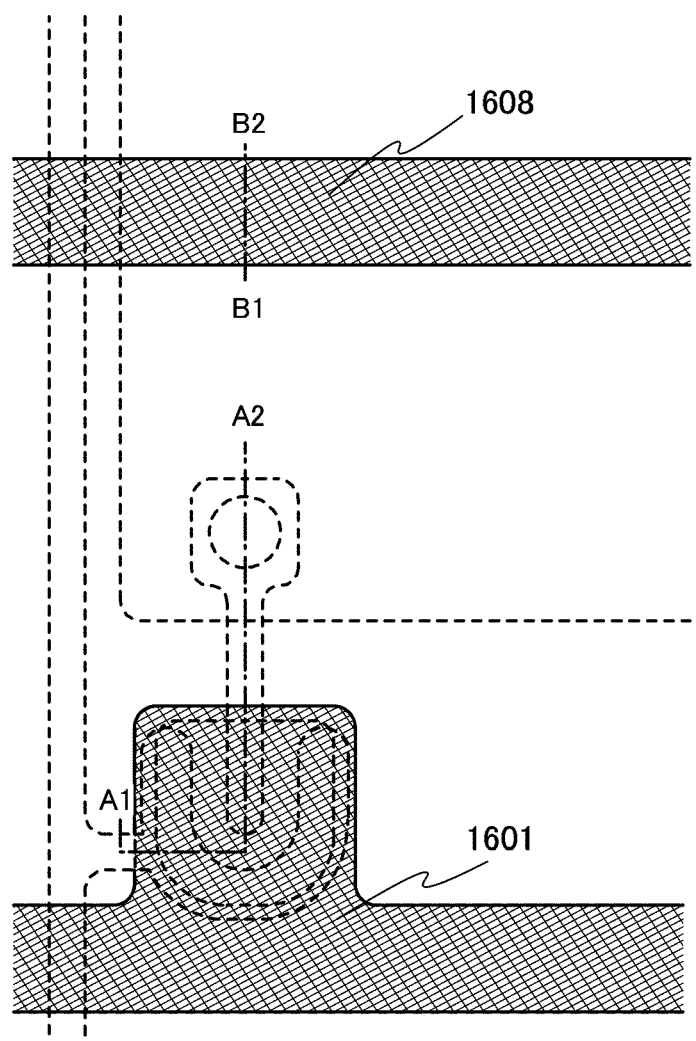
FIG. 18 is a diagram describing Embodiment 3.
Figure 19:
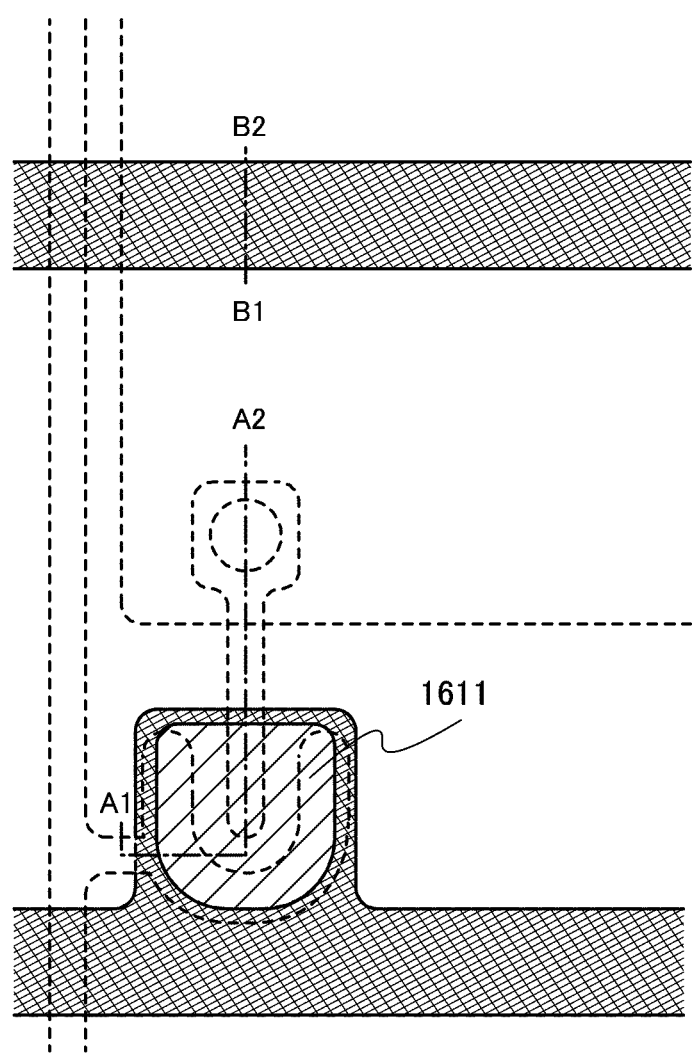
FIG. 19 is a diagram describing Embodiment 3.

The pulse output circuit shown in FIG. 15A is different from the pulse output circuit shown in FIG. 14B in that the wiring 1505 for supplying the first clock signal CLK1 is connected to a gate terminal of the TFT 1502. The pulse output circuit 1500 shown in FIG. 15A operates according to a timing chart shown in FIG. 15B. When the first clock signal CLK1 is in an H level, both a node A and a node B are in an L level if the start pulse SP is in an H level, and both a node A and a node B are in an H level if the start pulse SP is in an L level. Then, when the first clock signal CLK1 is in an L level, potential of the node B can be held. That is, on/off of the TFT 1502 is controlled by the first clock signal CLK1, so that the TFT 1502 can be controlled in synchronism with on/off of the TFT 1503. Therefore, current which flows between a wiring to which high power supply potential is supplied and a wiring to which low power supply potential is supplied in the case where each TFTs provided in an inverter circuit is in a conductive state can be reduced, so that the low power consumption can be achieved.

Note that a shift register including a pulse output circuit shown in this embodiment can be used for a source line driver circuit and a gate line driver circuit. Note that as for a signal output from a shift register, a structure in which the signal is output through a logic circuit and the like may be used to obtain a desired signal.

Note that, in an inverter circuit which is included in the dynamic circuit described in this embodiment, as in Embodiment 1, the silicon oxide film including the OH group and the silicon nitride film are formed sequentially on the first oxide semiconductor film and the second oxide semiconductor film of a TFT, so that termination of dangling bonds in these oxide semiconductor films by the OH group and prevention of decrease in resistance due to a vacancy of oxygen in the oxide semiconductor film can be achieved. As a result, it is possible to reduce a shift of the threshold voltage of a TFT and to maintain the effect of the reduction of off current due to an enhancement transistor.

In addition, as disclosed in Embodiment 1, the silicon oxide film including the OH group and the silicon nitride film are formed sequentially over the first oxide semiconductor film and the second oxide semiconductor film which form an inverter circuit of a pulse output circuit, so that a structure in which the silicon nitride film functioning as a passivation film is not directly in contact with the oxide semiconductor film can be used. That is, decrease in resistance caused by nitridation of the oxide semiconductor film by nitrogen in the silicon nitride film can be suppressed. Further, a silicon oxide film including the OH group is interposed between the silicon nitride film and the oxide semiconductor film, so that the stress caused by formation of the silicon nitride film can be relieved and hydrogenation (or deoxidation) of the oxide semiconductor caused by application of the stress on the oxide semiconductor can be reduced. Further, since a TFT in which an oxide semiconductor film is used for a channel formation region has better electrical characteristics, such as mobility, than a TFT in which amorphous silicon is used for a channel formation region, the area occupied by TFTs in the circuit can be reduced without degradation of performance.

Note that in this embodiment, the contents described in each drawing can be freely combined or replaced with the contents described in any of different embodiments as appropriate.

Embodiment 3

In this embodiment, a manufacturing process of a display device including a driver circuit is described with reference to FIGS. 16A to 16C, FIGS. 17A to 17C, FIG. 18, FIG. 19, FIG. 20, FIG. 21, FIGS. 22A to 22D, and FIG. 23.

In FIG. 16A, for a light-transmitting substrate 1600, a glass substrate of barium borosilicate glass, aluminoborosilicate glass, or the like can be used.

Next, after a conductive layer is formed over the entire surface of the substrate 1600, a first photolithography step is performed to form a resist mask, and an unnecessary portion is removed by etching, whereby wirings and an electrode (a gate wiring including a gate electrode layer 1601 of a pixel TFT portion, a capacitor wiring 1608 of a capacitor portion, and a first terminal 1621 of a terminal portion) are formed. At this time, the etching is performed so that at least an end portion of the gate electrode layer 1601 is tapered. A cross-sectional view of this step is shown in FIG. 16A. Note that a top view at this stage corresponds to FIG. 18.

The gate wiring including the gate electrode layer 1601, the capacitor wiring 1608, and the first terminal 1621 of the terminal portion are desirably formed from a low-resistance conductive material such as aluminum (Al) or copper (Cu). Since aluminum itself has disadvantages such as low heat resistance and a tendency to be corroded, it is used in combination with a conductive material having heat resistance. As a conductive material having a heat resistance, an element selected from titanium (Ti), tantalum (Ta), tungsten (W), molybdenum (Mo), chromium (Cr), neodymium (Nd), and scandium (Sc), an alloy containing any of these elements, an alloy film including a combination of these elements, or a nitride containing any of these elements is used.

Next, a gate insulating layer 1602 is formed over the entire surface of the gate electrode layer 1601. The gate insulating layer 1602 is formed by a sputtering method or the like to have a film thickness of 50 nm to 250 nm.

For example, as the gate insulating layer 1602, a silicon oxide film is formed by a sputtering method to have a thickness of 100 nm Needless to say, the gate insulating layer 1602 is not necessarily formed using such as a silicon oxide film and may be formed to have a single-layer structure or a stacked-layer structure using another insulating film: a silicon oxynitride film, a silicon nitride film, an aluminum oxide film, a tantalum oxide film, and the like.

Note that, before the oxide semiconductor film is formed, it is preferable to remove dust attached to a surface of the gate insulating layer 1602 by reverse sputtering which generates plasma by introducing an argon gas. Note that nitrogen, helium, or the like may be used instead of argon for the atmosphere. Further, an argon atmosphere to which oxygen, hydrogen, $N_2O$, or the like is added may be used. Moreover, an argon atmosphere to which $Cl_2$, $CF_4$, or the like is added may be used.

Next, a first oxide semiconductor film (in this embodiment, a first In—Ga—Zn—O-based non-single-crystal film) is formed over the gate insulating layer 1602. It is useful to form the first In—Ga—Zn—O-based non-single-crystal film without exposure to the air after the plasma treatment in the point that dust and moisture are not attached to an interface between the gate insulating layer 1602 and the first oxide semiconductor film. Here, the first In—Ga—Zn—O-based non-single-crystal film is formed in an argon or oxygen atmosphere using an oxide semiconductor target having a diameter of 8 inches and containing In, Ga, and Zn (the ratio of $In_2O_3$ to $Ga_2O_3$ and ZnO is 1:1:1), with the distance between the substrate and the target set to 170 mm, under a pressure of 0.4 Pa, and with a direct-current (DC) power source of 0.5 kW. Note that a pulse direct current (DC) power supply is preferably used because dust can be reduced and film thickness distribution can be uniformed. The thickness of the first In—Ga—Zn—O-based non-single-crystal film is 5 nm to 200 nm In this embodiment, the thickness of the first In—Ga—Zn—O-based non-single-crystal film is 100 nm.

Next, without exposing to the air, a second oxide semiconductor film (in this embodiment, a second In—Ga—Zn—O-based non-single-crystal film) is formed by a sputtering method. Here, with the use of a target of $In_2O_3$, $Ga_2O_3$, and ZnO=1:1:1, deposition by a sputtering method is performed at a pressure of 0.4 Pa, a power of 500 W, a temperature of room temperature, and an argon gas flow rate of 40 sccm. Although the target of $In_2O_3:Ga_2O_3:ZnO$=1:1:1 is used intentionally, an In—Ga—Zn—O-based non-single-crystal film including crystal grains with a size of 1 nm to 10 nm may be formed immediately after the film is formed. Note that it can be said that the presence or absence of crystal grains or the density of crystal grains can be adjusted and the diameter size can be adjusted within the range of 1 to 10 nm by appropriate adjustment of the composition ratio in the target, the film deposition pressure (0.1 to 2.0 Pa), the power (250 to 3000 W: 8 inches φ), the temperature (room temperature to 100° C.), the reactive sputtering deposition conditions, or the like. The thickness of the second In—Ga—Zn—O-based non-single-crystal film is 5 nm to 20 nm. Needless to say, in the case where a film includes crystal grains, the size of the crystal grain does not exceed the film thickness. In this embodiment, the thickness of the second In—Ga—Zn—O-based non-single-crystal film is 5 nm.

The first In—Ga—Zn—O-based non-single-crystal film and the second In—Ga—Zn—O-based non-single-crystal film are formed under different conditions. For example, the first In—Ga—Zn—O-based non-single-crystal film is formed under conditions where the ratio of an oxygen gas flow rate to an argon gas flow rate is higher than the ratio of an oxygen gas flow rate to an argon gas flow rate under the deposition conditions for the second In—Ga—Zn—O-based non-single-crystal film. Specifically, the second In—Ga—Zn—O-based non-single-crystal film is formed in a rare gas (e.g., argon or helium) atmosphere (or in an atmosphere, less than or equal to 10% of which is an oxygen gas and greater than or equal to 90% of which is an argon gas), and the first In—Ga—Zn—O-based non-single-crystal film is formed in an oxygen atmosphere.

A chamber used for deposition of the second In—Ga—Zn—O-based non-single-crystal film may be the same or different from the chamber in which the reverse sputtering has been performed.

Examples of a sputtering method include an RF sputtering method in which a high-frequency power source is used for a sputtering power source, a DC sputtering method, and a pulsed DC sputtering method in which a bias is applied in a pulsed manner. An RF sputtering method is mainly used in the case of forming an insulating film, and a DC sputtering method is mainly used in the case of forming a metal film.

In addition, there is also a multi-source sputtering apparatus in which a plurality of targets of different materials can be set. With the multi-source sputtering apparatus, films of different materials can be deposited to be stacked in the same chamber, or a plurality of kinds of materials can be deposited by electric discharge at the same time in the same chamber.

In addition, there are a sputtering apparatus provided with a magnet system inside the chamber and used for a magnetron sputtering method, or a sputtering apparatus used for an ECR sputtering method in which plasma generated with the use of microwaves is used without using glow discharge.

In addition, as a formation method using a sputtering method, there are also a reactive sputtering method in which a target substance and a sputtering gas component are chemically reacted with each other during deposition to form a thin compound film thereof, and a bias sputtering method in which voltage is also applied to a substrate during deposition.

Next, a second photolithography step is performed to form a resist mask and the first In—Ga—Zn—O-based non-single-crystal film and the second In—Ga—Zn—O-based non-single-crystal film are etched. Here, an unnecessary portion is removed by wet etching using ITO-07N (by KANTO CHEMICAL Co., INC.) to form an oxide semiconductor film 1609 which is the first In—Ga—Zn—O-based non-single-crystal film and an oxide semiconductor film 1611 which is the second In—Ga—Zn—O-based non-single-crystal film. Note that, etching performed here is not limited to wet etching, and dry etching may be employed. A cross-sectional view at this stage is shown in FIG. 16B. Note that a top view at this stage corresponds to FIG. 19.

Next, a third photolithography step is performed to form a resist mask, and an unnecessary portion is removed by etching, whereby a contact hole which reaches the wiring or the electrode layer which is formed of the same material as the gate electrode layer is formed. The contact hole is formed in order to be directly connected to a conductive film which is formed later. For example, a contact hole is formed when a TFT whose gate electrode layer is in direct contact with the source or drain electrode layer in the driver circuit portion, or when a terminal that is electrically connected to a gate wiring of the terminal portion is formed.

Next, a conductive film 1632 is formed from a metal material by a sputtering method or a vacuum evaporation method over the oxide semiconductor film 1609 and the oxide semiconductor film 1611. A cross-sectional view at this stage is shown in FIG. 16C.

As for a material of the conductive film 1632, an element selected from Al, Cr, Ta, Ti, Mo, and W, an alloy containing any of these elements, an alloy film including a combination of these elements, or the like can be given. Further, when heat treatment is performed at 200° C. to 600° C., the conductive film preferably has heat resistance enough to resist the heat treatment. Since aluminum itself has disadvantages such as low heat resistance and a tendency to be corroded, it is used in combination with a conductive material having heat resistance. As a heat-resistant conductive material, an element selected from titanium (Ti), tantalum (Ta), tungsten (W), molybdenum (Mo), chromium (Cr), neodymium (Nd), and scandium (Sc), an alloy containing any of these elements, an alloy film including a combination of these elements, or a nitride containing any of these elements is used.

Here, the conductive film 1632 is formed to have a single-layer structure of a titanium film. Alternatively, the conductive film 1632 may be formed to have a two-layer structure in which a titanium film is stacked over an aluminum film. Further, alternatively, the conductive film 1632 may be formed to have a three-layer structure of a titanium film, an aluminum film including Nd (an Al—Nd film) which is stacked on the titanium film, and a titanium film stacked thereon. The conductive film 1632 may have a single-layer structure of an aluminum film including silicon.

Next, a fourth photolithography step is performed to form resist mask 1631 and an unnecessary portion is removed by etching, whereby a source or drain electrode layers 1605a and 1605b, n$^+$ layers 1604a and 1604b functioning as a source region or a drain region, and a connection electrode 1620 are formed. Wet etching or dry etching is used as an etching method at this time. For example, when an aluminum film or an aluminum alloy film is used for the conductive film 1632, wet etching using a mixed solution of phosphoric acid, acetic acid, and nitric acid can be performed. Here, by wet etching using an ammonia hydrogen peroxide mixture (hydrogen peroxide:ammonia:water=5:2:2), the source or drain electrode layers 1605a and 1605b are formed by etching the conductive film 1632 of a titanium film, and the n$^+$ layers 1604a and 1604b are formed by etching the oxide semiconductor film 1611. In the etching process, a part of an exposed region of the oxide semiconductor film 1609 is etched, whereby a semiconductor layer 1603 is formed. Therefore, a channel formation region of the semiconductor layer 1603 between the n$^+$ layers 1604a and 1604b has a small film thickness. In FIG. 17A, the source or drain electrode layers 1605a and 1605b, and the n$^+$ layers 1604a and 1604b are etched with an ammonia hydrogen peroxide mixture as an etchant at one time, so that end portions of the source or drain electrode layers 1605a and 1605b, and the n$^+$ layers 1604a and 1604b are aligned with each other; thus, a continuous structure is formed. In addition, since wet etching is used, the etching is performed isotropically whereby the end portions of the source or drain electrode layers 1605a and 1605b are recessed from the resist mask 1631. Through the above steps, a TFT 1670 in which the semiconductor layer 1603 serves as a channel formation region can be manufactured. A cross-sectional view at this stage is shown in FIG. 17A. Note that a top view at this stage corresponds to FIG. 20.

Next, heat treatment is preferably performed at 200° C. to 600° C., typically at 300° C. to 500° C. Here, heat treatment is performed at 350° C. in a nitrogen atmosphere for an hour in a furnace. By the heat treatment, rearrangement at the atomic level occurs in the In—Ga—Zn—O-based non-single-crystal film. Since a distortion which inhibits carrier transfer is released by the heat treatment, the heat treatment (including photo-annealing) performed here is important. Note that the timing of heat treatment is not particularly limited as long as it is performed after the second In—Ga—Zn—O-based non-single-crystal film is formed, and for example, heat treatment may be performed after a pixel electrode is formed.

Further, oxygen radical treatment may be performed on the channel formation region of the semiconductor layer 1603 which is exposed. By performing oxygen radical treatment, a TFT can be normally off. Furthermore, the semiconductor layer 1603 damaged by etching can be repaired by performing radical treatment. The radical treatment is preferably performed in an $O_2$ or $N_2O$ atmosphere, preferably an $N_2$, He, or Ar atmosphere containing oxygen. In addition, the radical treatment may be performed in an atmosphere to which $Cl_2$ or $CF_4$ is added to the above atmosphere. Note that the radical treatment is preferably performed with non-bias applied.

In addition, in the fourth photolithography step, a second terminal 1622 which is formed of the same material as the source or drain electrode layers 1605a and 1605b is left in the terminal portion. Note that the second terminal 1622 is electrically connected to a source wiring (a source wiring including the source or drain electrode layers 1605a and 1605b).

Further, in the terminal portion, the connection electrode 1620 is directly connected to the first terminal 1621 in the terminal portion through the contact hole formed in the gate insulating film. Note that, although not shown here, in the thin film transistor in the driver circuit, a source wiring or a drain wiring is directly connected to the gate electrode through the same process as the abovementioned process.

In addition, when a resist mask with regions of plural thicknesses (typically, two kinds of thicknesses) which is formed by a multi-tone mask is used, the number of resist masks can be reduced, which results in simplification of the process and reduction of cost.

Next, the resist mask 1631 is removed and a silicon oxide film 1607a including an OH group which covers the TFT 1670 is formed. The silicon oxide film 1607a including the OH group is formed by a CVD method using an organosilane gas. For organosilane, a compound containing silicon, such as tetraethoxysilane (TEOS) (chemical formula: $Si(OC_2H_5)_4$), tetramethylsilane (TMS) (chemical formula: $Si(CH_3)_4$), tetramethylcyclotetrasiloxane (TMCTS), octamethylcyclotetrasiloxane (OMCTS), hexamethyldisilazane (HMDS), triethoxysilane (chemical formula: $SiH(OC_2H_5)_3$), or tris(dimethylamino)silane (chemical formula: $SiH(N(CH_3)_2)_3$) can be used. Over the silicon oxide film 1607a including the OH group, a silicon nitride film 1607b is formed. By the silicon oxide film 1607a including the OH group and the silicon nitride film 1607b, a structure in which a silicon nitride film functioning as a passivation film is not directly in contact with an oxide semiconductor film can be employed. That is, decrease in resistance caused by nitridation of the oxide semiconductor film by nitrogen in the silicon nitride film can be suppressed. Further, a silicon oxide film including the OH group is interposed between the silicon nitride film and the oxide semiconductor film, so that the stress caused by formation of the silicon nitride film can be relieved and hydrogenation (or deoxidation) of the oxide semiconductor caused by application of the stress on the oxide semiconductor can be reduced. As a result, it is possible to reduce a shift of the threshold voltage of a TFT and to maintain the effect of the reduction of off current caused by an enhancement transistor.

Next, a fifth photolithography step is performed to form a resist mask, and the silicon oxide film 1607a including the OH group and the silicon nitride film 1607b (hereinafter, the silicon oxide film 1607a including the OH group and the silicon nitride film 1607b are collectively referred to as protective insulating films) are etched, whereby a contact hole 1625 which reaches the source or drain electrode layer 1605b is formed. Further, a contact hole 1627 which reaches the second terminal 1622 and a contact hole 1626 which reaches the connection electrode 1620 are formed by the etching here. A cross-sectional view at this stage is shown in FIG. 17B.

Next, after removing the resist mask, a transparent conductive film is formed. The transparent conductive film is formed using indium oxide ($In_2O_3$), an alloy of indium oxide and tin oxide ($In_2O_3$—$SnO_2$, hereinafter referred to as ITO), or the like by a sputtering method, a vacuum evaporation method, or the like. The etching treatment of such materials is performed using a hydrochloric acid based solution. However, since etching of ITO especially tends to leave residue, an alloy of indium oxide and zinc oxide ($In_2O_3$—ZnO) may be used in order to improve etching processability.

Next, a sixth photolithography step is performed to form a resist mask, and an unnecessary part is removed by etching, whereby a pixel electrode layer 1610 is formed.

In addition, in the sixth photolithography step, a storage capacitor is formed of the capacitor wiring 1608 and the pixel electrode layer 1610 by using the gate insulating layer 1602, the silicon oxide film 1607a including the OH group, and the silicon nitride film 1607b as a dielectric body.

In addition, in the sixth photolithography step, transparent conductive films 1628 and 1629 are left, which are formed in the terminal portion, by covering the first terminal and the second terminal with the resist mask. The transparent conductive films 1628 and 1629 serves as an electrode or a wiring connected to FPC. The transparent conductive film 1628 formed over the connection electrode 1620 which is directly connected to the first terminal 1621 serves as a connecting terminal electrode which functions as an input terminal of the gate wiring. The transparent conductive film 1629 formed over the second terminal 1622 serve as a connecting terminal electrode which functions as an input terminal of the source wiring.

Next, the resist mask is removed. A cross-sectional view at this stage is shown in FIG. 17C. Note that a top view at this stage corresponds to FIG. 21.

Figure 22A:
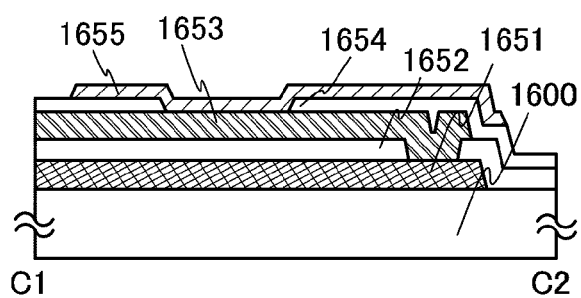
FIGS. 22A to 22D are diagrams each describing Embodiment 3.
Figure 22B:
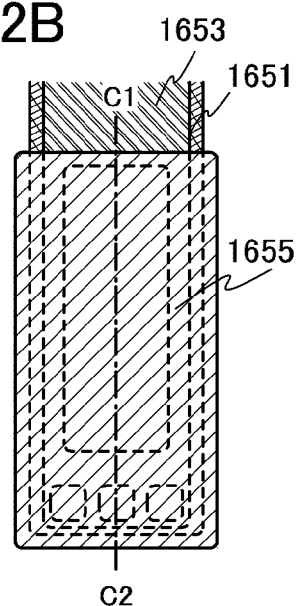

In addition, FIGS. 22A and 22B are respectively a top view and a cross-sectional view of a terminal portion in which a gate wiring is provided at this stage. FIG. 22A corresponds to a cross-sectional view taken along a line C1-C2 in FIG. 22B. In FIG. 22A, a transparent conductive film 1655 formed over a protective insulating film 1654 is a connecting terminal electrode which functions as an input terminal. Further, in FIG. 22A, in the terminal portion, a first terminal 1651 formed of the same material as the gate wiring and a connection electrode 1653 formed of the same material as a source wiring are overlapped with each other with a gate insulating layer 1652 interposed therebetween so that the first terminal 1651 and the connection electrode 1653 are in direct contact with each other through a contact hole provided in the gate insulating layer 1652 to form conduction therebetween. In addition, the connection electrode 1653 and the transparent conductive film 1655 are in direct contact with each other through a contact hole provided in the protective insulating film 1654 to form conduction therebetween.

Figure 22C:
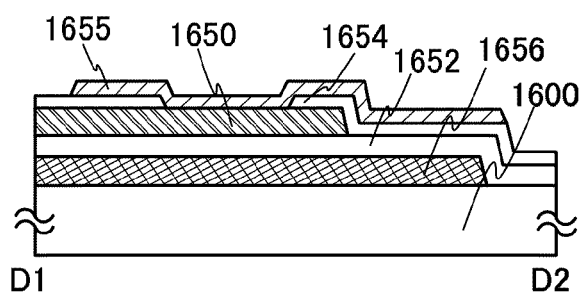
Figure 22D:
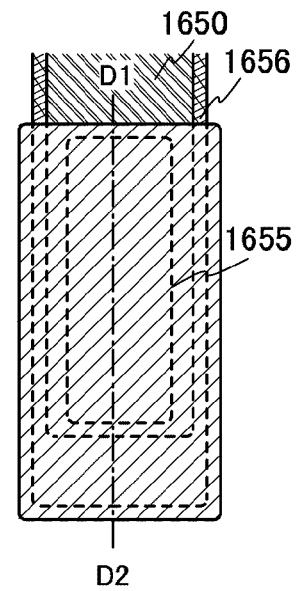

In addition, FIGS. 22C and 22D are respectively a top view and a cross-sectional view of a terminal portion in which a source wring is provided. FIG. 22C corresponds to a cross-sectional view taken along a line D1-D2 in FIG. 22D. In FIG. 22C, the transparent conductive film 1655 formed over the protective insulating film 1654 is a connecting terminal electrode which functions as an input terminal. Further, in FIG. 22C, in the terminal portion, an electrode 1656 formed of the same material as the gate wiring is located below and overlapped with a second terminal 1650 which is electrically connected to the source wiring with the gate insulating layer 1652 interposed therebetween. The electrode 1656 is not electrically connected to the second terminal 1650, and a capacitor for preventing noise or static electricity can be formed if the potential of the electrode 1656 is set to a potential different from that of the second terminal 1650, such as floating, GND, or 0 V. The second terminal 1650 is electrically connected to the transparent conductive film 1655 through a contact hole formed in the protective insulating film 1654.

A plurality of gate wirings, source wirings, and capacitor wirings are provided in accordance with the pixel density. Also in the terminal portion, the first terminal at the same potential as the gate wiring, the second terminal at the same potential as the source wiring, the third terminal at the same potential as the capacitor wiring, and the like are each arranged in plurality. The number of each terminal is in an appropriate and the number of terminals to be provided can be decided in appropriate by practitioners.

Through these six photolithography steps with six photomasks, the pixel TFT portion including a TFT 1670 which is a bottom gate n-channel TFT, and the capacitor portion including a storage capacitor can be completed. By arranging these pixel TFT portion and storage capacitor in matrix corresponding to respective pixels, a pixel portion is formed, which results in forming one substrate for manufacturing an active matrix display device. In this specification, such a substrate is referred to as an active matrix substrate for convenience.

In the case where an active matrix liquid crystal display device is manufactured, a liquid crystal layer is provided between an active matrix substrate and a counter substrate which is provided with a counter electrode, and the active matrix substrate and the counter substrate are fixed to each other. Note that a common electrode which is electrically connected to the counter electrode provided over the counter substrate is provided over the active matrix substrate. A fourth terminal which is electrically connected to the common electrode is provided in the terminal portion. The fourth terminal is a terminal for setting the common electrode at a fixed potential such as GND or 0 V.

Figure 20:
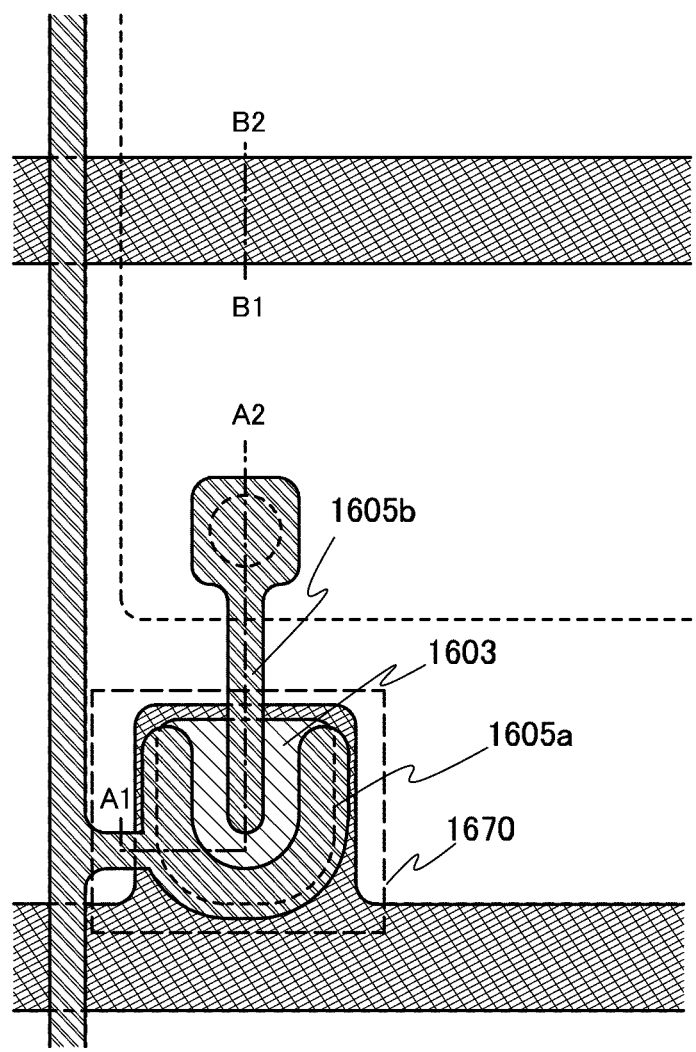
FIG. 20 is a diagram describing Embodiment 3.
Figure 21:
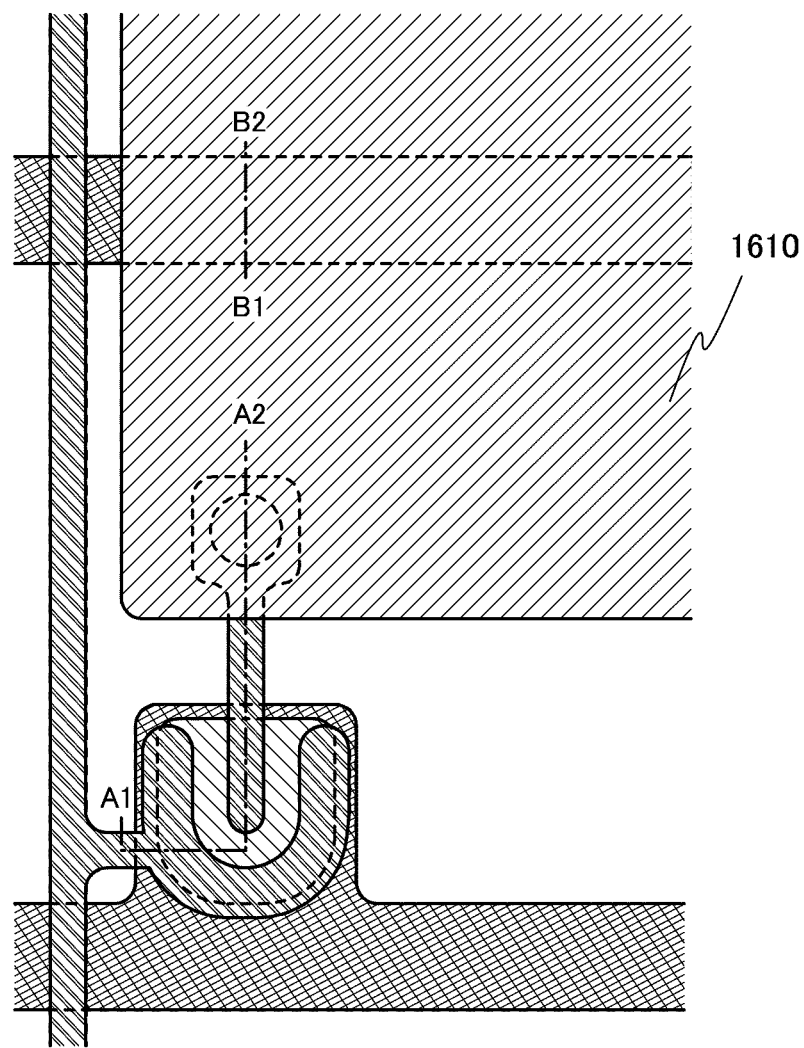
FIG. 21 is a diagram describing Embodiment 3.
Figure 23:
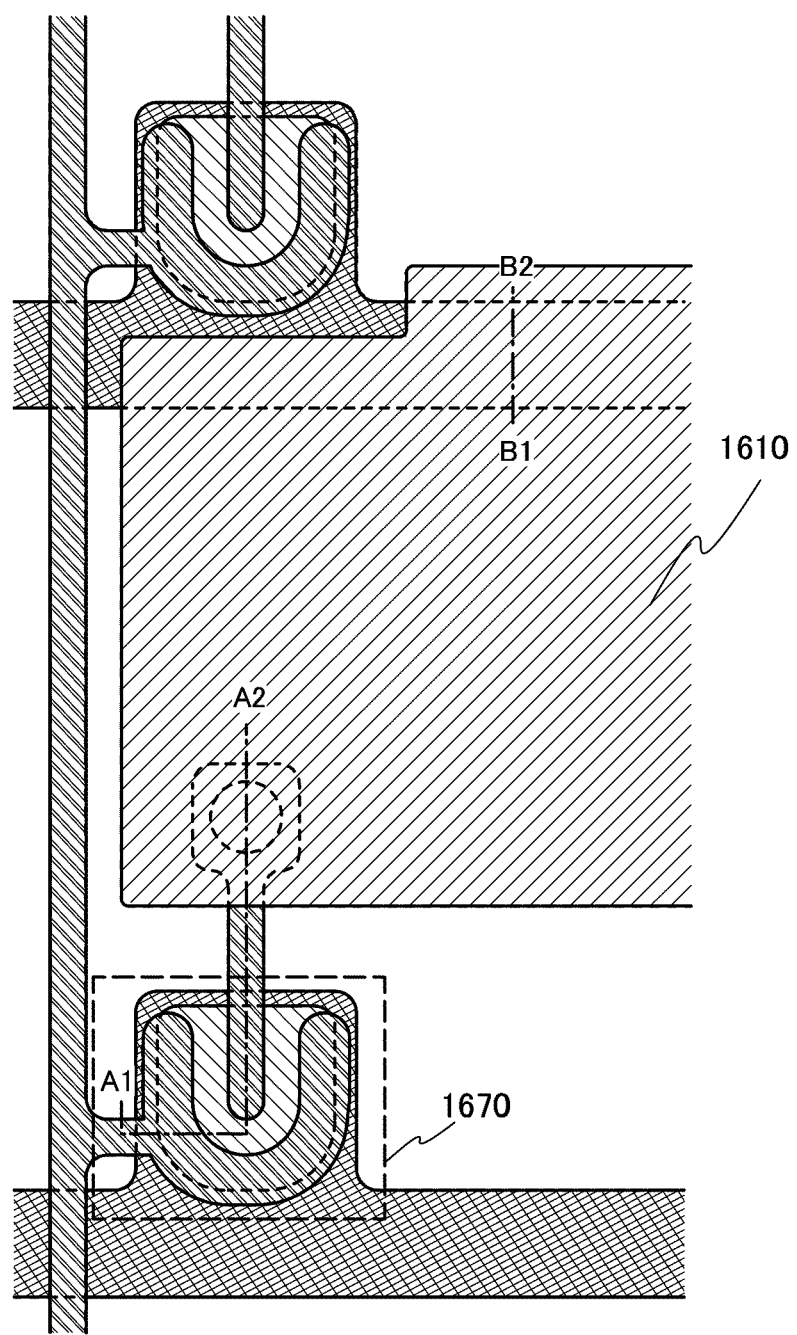
FIG. 23 is a diagram describing Embodiment 3.

Further, an embodiment of the present invention is not limited to the pixel structure in FIG. 21, and an example of a top view which is different from FIG. 21 is shown in FIG. 23. FIG. 23 shows an example in which a capacitor wiring is not provided and a pixel electrode overlaps with a gate wiring of an adjacent pixel with a protective insulating film and a gate insulating layer interposed therebetween to form a storage capacitor. In that case, the capacitor wiring and the third terminal connected to the capacitor wiring can be omitted. Note that, in FIG. 23, portions similar to those in FIG. 20 are denoted by the same reference numerals.

In the active matrix liquid crystal display device, a display pattern is formed on the screen by driving using pixel electrodes arranged in matrix. In specific, voltage is applied between a selected pixel electrode and a counter electrode corresponding to the pixel electrode, whereby optical modulation of a liquid crystal layer which is arranged between the pixel electrode and the counter electrode is performed. This optical modulation is recognized as a display pattern by an observer.

In displaying moving images, a liquid crystal display device has a problem that a long response time of liquid crystal molecules themselves causes afterimages or blurring of moving images. In order to improve the moving image characteristics of a liquid crystal display device, a driving method called black insertion is employed in which black is displayed on the whole screen every other frame period.

Further, there is another driving technique which is so-called double-frame rate driving. In the double-frame rate driving, a vertical synchronizing frequency is set 1.5 times or more or 2 times or more, whereby moving image characteristics are improved.

In addition, in order to improve the moving image characteristics of a liquid crystal display device, there is also a following driving technique: a surface light source is formed using a plurality of LED (light emitting diode) light sources or a plurality of EL light sources as a backlight and each light source forming the surface light source is individually driven in a pulsed manner in a frame period. As the surface light source, three or more kinds of LEDs may be used, or an LED emitting white light may be used. Since a plurality of LEDs can be individually controlled, the timing at which the LEDs emit light can be synchronized with the timing at which optical modulation of a liquid crystal layer is performed. When the driving technique is used, LEDs can be partly turned off, which results in an advantageous effect of reduction of power consumption, particularly in the case of displaying an image in which the proportion of a black image area in one screen is high.

When these driving techniques are combined, the display characteristics of the liquid crystal display device, such as characteristics of moving images, can be improved as compared to those of conventional liquid crystal display devices.

An n-channel transistor forming a pixel of display device obtained in this embodiment includes an In—Ga—Zn—O-based non-single-crystal film in a channel formation region and has excellent dynamic characteristics, in a similar manner to a transistor in an inverter circuit which forms a gate line driver circuit or a source line driver circuit, and can be combined with the above-described driving techniques. In addition, as described in the above embodiment, a silicon oxide film including an OH group and a silicon nitride film are sequentially formed on an oxide semiconductor film, so that termination of dangling bonds in the oxide semiconductor film by the OH group and prevention of decrease in resistance due to a vacancy of oxygen in the oxide semiconductor film can be achieved. As a result, it is possible to reduce a shift of the threshold voltage of a TFT and to maintain the effect of the reduction of off current caused by an enhancement transistor. Further, since a TFT in which an oxide semiconductor film is used for a channel formation region has better electrical characteristics, such as mobility, than a TFT in which amorphous silicon is used for a channel formation region, the area occupied by TFTs in the area can be reduced without degradation of performance.

In addition, in the case where a light emitting display device is manufactured, since one electrode (also referred to as a cathode) of an organic light emitting element is set to low power supply potential such as GND or 0V, a fifth terminal for setting the cathode to low power supply potential such as GND or 0V is provided in the terminal portion. Further, in the case where a light emitting display device is manufactured, a power supply line is provided in addition to a source wiring and a gate wiring. Accordingly, a sixth terminal which is electrically connected to the power supply line is provided in the terminal portion.

Note that in this embodiment, the contents described in each drawing can be freely combined or replaced with the contents described in any of different embodiments as appropriate.

Embodiment 4

In this embodiment, an example of a light emitting display device is shown. Here, as a display element included in a display device, a light emitting element using electroluminescence is described. The light emitting element using electroluminescence is generally distinguished by whether a light emitting material is an organic compound or an inorganic compound. Generally, the former is referred to as an organic EL element, and the latter is referred to as an inorganic EL element.

In an organic EL element, by application of voltage to a light emitting element, electrons and holes are separately injected from a pair of electrodes into a layer containing a light emitting organic compound, and thus current flows. Then, by recombination of these carriers (electrons and holes), the light emitting organic compound becomes in an excited state, and light is emitted when the excited state returns to a ground state. Because of such a mechanism, such a light emitting element is referred to as a current-excitation light emitting element.

An inorganic EL element is classified into a dispersion-type inorganic EL element and a thin-film-type inorganic EL element, depending on its element structure. The dispersion-type inorganic EL element has a light emitting layer in which particles of a light emitting material is dispersed in a binder. Its light emission mechanism is donor-acceptor recombination type light emission using a donor level and an acceptor level. The thin-film-type inorganic EL element has a structure in which a light emitting layer is interposed between dielectric layers, and the light emitting layer interposed between the dielectric layers is further interposed between electrodes. Its light emission mechanism is localized type light emission in which inner shell electron transition in a metal ion is utilized. Note that description is made here using an organic EL element as a light emitting element.

Figure 24:
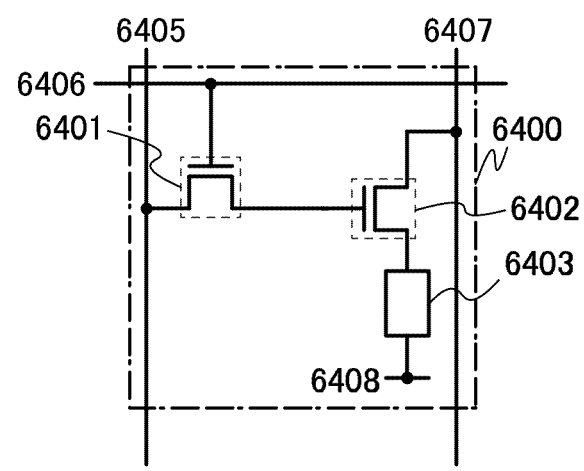
FIG. 24 is a diagram describing Embodiment 4.

FIG. 24 shows an example of a pixel structure.

Description is made on applicable structure and operation of a pixel. Here, an example of using an n-channel TFT in which an oxide semiconductor film (an In—Ga—Zn—O-based non-single-crystal film) is used for a channel formation region is shown.

A pixel 6400 in FIG. 24 includes a TFT 6401, a TFT 6402, and a light emitting element 6403. A gate terminal of the TFT 6401 is connected to a gate line 6406, a first terminal of the TFT 6401 is connected to a source line 6405, and a second terminal of the TFT 6401 is connected to a gate terminal of the TFT 6402. A first terminal of the TFT 6402 is connected to a power supply line 6407, and a second terminal of the TFT 6402 is connected to a first electrode (a pixel electrode) of the light emitting element 6403. A second electrode of the light emitting element 6403 corresponds to a common electrode 6408. The common electrode 6408 is electrically connected to a common potential line formed over the same substrate.

Note that the second electrode of the light emitting element 6403 (the common electrode 6408) is set to a low power supply potential. Note that a low power supply potential is a potential satisfying the low power supply potential<a high power supply potential based on the high power supply potential set to the power supply line 6407. As the low power supply potential, GND, 0 V, or the like may be employed. Each potential is adjusted such that a potential difference between the high power source potential and the low power source potential is higher than or equal to a forward threshold voltage of the light emitting element 6403, because the potential difference between the high power source potential and the low power source potential is applied to the light emitting element 6403 so that current flows in the light emitting element 6403 to emit light.

Next, a structure of a light emitting element will be described with reference to FIGS. 25A to 25C. TFTs 7001, 7011, and 7021 in FIGS. 25A to 25C can be manufactured similarly to the TFT shown in the above embodiment, and are highly reliable TFTs each including an In—Ga—Zn—O-based non-single-crystal film as a semiconductor layer.

In order to extract light, at least one of an anode and a cathode of the light emitting element need to be transparent. Then, a TFT and the light emitting element are formed over a substrate. There are light emitting elements having a top emission structure in which light emission is extracted through the surface on the side opposite to the substrate side, having a bottom emission structure in which light emission is extracted through the surface on the substrate side, and having a dual emission structure in which light emission is extracted through the surface on the side opposite to the substrate side and the surface on the substrate side. The pixel structure described with reference to FIG. 24 can be applied to a light emitting element having any of the emission structures.

A light emitting element having a top emission structure is described with reference to FIG. 25A.

Figure 25A:
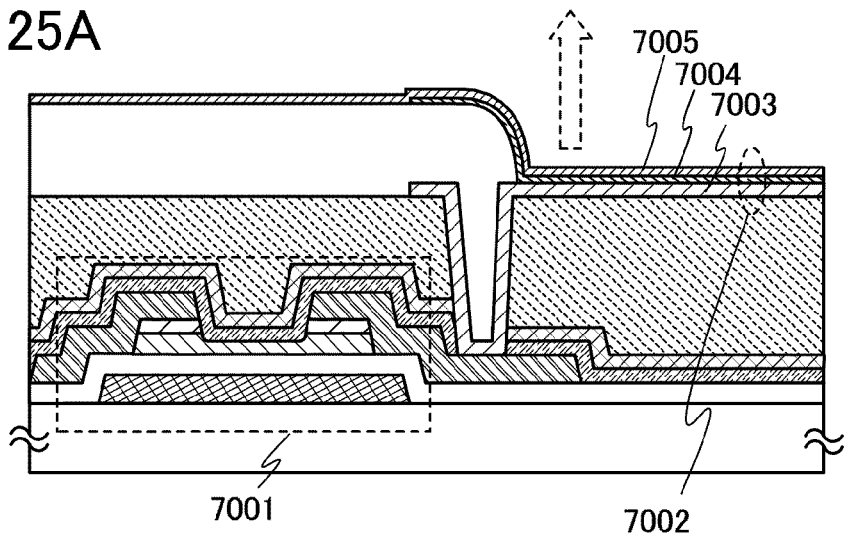
FIGS. 25A to 25C are diagrams describing Embodiment 4.
Figure 25B:
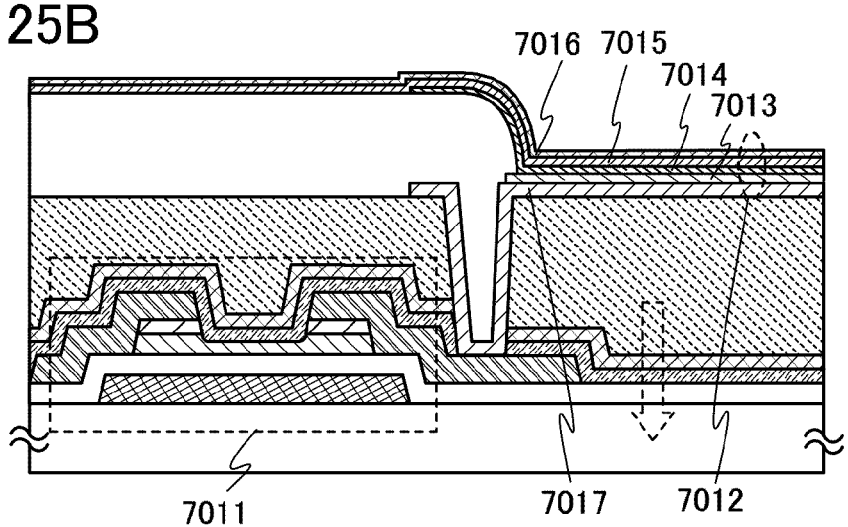

FIG. 25A shows a cross-sectional view of a pixel in the case where the TFT 7001 is an n-type TFT and light which is emitted from a light emitting element 7002 is emitted to an anode 7005 side (passes through the anode 7005). In FIG. 25A, a cathode 7003 of the light emitting element 7002 is electrically connected to the TFT 7001. A light emitting layer 7004 and the anode 7005 are stacked in this order over the cathode 7003. The cathode 7003 can be formed using any of a variety of conductive materials as long as it has a low work function and reflects light. For example, Ca, Al, CaF, MgAg, AlLi, or the like is desirable. Then, the light emitting layer 7004 may be using either a single layer or a stacked layer of a plurality of layers. When the light emitting layer 7004 is formed using a plurality of layers, the light emitting layer 7004 is formed by stacking an electron-injecting layer, an electron-transporting layer, a light emitting layer, a hole-transporting layer, and a hole-injecting layer in this order over the cathode 7003. Note that it is not necessary to form all of these layers. The anode 7005 is formed using a light-transmitting conductive material. As the light-transmitting conductive film, a light-transmitting conductive material such as indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, or indium tin oxide to which silicon oxide is added may be used.

A region where the cathode 7003 and the anode 7005 sandwich the light emitting layer 7004 corresponds to the light emitting element 7002. In the case of a pixel shown in FIG. 25A, light which is emitted from the light emitting element 7002 is emitted to the anode 7005 side as indicated by an arrow.

Next, a light emitting element having a bottom emission structure is described with reference to FIG. 25B. FIG. 25B shows a cross-sectional view of a pixel in the case where the TFT 7011 is an n-type thin film transistor and light which is emitted from a light emitting element 7012 is emitted to a cathode 7013 side (passes through the cathode 7013). In FIG. 25B, the cathode 7013 of the light emitting element 7012 is formed over a light-transmitting conductive film 7017 which is electrically connected to the TFT 7011. A light emitting layer 7014 and an anode 7015 are stacked in this order over the cathode 7013. Note that, in the case where the anode 7015 has light-transmitting property, a blocking film 7016 for reflecting or shielding light may be formed so as to cover the anode. The cathode 7013 can be formed using any of a variety of conductive materials as long as it has a low work function similarly to FIG. 25A. Note that the thickness of the cathode 7013 is set so that light is transmitted therethrough (preferably about 5 nm to 30 nm). For example, an aluminum film whose thickness is 20 nm can be used as the cathode 7013. Then, the light emitting layer 7014 may be formed using either a single layer or a stacked layer of a plurality of layers similarly to FIG. 25A. Although the anode 7015 is not required to be transmit light, a light-transmitting conductive material can be used to form the anode 7015 similarly to FIG. 25A. The blocking film 7016 can be formed using, for example, a metal which reflects light, or the like; however, it is not limited to a metal film. For example, a resin or the like to which black pigments are added can be used.

A region where the cathode 7013 and the anode 7015 sandwich the light emitting layer 7014 corresponds to the light emitting element 7012. In the case of a pixel shown in FIG. 25B, light which is emitted from the light emitting element 7012 is emitted to the cathode 7013 side as indicated by an arrow.

Figure 25C:
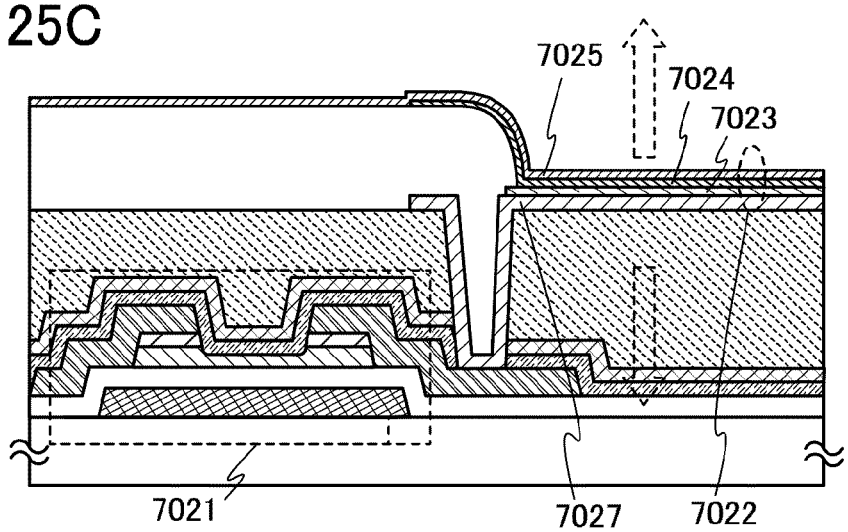

Description is made on a light emitting element having the dual emission structure with reference to FIG. 25C. In FIG. 25C, a cathode 7023 of a light emitting element 7022 is formed over a light-transmitting conductive film 7027 which is electrically connected to the TFT 7021. A light emitting layer 7024 and an anode 7025 are stacked in this order over the cathode 7023. The cathode 7023 can be formed using any of a variety of conductive materials as long as it has a low work function similarly to FIG. 25A. Note that the thickness is set so that light is transmitted therethrough. For example, an aluminum film having a thickness of 20 nm can be used as the cathode 7023. Then, the light emitting layer 7024 may be formed using either a single layer or a stacked layer of a plurality of layers similarly to FIG. 25A. A light-transmitting conductive material can be used to form the anode 7025 as in the case of FIG. 25A.

A portion where the cathode 7023, the light emitting layer 7024, and the anode 7025 are overlapped with each other corresponds to the light emitting element 7022. In the case of the pixel shown in FIG. 25C, light which is emitted from the light emitting element 7022 is emitted to both the anode 7025 side and the cathode 7023 side as indicated by arrows.

Note that although an organic EL element is described here as a light emitting element, an inorganic EL element can also be used as a light emitting element.

Figure 26A:
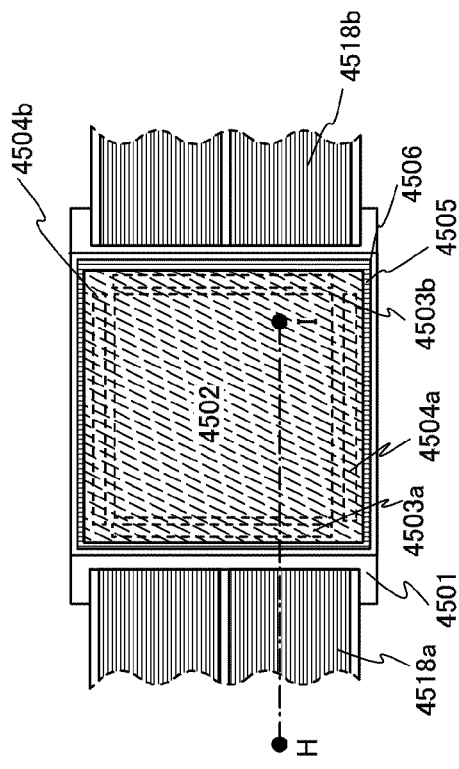
FIGS. 26A and 26B are diagrams describing Embodiment 4.
Figure 26B:
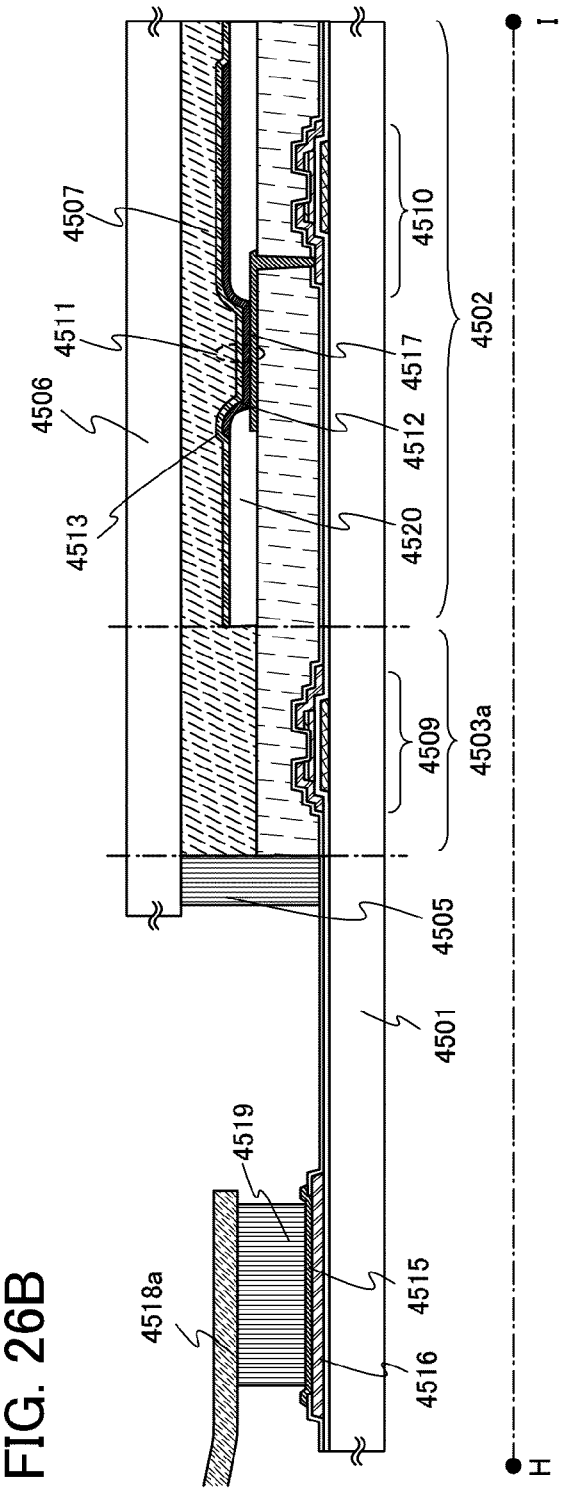

Next, description is made on the appearance and cross section of a light emitting display panel (also referred to as a light emitting panel) corresponding to one mode of a display device with reference to FIGS. 26A and 26B. FIG. 26A is a top view of a panel in which a TFT and a light emitting element formed over a first substrate are sealed between the first substrate and a second substrate with a sealing material. FIG. 26B corresponds to a cross-sectional view taken along a line H-I in FIG. 26A.

A sealing material 4505 is provided so as to surround a pixel portion 4502, a source line driver circuit 4503a, a source line driver circuit 4503b, a gate line driver circuit 4504a, and a gate line driver circuit 4504b which are provided over a first substrate 4501. In addition, a second substrate 4506 is provided over the pixel portion 4502, the source line driver circuit 4503a, the source line driver circuit 4503b, the gate line driver circuit 4504a, and the gate line driver circuit 4504b. Therefore, the pixel portion 4502, the source line driver circuit 4503a, the source line driver circuit 4503b, the gate line driver circuit 4504a, and the gate line driver circuit 4504b are sealed with a filler 4507, by the first substrate 4501, the sealing material 4505, and the second substrate 4506. In this manner, it is preferable that packaging (encapsulation) be performed using a protective film (a laminated film, an ultraviolet curable resin film, or the like) or a covering material, which has high airtightness and causes less degasification, in order to prevent exposure to external air.

Further, the pixel portion 4502, the source line driver circuit 4503a, the source line driver circuit 4503b, the gate line driver circuit 4504a, and the gate line driver circuit 4504b provided over the first substrate 4501 each have a plurality of TFTs. FIG. 26B shows a TFT 4510 included in the pixel portion 4502 and a TFT 4509 included in the source line driver circuit 4503a as examples.

The TFT described in the above embodiment, which includes an In—Ga—Zn—O-based non-single-crystal film as a semiconductor layer, can be applied to the TFT 4509 and the TFT 4510.

In addition, reference numeral 4511 corresponds to a light emitting element. A first electrode layer 4517 which is a pixel electrode included in the light emitting element 4511 is electrically connected to a source electrode layer or a drain electrode layer of the TFT 4510. Note that the structure of the light emitting element 4511 in this embodiment is a stacked-layer structure of the first electrode layer 4517, an electroluminescent layer 4512, and a second electrode layer 4513. However, the structure is not limited to the structure shown in this embodiment. The structure of the light emitting element 4511 can be changed as appropriate depending on a direction of light which is extracted from the light emitting element 4511, or the like.

A partition wall 4520 is formed using an organic resin film, an inorganic insulating film, or an organic polysiloxane. It is particularly preferable that the partition wall 4520 be formed using a photosensitive material to have an opening portion on the first electrode layer 4517 so that a sidewall of the opening portion is formed as a tilted surface with continuous curvature.

The electroluminescent layer 4512 may be formed using either a single layer or a plurality of stacked layers.

A protective film may be formed over the second electrode layer 4513 and the partition wall 4520 in order to prevent entry of oxygen, hydrogen, moisture, carbon dioxide, or the like into the light emitting element 4511. As the protective film, a silicon nitride film, a silicon nitride oxide film, a DLC (diamond like carbon) film, or the like can be formed.

In addition, various signals and potentials given to the source line driver circuit 4503a, the source line driver circuit 4503b, the gate line driver circuit 4504a, the gate line driver circuit 4504b, and the pixel portion 4502 are supplied from a FPC 4518a and a FPC 4518b.

In this embodiment, a connecting terminal electrode 4515 is formed of the same conductive film as the first electrode layer 4517 included in the light emitting element 4511. A terminal electrode 4516 is formed of the same conductive film as a source electrode layer and a drain electrode layer included in the TFT 4509 and the TFT 4510.

The connecting terminal electrode 4515 is electrically connected to a terminal included in the FPC 4518a with an anisotropic conductive film 4519 interposed therebetween.

As the second substrate 4506 which is located in the direction of light which is extracted from the light emitting element 4511 needs to have a light-transmitting property. In that case, a light-transmitting material such as a glass plate, a plastic plate, a polyester film, or an acrylic film is used.

Further, as the filler 4507, an inert gas such as nitrogen or argon can be used as well as an ultraviolet curable resin or a heat curable resin such as PVC (polyvinyl chloride), acrylic, polyimide, an epoxy resin, a silicone resin, PVB (polyvinyl butyral), or EVA (ethylene vinyl acetate). In this embodiment, nitrogen is used as a filler.

Furthermore, if needed, optical films, such as a polarizer, a circular polarizer (including an elliptical polarizer), a retarder plate (a quarter-wave plate, a half-wave plate), a color filter, and the like, may be provided on an emission surface of the light emitting element, as appropriate. Further, the polarizer or the circular polarizer may be provided with an anti-reflection film. For example, antiglare treatment can be performed by which reflected light is diffused on unevenness of a surface so as to reduce glare.

A driver circuit formed by using a single crystal semiconductor film or a polycrystalline semiconductor film over a substrate separately prepared may be mounted as the source line driver circuit 4503a, the source line driver circuit 4503b, the gate line driver circuit 4504a, or the gate line driver circuit 4504b. Alternatively, only a source line driver circuit, only a part of a source line driver circuit, only a gate line driver circuit, or only a part of a gate line driver circuit may be separately formed and mounted. This embodiment is not limited to the structure shown in FIGS. 26A and 26B.

According to the foregoing steps, a light emitting display device (display panel) can be manufactured. Note that, in an n-channel transistor forming a pixel of display device obtained in this embodiment, an In—Ga—Zn—O-based non-single-crystal film is used for a channel formation region and the n-channel transistor has excellent dynamic characteristics similar to a transistor in an inverter circuit forming a gate line driver circuit or a source line driver circuit. In addition, as described in the above embodiment, the silicon oxide film including the OH group and the silicon nitride film are formed sequentially on the oxide semiconductor film, so that termination of dangling bonds in the oxide semiconductor film by the OH group and prevention of decrease in resistance due to a vacancy of oxygen in the oxide semiconductor film can be achieved. As the result, it is possible to reduce a shift of the threshold voltage of a TFT and to maintain the effect of the reduction of off current which is lead by an enhancement transistor. Further, since a TFT in which an oxide semiconductor film is used for a channel formation region has better electrical characteristics, such as mobility, than a TFT in which amorphous silicon is used for a channel formation region, the area occupied by TFTs in the circuit can be reduced without performance is degraded.

Note that in this embodiment, the contents described in each drawing can be freely combined or replaced with the contents described in any of different embodiments as appropriate.

Embodiment 5

In this embodiment, an example of electronic paper is shown as a display device to which the structure of the above embodiment can be applied.

Figure 29:
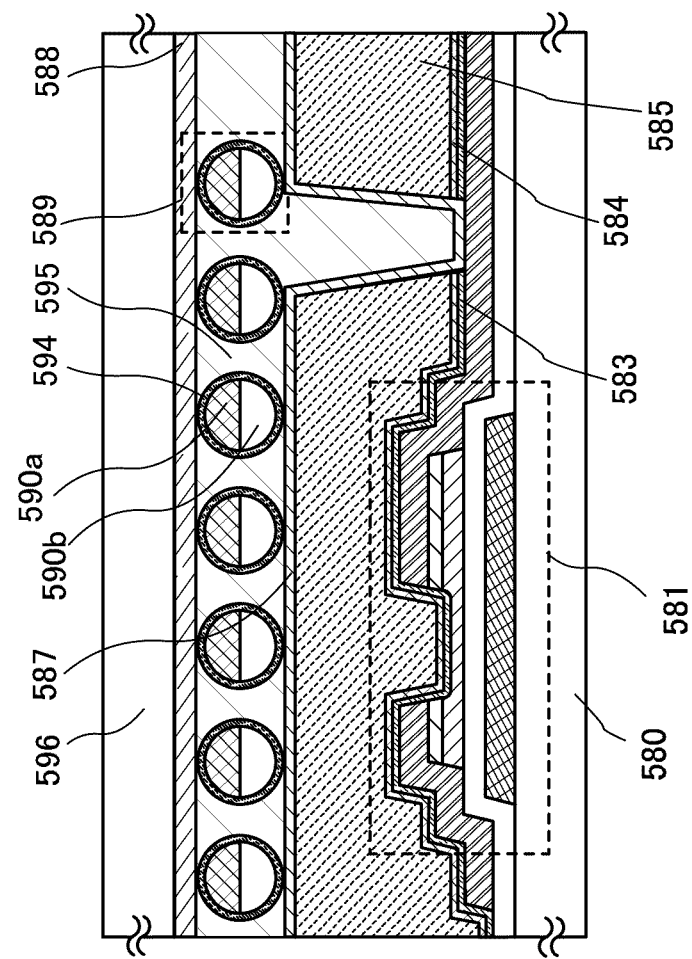
FIG. 29 is a diagram describing Embodiment 5.

FIG. 29 shows active matrix electronic paper as an example of a display device. A TFT 581 is a highly reliable TFT which includes an In—Ga—Zn—O-based non-single-crystal film as a semiconductor layer and can be manufactured in a similar manner to the TFT shown in Embodiment 4. In addition, a silicon oxide film 583 including the OH group and a silicon nitride film 584 are formed sequentially on an oxide semiconductor film in a TFT which forms a driver circuit, so that termination of dangling bonds in the oxide semiconductor film by the OH group and prevention of decrease in resistance due to a vacancy of oxygen in the oxide semiconductor film can be achieved.

The electronic paper in FIG. 29 is an example of a display device using a twisting ball display system. The twisting ball display system refers to a method in which spherical particles each colored in black and white are arranged between a first electrode layer and a second electrode layer which are electrode layers used for a display element, and a potential difference is generated between the first electrode layer and the second electrode layer to control orientation of the spherical particles, so that display is performed.

The TFT 581 is a TFT with a bottom-gate structure, and a source electrode layer or a drain electrode layer thereof is in contact with a first electrode layer 587 at an opening formed in an insulating layer 585, whereby the TFT 581 is electrically connected to the first electrode layer 587. Between the first electrode layer 587 and a second electrode layer 588, spherical particles 589 each having a black region 590a, a white region 590b, and a cavity 594 around the black region 590a and the white region 590b which is filled with liquid are provided. A space around the spherical particles 589 is filled with a filler 595 such as a resin (see FIG. 29). In this embodiment, the first electrode layer 587 is corresponding to the pixel electrode, and the second electrode layer 588 is corresponding to the common electrode. The second electrode layer 588 is electrically connected to a common potential line formed over the same substrate 580 as the TFT. Further, a substrate 596 is provided over the second electrode layer 588.

Further, instead of the twisting ball, an electrophoretic element can also be used. A microcapsule having a diameter of about 10 μm to 200 μam in which transparent liquid, positively charged white microparticles, and negatively charged black microparticles are encapsulated, is used. In the microcapsule which is provided between the first electrode layer and the second electrode layer, when an electric field is applied by the first electrode layer and the second electrode layer, the white microparticles and the black microparticles move to opposite sides, so that white or black can be displayed. A display element using this principle is an electrophoretic display element and is called electronic paper in general. The electrophoretic display element has higher reflectance than a liquid crystal display element, and thus, an auxiliary light is unnecessary, power consumption is low, and a display portion can be recognized in a dim place. In addition, even when power is not supplied to the display portion, an image which has been displayed once can be maintained. Accordingly, a displayed image can be stored even if a semiconductor device having a display function (which may be referred to simply as a display device or a semiconductor device provided with a display device) is distanced from an electric wave source.

Through this process, highly reliable electronic paper can be manufactured.

Note that in this embodiment, the contents described in each drawing can be freely combined or replaced with the contents described in any of different embodiments as appropriate.

Embodiment 6

In this embodiment, an example of electronic devices including a display device described in the above embodiment is shown.

Figure 27A:
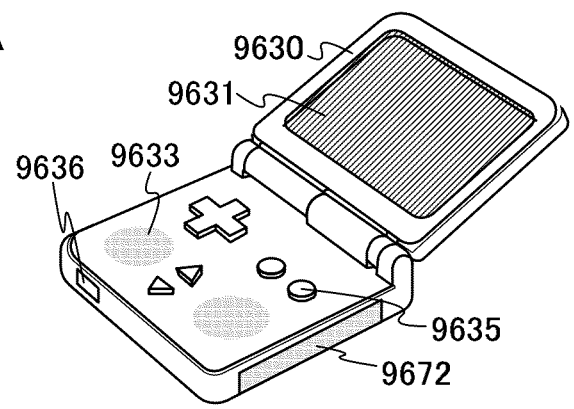
FIGS. 27A to 27C are diagrams each describing Embodiment 6.

FIG. 27A shows a portable game machine which can include a housing 9630, a display portion 9631, speakers 9633, operation keys 9635, a connection terminal 9636, a recording medium reading portion 9672, and the like. The portable game machine shown in FIG. 27A can have a function of reading a program or data stored in a recording medium to display it on the display portion, a function of sharing information with another portable game machine by wireless communication, and the like. Note that the portable game machine shown in FIG. 27A is not limited to having these functions, and can have various functions.

Figure 27B:
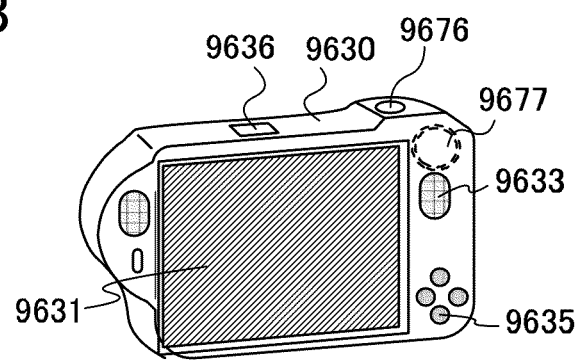

FIG. 27B shows a digital camera which can include the housing 9630, the display portion 9631, the speakers 9633, the operation keys 9635, the connection terminal 9636, a shutter button 9676, an image receiving portion 9677, and the like. The digital camera having the television reception function shown in FIG. 27B can have functions such as a function of photographing a still image and a moving image; a function of automatically or manually adjusting the photographed image; a function of obtaining various kinds of information from an antenna; a function of storing the photographed image or the information obtained from the antenna; and a function of displaying the photographed image or the information obtained from the antenna on the display portion. Note that the digital camera having the television reception function shown in FIG. 27B is not limited to having these functions, and can have various functions.

Figure 27C:
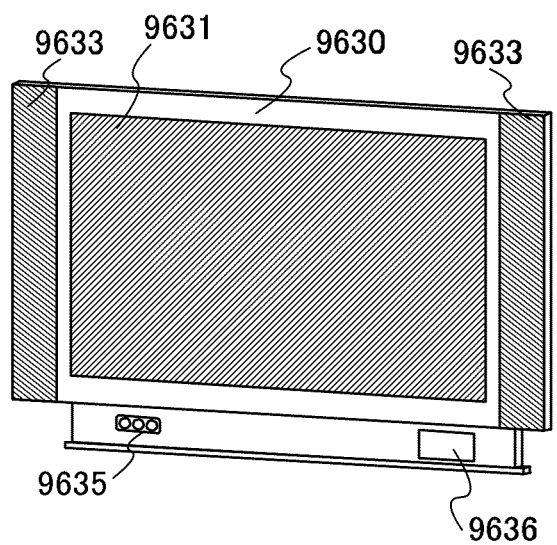

FIG. 27C shows a television receiver which can include the housing 9630, the display portion 9631, the speakers 9633, the operation keys 9635, the connection terminal 9636, and the like. The television receiver shown in FIG. 27C can have functions such as a function of processing to convert radio wave for television into an image signal; a function of processing to convert an image signal into a signal which is suitable for display; and a function of converting frame frequency of an image signal. Note that the television receiver shown in FIG. 27C is not limited to having these functions, and can have various functions.

Figure 28A:
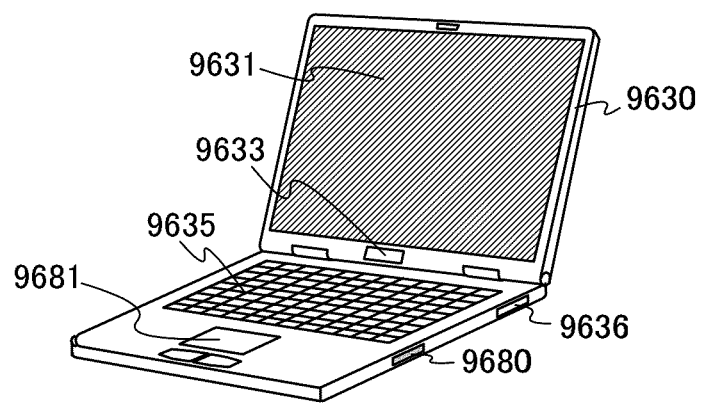
FIGS. 28A and 28B are diagrams each describing Embodiment 6.

FIG. 28A shows a computer which can include the housing 9630, the display portion 9631, the speaker 9633, the operation keys 9635, the connection terminal 9636, a pointing device 9681, an external connection port 9680, and the like. The computer shown in FIG. 28A can have functions such as a function of displaying various kinds of information (e.g., a still image, a moving image, and a text image) on the display portion; a function of controlling processing by various kinds of software (programs); a communication function such as wireless communication or wire communication; a function of connecting with various computer networks by using the communication function; and a function of transmitting or receiving various kinds of data by using the communication function. Note that the computer shown in FIG. 28A is not limited to having these functions, and can have various functions.

Figure 28B:
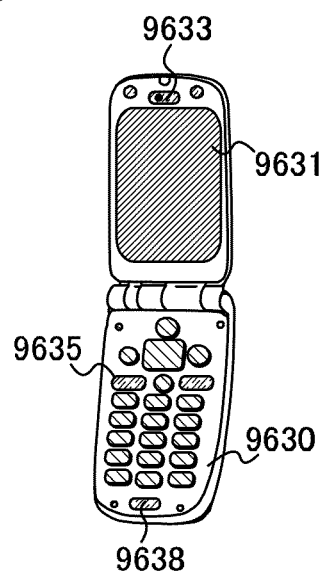

Next, FIG. 28B shows a mobile phone, which can include the housing 9630, the display portion 9631, the speaker 9633, the operation keys 9635, a microphone 9638, and the like. The mobile phone shown in FIG. 28B can have a function of displaying a variety of information (e.g., a still image, a moving image, and a text image) on the display portion; a function of displaying a calendar, a date, the time, and the like on the display portion; a function of operating or editing the information displaying on the display portion; a function of controlling processing by various kinds of software (programs); and the like. Note that the mobile phone shown in FIG. 28B is not limited to having these functions, and can have various functions.

The electronic devices described in this embodiment each include the display device described in the above embodiment in a display portion for displaying information. That is, as a transistor in an inverter circuit forming a gate line driver circuit or a source line driver circuit, an In—Ga—Zn—O-based non-single-crystal film is used for a channel formation region and the transistor has excellent dynamic characteristics. In addition, as described in the above embodiment, the silicon oxide film including the OH group and the silicon nitride film are formed sequentially on the oxide semiconductor film, so that termination of dangling bonds in the oxide semiconductor film by the OH group and prevention of decrease in resistance due to a vacancy of oxygen in the oxide semiconductor film can be achieved. As the result, it is possible to reduce a shift of the threshold voltage of a TFT and to maintain the effect of the reduction of off current which is lead by an enhancement transistor. Further, since a TFT in which an oxide semiconductor film is used for a channel formation region has better electrical characteristics, such as mobility, than a TFT in which amorphous silicon is used for a channel formation region, the area occupied by TFTs in the circuit can be reduced without degradation of performance.

Note that in this embodiment, the contents described in each drawing can be freely combined or replaced with the contents described in any of different embodiments as appropriate.

This application is based on Japanese Patent Application serial no. 2008-281449 filed with Japan Patent Office on Oct. 31, 2008, the entire contents of which are hereby incorporated by reference.

REFERENCE NUMERALS

100: substrate, 101: source line driver circuit, 102: gate line driver circuit, 103 pixel portion, 104: flexible printed circuit, 105: circuit, 110: dotted frame, 170: TFT, 201: clock signal level shifter, 202: start pulse signal level shifter, 203: pulse output circuit, 204: NAND circuit, 205: buffer, 206: sampling switch, 251: shift register, 300: pulse output circuit, 301: switch, 302: inverter circuit, 303: inverter circuit, 304: switch, 305: inverter circuit, 331: pulse output circuit, 332: pulse output circuit, 350: dotted line, 351: TFT, 352: TFT, 353: TFT, 354: TFT, 355: TFT, 356: TFT, 357: TFT, 358: TFT, 359: wiring, 360: wiring, 580: substrate, 581: TFT, 583: silicon oxide film, 594: silicon nitride film, 585: insulating layer, 587: electrode layer, 588: electrode layer, 589: spherical particle, 590*a*: black region, 590*b*: white region, 594: cavity, 595: filler, 596: substrate, 601: TFT, 602: TFT, 603: TFT, 604: TFT, 605: capacitor, 606: TFT, 607: TFT, 608: TFT, 609: TFT, 610: capacitor, 611: TFT, 612: TFT, 613: TFT, 614: TFT, 615: capacitor, 616: TFT, 617: TFT, 618: TFT, 619: TFT, 620: capacitor, 621: TFT, 622: TFT, 623: TFT, 624: TFT, 625: capacitor, 626: TFT, 627: TFT, 628: TFT, 629: TFT, 630: capacitor, 631: TFT, 632: TFT, 633: TFT, 634: TFT, 635: capacitor, 636: TFT, 637: TFT, 638: TFT, 639: TFT, 640: capacitor, 641: TFT, 642: TFT, 643: TFT, 644: TFT, 655: capacitor, 701: TFT, 702: TFT, 703: TFT, 704: TFT, 705: TFT, 706: TFT, 707: capacitor, 711: TFT, 712: TFT, 713: TFT, 714: TFT, 715: capacitor, 716: TFT, 717: TFT, 718: TFT, 719: TFT, 720: capacitor, 721: TFT, 722: TFT, 723: TFT, 724: TFT, 725: capacitor, 726: TFT, 727: TFT, 728: TFT, 729, TFT, 730: capacitor, 731: TFT, 751: clock signal level shifter, 752: start pulse level shifter, 753: pulse output circuit, 754: NAND circuit, 755: buffer, 781: shift register, 801: power supply line, 802: power supply line, 803: control signal line, 804: control signal line, 805: control signal line, 806: oxide semiconductor film, 807: wiring layer, 808: wiring layer, 809: contact hole, 900: substrate, 901: gate electrode, 902: gate electrode, 903: gate insulating layer, 904: contact hole, 905: oxide semiconductor film, 906: n$^+$ layer, 906*a*: n$^+$ layer, 906*b*: n$^+$ layer, 907: oxide semiconductor film, 908: n$^+$ layer, 908*a*: n$^+$ layer, 908*b*: n$^+$ layer, 909: wiring, 910: wiring, 911: wiring, 912: silicon oxide film, 913: silicon nitride film, 1001: channel-protective layer, 1002: channel-protective layer, 1003: silicon nitride film, 1101: silicon oxide film, 1102: silicon nitride film, 1400: pulse output circuit, 1401: inverter circuit, 1402: switch, 1403: capacitor, 1411: TFT, 1412: TFT, 1413: TFT, 1414: capacitor, 1415: wiring, 1416: wiring, 1500: pulse output circuit, 1501: TFT, 1502: TFT, 1503: TFT, 1504: capacitor, 1505: wiring, 1506: wiring, 1600: substrate, 1601: gate electrode layer, 1602: gate insulating layer, 1603: semiconductor layer, 1604*a*: n$^+$ layer, 1604*b*: n$^+$ layer, 1605*a*: source or drain electrode layer, 1605*b*: source or drain electrode layer, 1607*a*: silicon oxide film, 1607*b*: silicon nitride film, 1608: capacitor wiring, 1609: oxide semiconductor film, 1610: pixel electrode layer, 1611: oxide semiconductor film, 1620: connection electrode, 1621: terminal, 1622: terminal, 1625: contact hole, 1626: contact hole, 1627: contact hole, 1628: transparent conductive film, 1629: transparent conductive film, 1631: resist mask, 1632: conductive film, 1650: terminal, 1651: terminal, 1652: gate insulating layer, 1653: connection electrode, 1654: protective insulating film, 1655: transparent conductive film, 1656: electrode, 1670: TFT, 4501: substrate, 4502: pixel portion, 4503*a*: source line driver circuit, 4503*b*: source line driver circuit, 4504*a*: gate line driver circuit, 4504*b*: gate line driver circuit, 4505: seal material, 4506: substrate, 4507: filler, 4509: TFT, 4510: TFT, 4511: light emitting element, 4512: electroluminescent layer, 4513: electrode layer, 4515: connecting terminal electrode, 4516: terminal electrode, 4517: electrode layer, 4518*a*: FPC, 4518*b*: FPC, 4519: anisotropic conductive film, 4520: partition, 6400: pixel, 6401: TFT, 6402: TFT, 6403: light emitting element, 6405: source line, 6406: gate line, 6407: power supply line, 6408: common electrode, 7001: TFT, 7002: light emitting element, 7003: cathode, 7004: light emitting layer, 7005: anode, 7011: TFT, 7012: light emitting element, 7013: cathode, 7014: light emitting layer, 7015: anode, 7016: blocking film, 7017: conductive film, 7021: TFT, 7022: light emitting element, 7023: cathode, 7024: light emitting layer, 7025: anode, 7027: conductive film, 9630: housing, 9631: display portion, 9633: speaker, 9635: operation keys, 9636: connection terminal, 9638: microphone, 9672: recording medium reading portion, 9676: shutter button, 9677: image receiving portion, 9680: external connection port, 9681: pointing device.

The invention claimed is:

1. A driver circuit comprising:
an inverter circuit including a first enhancement transistor and a second enhancement transistor;
a silicon oxide film including an OH group over and in contact with a first oxide semiconductor film of the first enhancement transistor and a second oxide semiconductor film of the second enhancement transistor; and
a silicon nitride film over and in contact with the silicon oxide film,
wherein each of the first enhancement transistor and the second enhancement transistor is a bottom-gate transistor,
wherein the first oxide semiconductor film includes a channel formation region of the first enhancement transistor, and
wherein the second oxide semiconductor film includes a second channel formation region of the second enhancement transistor.

2. The driver circuit according to claim 1,
wherein the first enhancement transistor comprises a gate terminal and a first terminal, which are electrically connected to a wiring for supplying high power supply potential, and
wherein the second enhancement transistor comprises a gate terminal supplied with an input signal, a first terminal electrically connected to a second terminal of the first enhancement transistor, and a second terminal electrically connected to a wiring for supplying low power supply potential.

3. The driver circuit according to claim 1,
wherein a third oxide semiconductor film is provided between the wiring for supplying high power supply potential and the first oxide semiconductor film, and
wherein a fourth oxide semiconductor film is provided between the wiring for supplying low power supply potential and the second oxide semiconductor film.

4. The driver circuit according to claim 1,
wherein each of the first oxide semiconductor film and the second oxide semiconductor film comprises at least one of indium, gallium, and zinc.

5. A driver circuit comprising:
an inverter circuit including a first enhancement transistor and a second enhancement transistor;
a switch including a third enhancement transistor, the switch being electrically connected with the inverter circuit;
a silicon oxide film including an OH group over and in contact with a first oxide semiconductor film of the first enhancement transistor and a second oxide semiconductor film of the second enhancement transistor; and
a silicon nitride film over and in contact with the silicon oxide film,
wherein each of the first enhancement transistor and the second enhancement transistor is a bottom-gate transistor,
wherein the first oxide semiconductor film includes a channel formation region of the first enhancement transistor, and
wherein the second oxide semiconductor film includes a second channel formation region of the second enhancement transistor.

6. The driver circuit according to claim 5,
wherein the first enhancement transistor comprises a gate terminal and a first terminal, which are electrically connected to a wiring for supplying high power supply potential, and
wherein the second enhancement transistor comprises a gate terminal supplied with an input signal, a first terminal electrically connected to a second terminal of the first enhancement transistor, and a second terminal electrically connected to a wiring for supplying low power supply potential.

7. The driver circuit according to claim 5,
wherein on/off of the switch is controlled by a clock signal or an inverted clock signal.

8. The driver circuit according to claim 5,
wherein each of the first oxide semiconductor film and the second oxide semiconductor film comprises at least one of indium, gallium, and zinc.

9. A driver circuit comprising:
an inverter circuit including a first enhancement transistor and a second enhancement transistor;
a switch including a third enhancement transistor, the switch being electrically connected with the inverter circuit;
a first silicon oxide film including an OH group over and in contact with a first oxide semiconductor film of the first enhancement transistor and a second oxide semiconductor film of the second enhancement transistor;
a first silicon nitride film over and in contact with the first silicon oxide film;
a second silicon oxide film including an OH group over and in contact with a third oxide semiconductor film of the third enhancement transistor; and
a second silicon nitride film over and in contact with the second silicon oxide film,
wherein each of the first enhancement transistor and the second enhancement transistor is a bottom-gate transistor,
wherein the first oxide semiconductor film includes a channel formation region of the first enhancement transistor, and
wherein the second oxide semiconductor film includes a second channel formation region of the second enhancement transistor.

10. The driver circuit according to claim 9,
wherein the first enhancement transistor comprises a gate terminal and a first terminal, which are electrically connected to a wiring for supplying high power supply potential, and
wherein the second enhancement transistor comprises a gate terminal supplied with an input signal, a first terminal electrically connected to a second terminal of the first enhancement transistor, and a second terminal electrically connected to a wiring for supplying low power supply potential.

11. The driver circuit according to claim 9,
wherein on/off of the switch is controlled by a clock signal or an inverted clock signal.

12. The driver circuit according to claim 9,
wherein each of the first oxide semiconductor film and the second oxide semiconductor film comprises at least one of indium, gallium, and zinc.

13. A display device comprising:
a driver circuit over a substrate, the driver circuit comprising:
  an inverter circuit including a first enhancement transistor and a second enhancement transistor;
  a silicon oxide film including an OH group over and in contact with a first oxide semiconductor film of the first enhancement transistor and a second oxide semiconductor film of the second enhancement transistor;
  a silicon nitride film over and in contact with the silicon oxide film; and
a pixel portion including a third enhancement transistor over the substrate,
wherein each of the first enhancement transistor and the second enhancement transistor is a bottom-gate transistor,
wherein the first oxide semiconductor film includes a channel formation region of the first enhancement transistor, and
wherein the second oxide semiconductor film includes a second channel formation region of the second enhancement transistor.

14. The display device according to claim 13,
wherein the first enhancement transistor comprises a gate terminal and a first terminal, which are electrically connected to a wiring for supplying high power supply potential, and
wherein the second enhancement transistor comprises a gate terminal supplied with an input signal, a first terminal electrically connected to a second terminal of the first enhancement transistor, and a second terminal electrically connected to a wiring for supplying low power supply potential.

15. The display device according to claim 13,
wherein each of the first oxide semiconductor film and the second oxide semiconductor film comprises at least one of indium, gallium, and zinc.

16. The display device according to claim 13,
wherein the substrate is a glass substrate.

17. An electronic device provided with the display device according to claim 13.

* * * * *